(12) United States Patent
Park et al.

(10) Patent No.: US 12,444,697 B2
(45) Date of Patent: Oct. 14, 2025

(54) SEMICONDUCTOR DEVICE

(71) Applicant: Samsung Electronics Co., Ltd., Suwon-si (KR)

(72) Inventors: Noh Yeong Park, Suwon-si (KR); Beomjin Park, Hwaseong-si (KR); Dong Il Bae, Seongnam-si (KR); Sangwon Baek, Hwaseong-si (KR); Hyun-Seung Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/612,304

(22) Filed: Mar. 21, 2024

(65) Prior Publication Data

US 2024/0234343 A1    Jul. 11, 2024

Related U.S. Application Data

(63) Continuation of application No. 17/352,503, filed on Jun. 21, 2021, now Pat. No. 11,961,806.

(30) Foreign Application Priority Data

Dec. 1, 2020    (KR) .......................... 10-2020-0166044

(51) Int. Cl.
*H10D 30/01*    (2025.01)
*H01L 21/02*    (2006.01)
(Continued)

(52) U.S. Cl.
CPC ........ *H01L 23/562* (2013.01); *H01L 21/0259* (2013.01); *H10D 30/031* (2025.01);
(Continued)

(58) Field of Classification Search
CPC ............... H01L 23/562; H01L 21/0259; H01L 21/823807; H01L 21/823814;
(Continued)

(56) References Cited

U.S. PATENT DOCUMENTS 9,202,894 B1    12/2015    Zang
9,627,330 B2    4/2017    Balakrishnan et al.
(Continued)

FOREIGN PATENT DOCUMENTS

KR        100555567 B1    3/2006
KR        1020170082302 A    7/2017
(Continued)

*Primary Examiner* — David Vu
(74) *Attorney, Agent, or Firm* — Muir Patent Law, PLLC

(57) ABSTRACT

A semiconductor device may include a substrate including a first region and a second region and a first active pattern on the first region. The first active pattern may include a pair of first source/drain patterns and a first channel pattern therebetween, and the first channel pattern may include a plurality of first semiconductor patterns stacked on the substrate. The semiconductor device may further include a first gate electrode, which is provided on the first channel patterns, and a supporting pattern, which is provided on side surfaces of the plurality of first semiconductor patterns to connect the side surfaces of the plurality of first semiconductor patterns to each other.

11 Claims, 50 Drawing Sheets

(51) Int. Cl.
  *H01L 23/00* (2006.01)
  *H10D 30/43* (2025.01)
  *H10D 30/67* (2025.01)
  *H10D 62/10* (2025.01)
  *H10D 64/01* (2025.01)
  *H10D 84/01* (2025.01)
  *H10D 84/03* (2025.01)
  *H10D 84/85* (2025.01)

(52) U.S. Cl.
  CPC ..... *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/038* (2025.01); *H10D 84/85* (2025.01)

(58) Field of Classification Search
  CPC ............... H01L 27/092; H01L 29/0665; H01L 29/42392; H01L 29/66545; H01L 29/66742; H01L 29/78618; H01L 29/78696; H01L 29/0847; H01L 29/1079; H01L 21/823456; H01L 21/823864; H01L 27/088; H01L 29/0673; H01L 29/66439; H01L 29/775; H01L 29/165; H01L 29/7848; H01L 21/823828; H01L 21/823857; B82Y 10/00
  See application file for complete search history.

(56) References Cited

U.S. PATENT DOCUMENTS

| | | | |
|---|---|---|---|
| 9,871,102 | B2 | 1/2018 | Chen et al. |
| 9,947,743 | B2 | 4/2018 | Doris et al. |
| 10,115,640 | B2 | 10/2018 | Hwang et al. |
| 10,170,584 | B2 | 1/2019 | Guillorn et al. |
| 10,680,107 | B2 | 6/2020 | Cheng |
| 11,393,924 | B2 * | 7/2022 | Liang ................ H01L 29/66545 |
| 2006/0024874 | A1 | 2/2006 | Yun et al. |
| 2017/0110554 | A1 | 4/2017 | Tak et al. |
| 2019/0288117 | A1 | 9/2019 | Xie et al. |
| 2020/0075875 | A1 | 3/2020 | Vasen et al. |

FOREIGN PATENT DOCUMENTS

| | | |
|---|---|---|
| KR | 1020190030270 A | 3/2019 |
| KR | 1020190069294 A | 6/2019 |
| KR | 1020200012519 A | 2/2020 |
| KR | 1020200020332 A | 2/2020 |
| KR | 1020200032940 A | 3/2020 |

\* cited by examiner

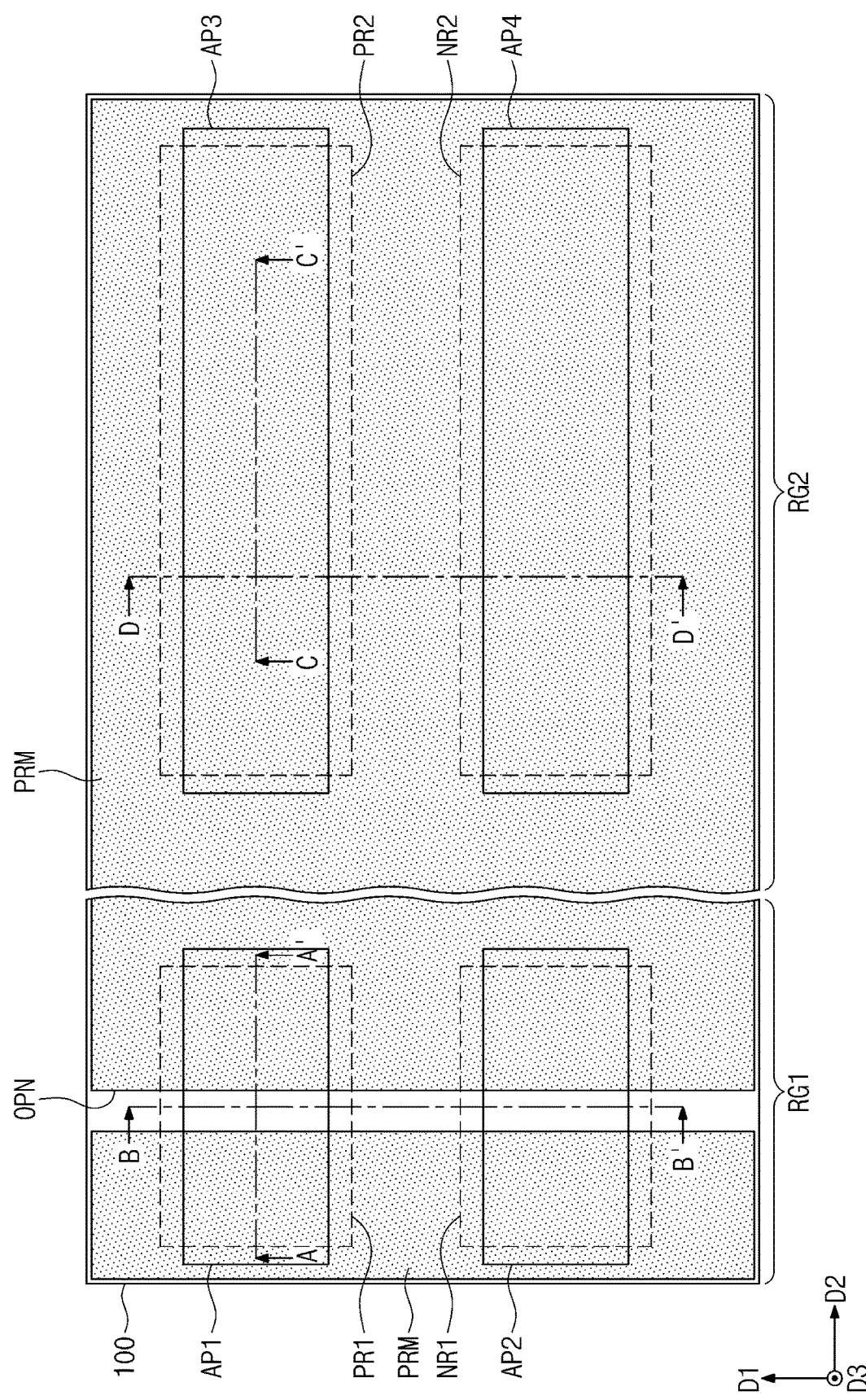

SEMICONDUCTOR DEVICE

CROSS-REFERENCE TO RELATED APPLICATIONS

This Application is a continuation of U.S. patent application Ser. No. 17/352,503 filed on Jun. 21, 2021 which claims priority under 35 U.S.C. § 119 to Korean Patent Application No. 10-2020-0166044, filed on Dec. 1, 2020, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

A semiconductor device includes an integrated circuit having metal-oxide-semiconductor field-effect transistors (MOS-FETs). To meet an increasing demand for a semiconductor device with a small pattern size and a reduced design rule, MOS-FETs are being aggressively scaled down. The reduction of the MOS-FETs in size may lead to deterioration in operational characteristics of the semiconductor device. A variety of studies are being conducted to overcome technical limitations associated with the scaled-down semiconductor device and to implement high performance semiconductor devices.

SUMMARY

An embodiment of the inventive concept provides a semiconductor device with improved electric characteristics.

According to an embodiment of the inventive concept, a semiconductor device may include a substrate including a first region and a second region, a first active pattern on the first region, the first active pattern including a pair of first source/drain patterns and a first channel pattern therebetween, the first channel pattern including a plurality of first semiconductor patterns stacked on the substrate, a first gate electrode provided on the first channel pattern, and a supporting pattern provided on side surfaces of the plurality of first semiconductor patterns to connect the side surfaces of the plurality of first semiconductor patterns to each other.

According to an embodiment of the inventive concept, a semiconductor device may include a substrate including a first region and a second region, a first active pattern on the first region, the first active pattern including a pair of first source/drain patterns and a first channel pattern therebetween, the first channel pattern including a plurality of first semiconductor patterns stacked on the substrate, a second active pattern on the second region, the second active pattern including a pair of second source/drain patterns and a second channel pattern therebetween, the second channel pattern including a plurality of second semiconductor patterns stacked on the substrate, a supporting pattern fastening the plurality of first semiconductor patterns and having an arch-shaped section, and a first gate electrode and a second gate electrode provided on the first and second channel patterns, respectively. A length of the first channel pattern may be larger than a length of the second channel pattern. The plurality of first semiconductor patterns may include a first material and the supporting pattern may include the first material.

According to an embodiment of the inventive concept, a semiconductor device may include a substrate including a first region and a second region, a device isolation layer defining a first active region on the first region and a second active region on the second region, a pair of first source/drain patterns and a pair of second source/drain patterns on the first active region and the second active region, respectively, a first channel pattern between the pair of first source/drain patterns, a second channel pattern between the pair of second source/drain patterns, each of the first and second channel patterns including first to third semiconductor patterns sequentially stacked on the substrate, a first gate electrode and a second gate electrode on the first channel pattern and the second channel pattern, respectively, a first gate insulating layer between the first channel pattern and the first gate electrode, a second gate insulating layer between the second channel pattern and the second gate electrode, a pair of gate spacers provided at opposite sides of each of the first and second gate electrodes, a gate capping pattern on a top surface of each of the first and second gate electrodes, a pair of active contacts electrically connected to the pair of first source/drain patterns, a pair of second active contacts electrically connected to the pair of second source/drain patterns, first and second gate contacts electrically connected to the first and second gate electrodes, a first metal layer on the pair of first active contacts, the pair of second active contacts, and the first and second gate contacts, the first metal layer including first interconnection lines electrically connected to the pair of first active contacts, the pair of second active contacts, and the first and second gate contacts, a second metal layer on the first metal layer, and a first supporting pattern, which is provided on side surfaces of the first to third semiconductor patterns of the first channel pattern and is in contact with the first to third semiconductor patterns thereof. The first supporting pattern may include a first vertical portion and a second vertical portion, which are provided on the first active region and are extended from a top surface of the device isolation layer to a top surface of the third semiconductor pattern, and a connecting portion, which is in contact with the top surface of the third semiconductor pattern and connects the first vertical portion to the second vertical portion. The first vertical portion and the second vertical portion may be spaced apart from each other with the first to third semiconductor pattern of the first channel pattern interposed therebetween.

BRIEF DESCRIPTION OF THE DRAWINGS

FIGS. 5, 7, 9, 11, 13, 15, and 17 are plan views illustrating a method of fabricating a semiconductor device according to an embodiment of the inventive concept.

DETAILED DESCRIPTION

Figure 1:
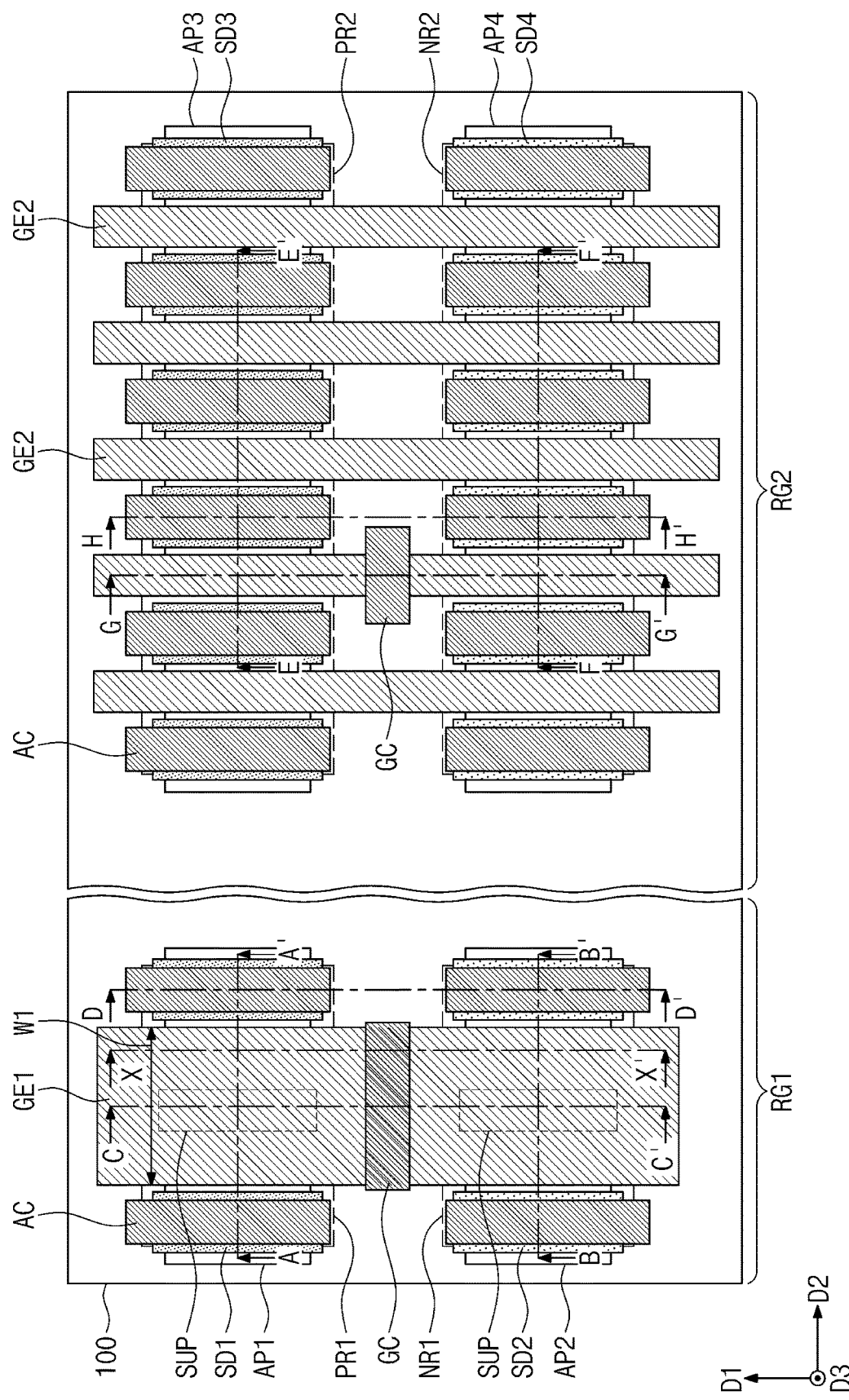
FIG. 1 is a plan view illustrating a semiconductor device according to an embodiment of the inventive concept.

FIG. 1 is a plan view illustrating a semiconductor device according to an embodiment of the inventive concept. FIGS. 2A to 2H are sectional views taken along lines A-A', B-B', C-C', D-D', E-E', F-F', G-G', and H-H' of FIG. 1, respectively. A section taken along a line X-X' of FIG. 1 may have the same or similar shape as the section taken along the line G-G' of FIG. 1 (e.g., that in FIG. 2G).

Referring first to FIG. 1, a substrate 100 including a first region RG1 and a second region RG2 may be provided. The substrate 100 may be a semiconductor substrate that is formed of or includes silicon, germanium, silicon-germanium, a compound semiconductor material, or the like. As an example, the substrate 100 may be a silicon wafer. Each of the first and second regions RG1 and RG2 may be a cell region, in which a standard cell constituting a logic circuit is disposed. As another example, the first region RG1 may be a peripheral region, in which transistors constituting a processor core or I/O terminals are disposed. A long gate transistor or a long channel transistor having a relatively long gate length or a relatively long channel length may be provided in the first region RG1. The transistor in the first region RG1 may be operated under high power condition, compared with the transistor in the second region RG2. Hereinafter, the transistor in the first region RG1 will be described in more detail with reference to FIGS. 1 and 2A to 2D.

The first region RG1 may include a first PMOSFET region PR1 and a first NMOSFET region NR1. The first PMOSFET region PR1 and the first NMOSFET region NR1 may be defined by a second trench TR2, which is formed in an upper portion of the substrate 100. For example, the second trench TR2 may be located between the first PMOSFET region PR1 and the first NMOSFET region NR1. The first PMOSFET region PR1 and the first NMOSFET region NR1 may be spaced apart from each other in a first direction D1 with the second trench TR2 interposed therebetween.

A first active pattern AP1 and a second active pattern AP2 may be defined by a first trench TR1, which is formed in an upper portion of the substrate 100. The first active pattern AP1 and the second active pattern AP2 may be provided on the first PMOSFET region PR1 and the first NMOSFET region NR1, respectively. The first trench TR1 may be shallower than the second trench TR2. The first trench TR1 may be connected to the second trench TR2. A width, in the first direction D1, of the first trench TR1 may be greater than a width, in the first direction D1, of the second trench TR2. The first and second active patterns AP1 and AP2 may be extended in a second direction D2. The first and second active patterns AP1 and AP2 may be vertically protruding portions of the substrate 100. For example, each of the first and second active patterns AP1 and AP2 may protrude from a top surface of the substrate 100. It should be noted that in some embodiments, the first and second active patterns AP1 and AP2 may be part of the substrate 100, and in this manner, protruding from the substrate refers to protruding past the top surface of the substrate 100 (e.g., wherein the substrate itself has protrusions that extend beyond a main surface thereof).

A device isolation layer ST may be provided to fill the first and second trenches TR1 and TR2. The device isolation layer ST may be formed of or may include silicon oxide. Upper portions of the first and second active patterns AP1 and AP2 may have a shape vertically protruding above the device isolation layer ST (e.g., see FIG. 2C). The device isolation layer ST does not cover the upper portions of the first and second active patterns AP1 and AP2. The device isolation layer ST does not cover lower side surfaces of the first and second active patterns AP1 and AP2.

The first active pattern AP1 may include a first channel pattern CH1 provided at an upper portion thereof. The second active pattern AP2 may include a second channel pattern CH2 provided at an upper portion thereof. Each of the first and second channel patterns CH1 and CH2 may include a first semiconductor pattern SP1, a second semiconductor pattern SP2, and a third semiconductor pattern SP3, which are sequentially stacked on each other. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include at least one of silicon (Si), germanium (Ge), or silicon-germanium (SiGe). In an embodiment, each of the first to third semiconductor patterns SP1, SP2, and SP3 may be formed of or may include crystalline silicon.

A pair of first source/drain patterns SD1 may be provided in the upper portion of the first active pattern AP1. The first source/drain patterns SD1 may be impurity regions of a first conductivity type (e.g., p-type). The first to third semiconductor patterns SP1, SP2, and SP3 of the first channel pattern CH1 may be interposed between the pair of first source/drain patterns SD1. In other words, the first to third semiconductor patterns SP1, SP2, and SP3 of the first channel pattern CH1 may connect the pair of first source/drain patterns SD1 to each other.

A pair of second source/drain patterns SD2 may be provided in the upper portion of the second active pattern AP2. The second source/drain patterns SD2 may be impurity regions of a second conductivity type (e.g., n-type). The first to third semiconductor patterns SP1, SP2, and SP3 of the second channel pattern CH2 may be interposed between the pair of second source/drain patterns SD2. For example, the first to third semiconductor patterns SP1, SP2, and SP3 of the second channel pattern CH2 may connect the pair of second source/drain patterns SD2 to each other.

The first and second source/drain patterns SD1 and SD2 may be epitaxial patterns, which are formed by a selective epitaxial growth process. As an example, each of the first and second source/drain patterns SD1 and SD2 may have a top surface that is located at substantially the same level as a top surface of the third semiconductor pattern SP3. As another example, a top surface of at least one of the first and second source/drain patterns SD1 and SD2 may be higher than a top surface of the third semiconductor pattern SP3 adjacent thereto. Terms such as "same," "equal," "planar,"

or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first source/drain patterns SD1 may include or may be formed of a semiconductor material (e.g., SiGe) having a lattice constant greater than that of the substrate 100. The first source/drain patterns SD1 may exert a compressive stress on the first channel pattern CH1.

In an embodiment, the second source/drain patterns SD2 may be formed of or may include the same semiconductor material (e.g., Si) as the substrate 100. Alternatively, the second source/drain patterns SD2 may be formed of or may include a material containing both of silicon (Si) and carbon (C). For example, the second source/drain patterns SD2 may be formed of or may include silicon carbide (SiC). In the case where the second source/drain pattern SD2 is formed of silicon carbide (SiC), a carbon content in the second source/drain pattern SD2 may range from 10 at % to 30 at %. The pair of second source/drain patterns SD2 containing the silicon carbide (SiC) may exert a tensile stress on the second channel pattern CH2 therebetween.

Figure 2A:
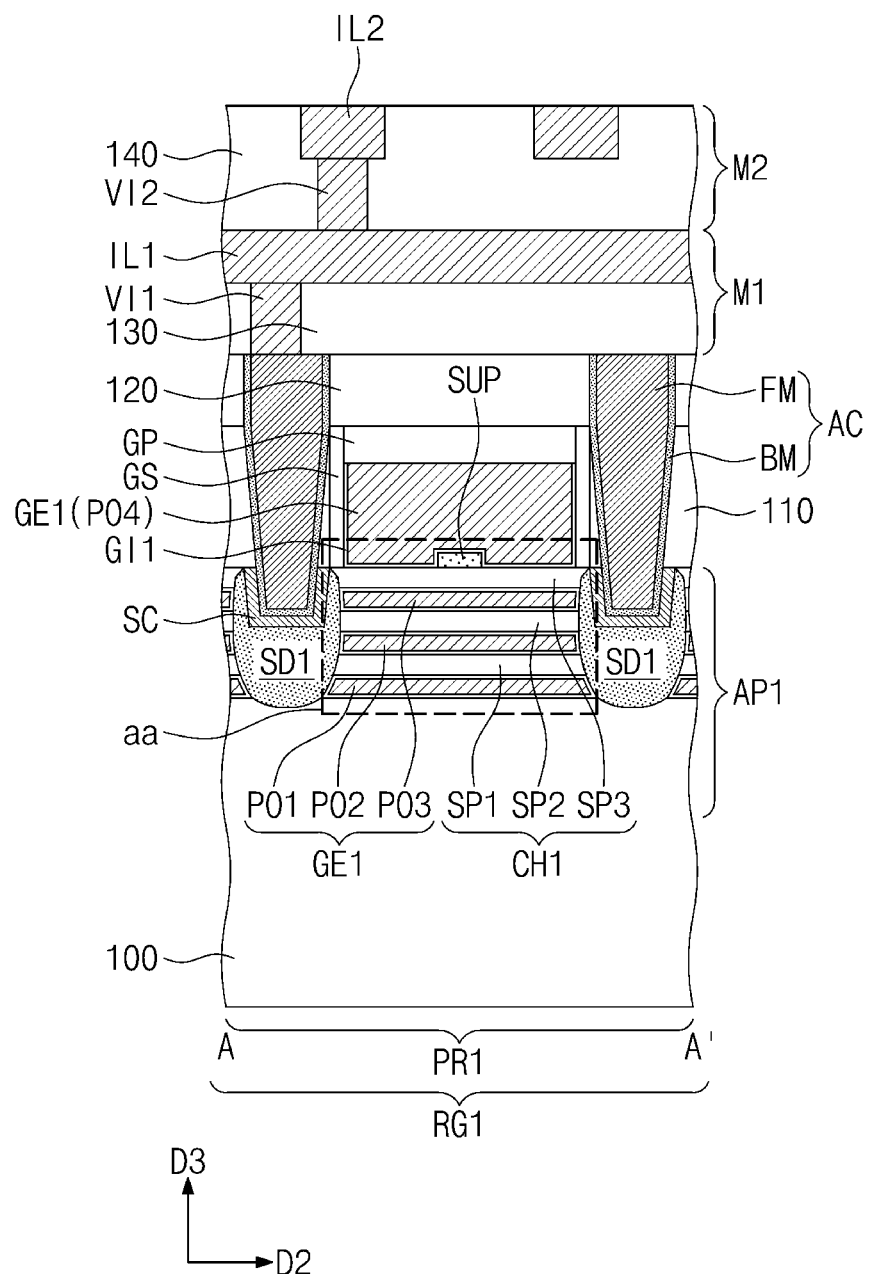
FIGS. 2A to 2H are sectional views taken along lines A-A', B-B', C-C', D-D', E-E', F-F', G-G', and H-H' of FIG. 1, respectively.
Figure 2B:
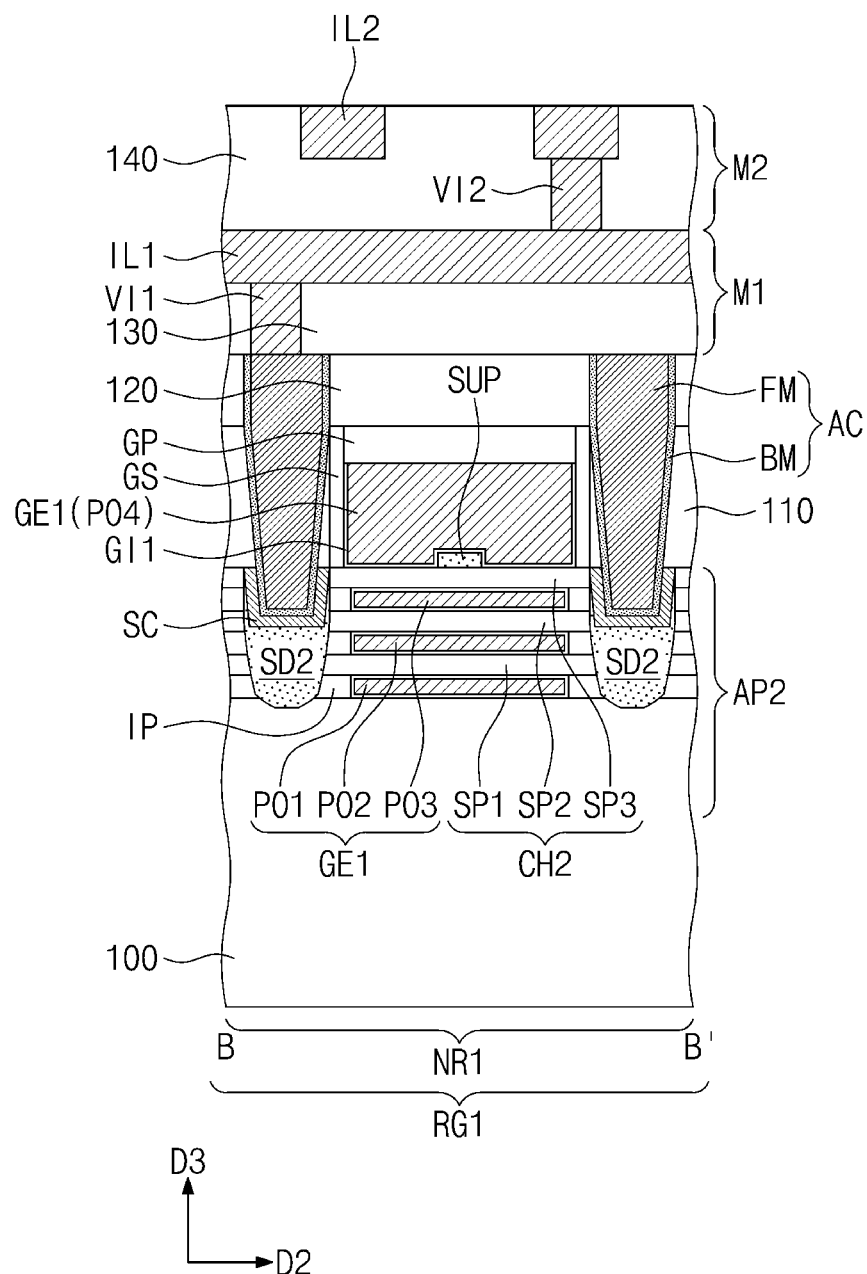
Figure 3A:
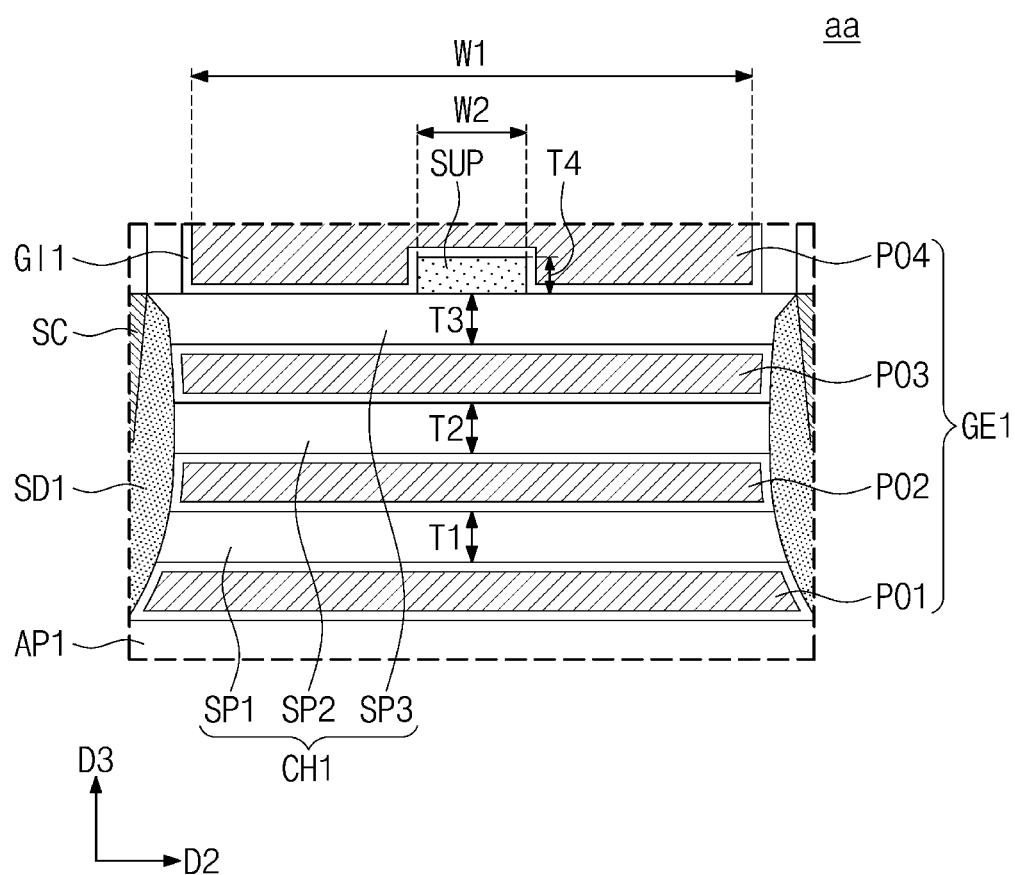
FIG. 3A is an enlarged sectional view of a portion aa of FIG. 2A.
Figure 3B:
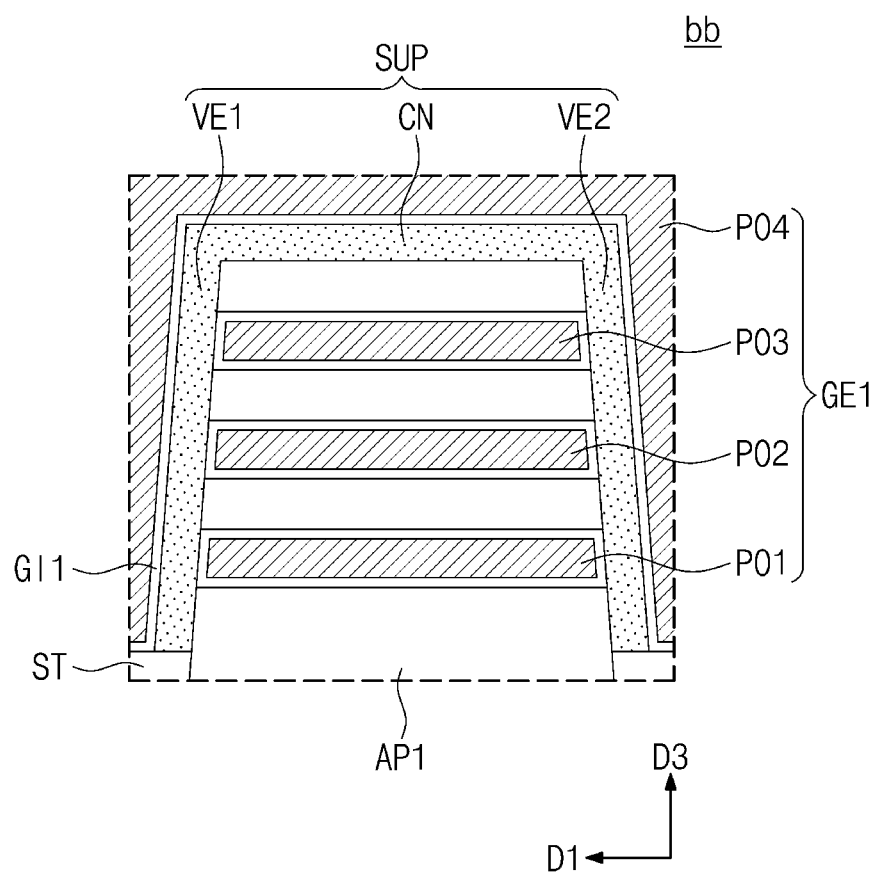
FIG. 3B is an enlarged sectional view of a portion bb of FIG. 2B.
Figure 3C:
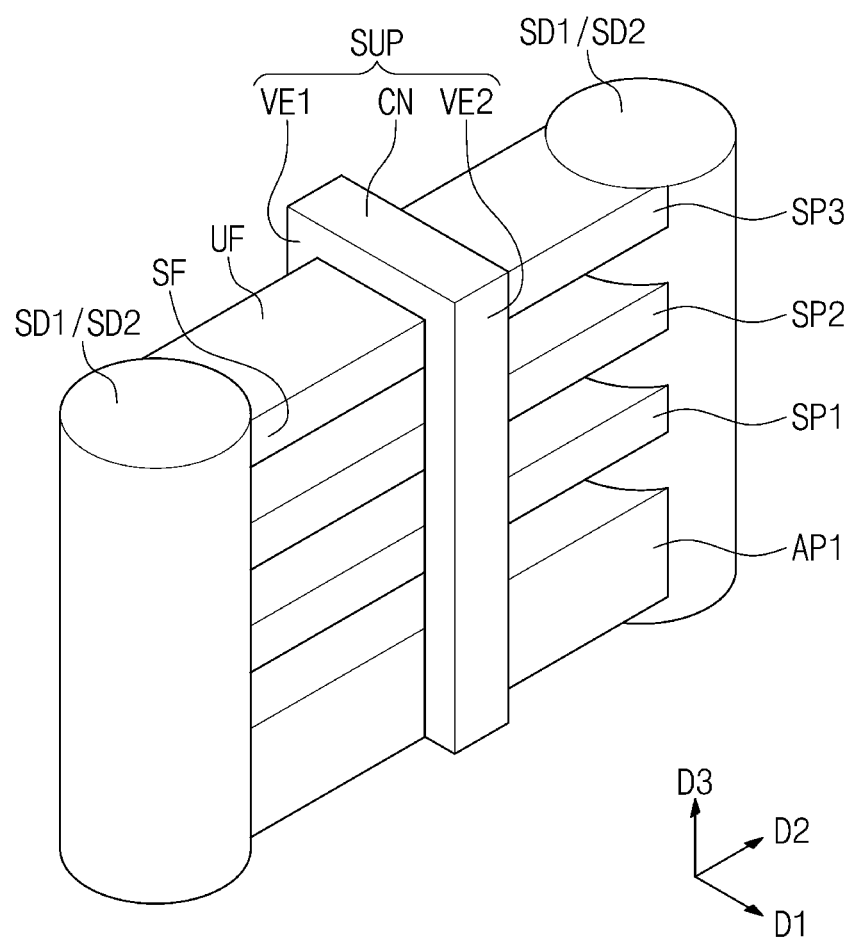
FIG. 3C is a perspective view illustrating a channel pattern and a supporting pattern of FIG. 2A.

FIG. 3A is an enlarged sectional view of a portion aa of FIG. 2A. FIG. 3B is an enlarged sectional view of a portion bb of FIG. 2B. FIG. 3C is a perspective view schematically illustrating the first to third semiconductor patterns and a supporting pattern.

Referring to FIGS. 2A, 2B, 2C, 3A, 3B, and 3C, supporting patterns SUP may be provided on the first PMOSFET region PR1 and the first NMOSFET region NR1. The supporting patterns SUP may be provided in spaces between adjacent ones of the first source/drain patterns SD1 and in spaces between adjacent ones of the second source/drain patterns SD2 (e.g., see FIGS. 2A and 2B).

As shown in FIGS. 3B and 3C, the supporting pattern SUP may be provided on opposite first side surfaces SF of the first to third semiconductor patterns SP1 to SP3 and may connect the side surfaces SF of the first to third semiconductor patterns SP1 to SP3 in each of the first and second channel patterns CH1 and CH2 to each other. For example, the opposite first side surfaces SF may be spaced apart from each other in the first direction D1. Opposite second side surfaces of the first to third semiconductor patterns SP1 to SP3 of the first channel pattern CH1 may be spaced apart from each other in the second direction D2, and may be connected to the first source/drain patterns SD1. Opposite second side surfaces of the first to third semiconductor patterns SP1 to SP3 of the second channel pattern CH2 may be spaced apart from each other in the second direction D2, and may be connected to the second source/drain patterns SD2. The supporting pattern SUP may be in contact with the side surfaces SF of the first to third semiconductor patterns SP1 to SP3. The supporting pattern SUP may be extended to cover a top surface UF of the third semiconductor pattern SP3. The supporting pattern SUP may include a first vertical portion VE1, a second vertical portion VE2, and a connecting portion CN. The connecting portion CN may be in contact with the top surface UF of the third semiconductor pattern SP3. The first and second vertical portions VE1 and VE2 may be extended from the top surface of the device isolation layer ST to the top surface UF of the third semiconductor pattern SP3. Lower portions of the first and second vertical portions VE1 and VE2 may be connected to the first active pattern AP1 and the second active pattern AP2. The first and second vertical portions VE1 and VE2 may face each other and may be spaced apart in the first direction D1 from each other with the first to third semiconductor patterns SP1 to SP3 interposed therebetween. For example, the supporting pattern SUP may have an arch-shape section. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As shown in FIG. 3A, the largest width of a fourth portion PO4 of a first gate electrode GE1 in the second direction D2 may be a first width W1. The first width W1 may be defined as a channel length, a length of the channel pattern, or a gate length. For example, the first width W1 may range from 100 nm to 300 nm. The supporting pattern SUP may have a second width W2 in the second direction D2. The second width W2 may be smaller than the first width W1. For example, a ratio W2/W1 of the second width W2 to the first width W1 may range from 0.05 to 0.2 (i.e., 5% to 20%). The first width W1 may range from 5 nm to 30 nm.

A thickness T4 of the supporting pattern SUP may be smaller than thicknesses T1, T2, and T3 of the first to third semiconductor patterns SP1 to SP3. As an example, the thickness T4 of the supporting pattern SUP may range from 2 nm to 3 nm.

The supporting pattern SUP may be formed of or may include the same material as the first to third semiconductor patterns SP1 to SP3. The supporting pattern SUP may be formed of or may include the same material as the first and second active patterns AP1 and AP2. The supporting pattern SUP and the first to third semiconductor patterns SP1 to SP3 may be connected to form a single object. For example, the supporting pattern SUP may be connected to each of the first to third semiconductor patterns SP1 to SP3, and since being formed of the same material, the connected structure of the supporting pattern SUP and the first to third semiconductor patterns SP1 to SP3 may be seen as a single object. The supporting pattern SUP and the first and second active pattern AP1 or AP2 may be connected to form a single object.

As an example, the supporting pattern SUP may be formed of or may include silicon having the same crystal direction (i.e., the same crystal orientation) as the first to third semiconductor patterns SP1 to SP3. As another example, the supporting pattern SUP may be formed of or may include amorphous silicon.

The first gate electrode GE1 may be provided to cross the first and second active patterns AP1 and AP2 and to extend in the first direction D1. The first gate electrode GE1 may be extended from the first PMOSFET region PR1 to the first NMOSFET region NR1. The first gate electrode GE1 may be vertically overlapped with the first and second channel patterns CH1 and CH2.

The first gate electrode GE1 may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 provided on the third semiconductor pattern SP3.

Referring back to FIGS. 1 and 2A to 2D, a pair of gate spacers GS may be disposed on opposite side surfaces of the first gate electrode GE1. The gate spacers GS may be extended along the first gate electrode GE1 or in the first direction D1. The gate spacers GS may have top surfaces that are higher than the top surface of the first gate electrode GE1. The top surfaces of the gate spacers GS may be coplanar with a top surface of a first interlayer insulating layer 110, which will be described below. The gate spacers GS may be formed of or may include at least one of SiCN, SiCON, or SiN. In an embodiment, the gate spacers GS may be a multi-layered structure including at least two layers, each of which is made of SiCN, SiCON, or SiN. In an embodiment, the at least two layers may be formed of different materials.

A gate capping pattern GP may be provided on the first gate electrode GE1. The gate capping pattern GP may be extended along the first gate electrode GE1 or in the first direction D1. The gate capping pattern GP may be formed of or may include a material having etch selectivity with respect to first and second interlayer insulating layers 110 and 120, which will be described below. For example, the gate capping patterns GP may be formed of or may include at least one of SiON, SiCN, SiCON, or SiN.

A first gate insulating layer GI1 may be interposed between the first gate electrode GE1 and the first channel pattern CH1 and between the first gate electrode GE1 and the second channel pattern CH2. The first gate insulating layer GI1 may be extended along a bottom surface of the first gate electrode GE1 thereon. The first gate insulating layer GI1 may cover a top surface of the device isolation layer ST, which is located below the first gate electrode GE1.

Figure 2C:
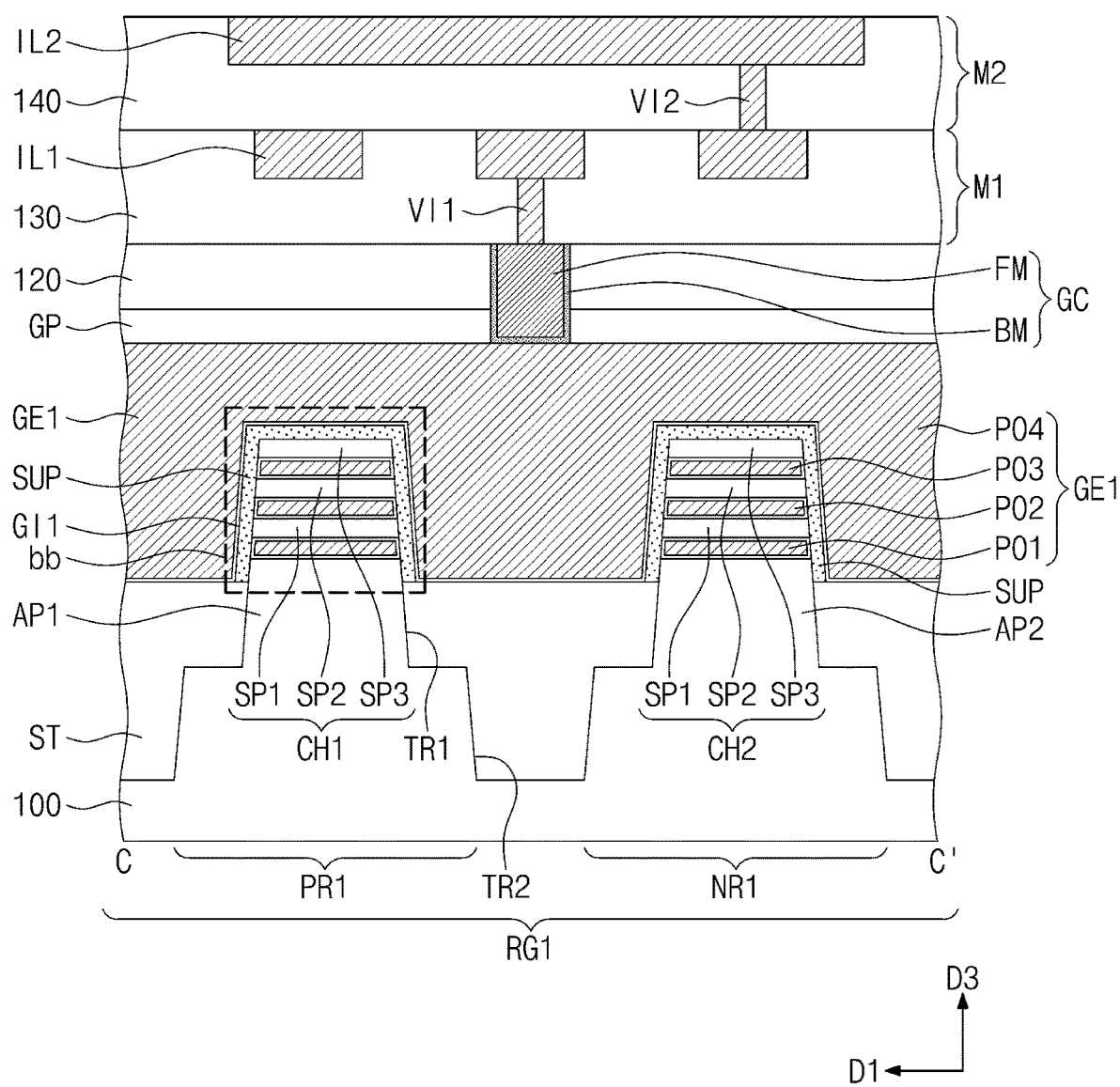
Figure 2D:
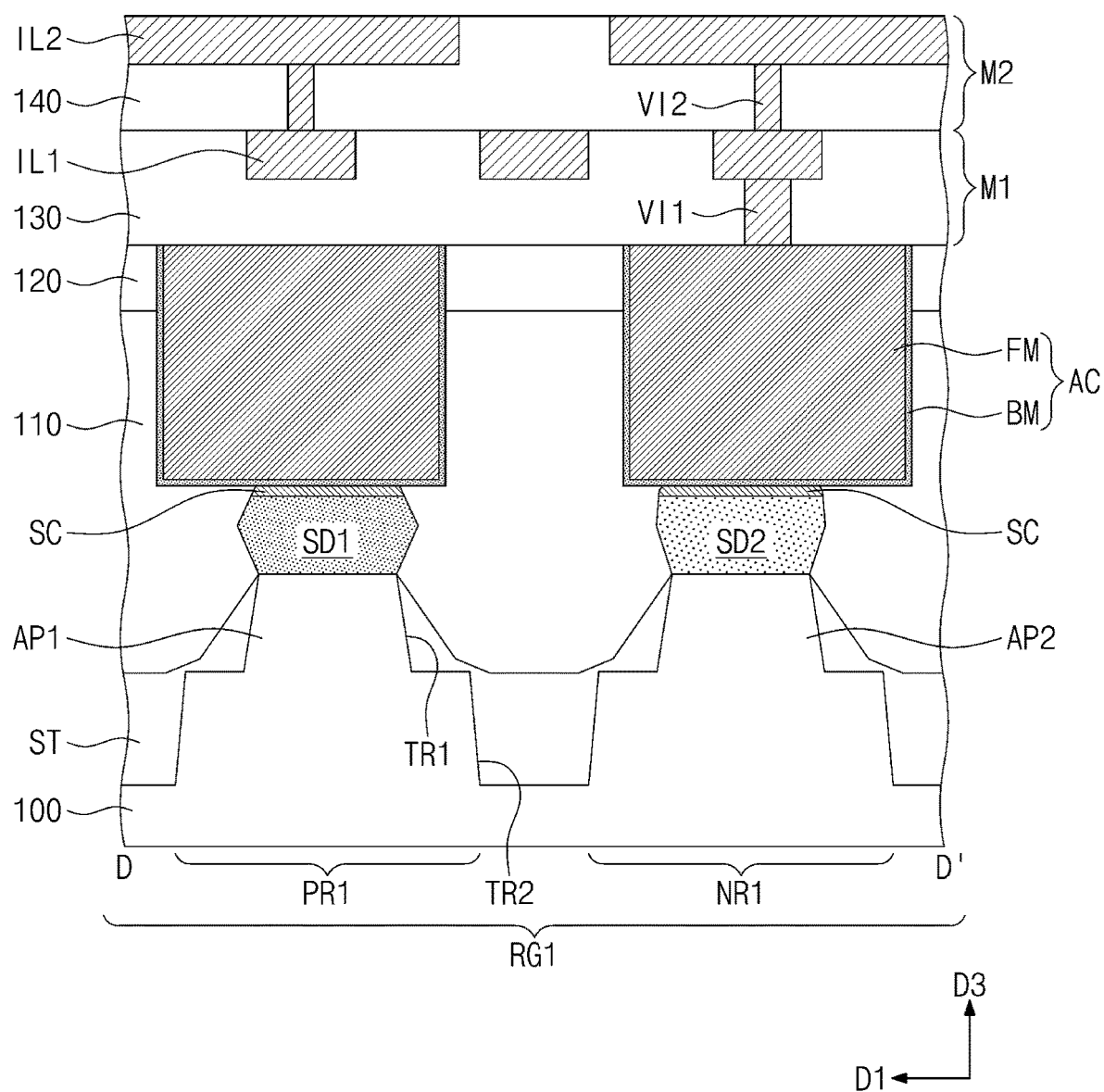
Figure 2E:
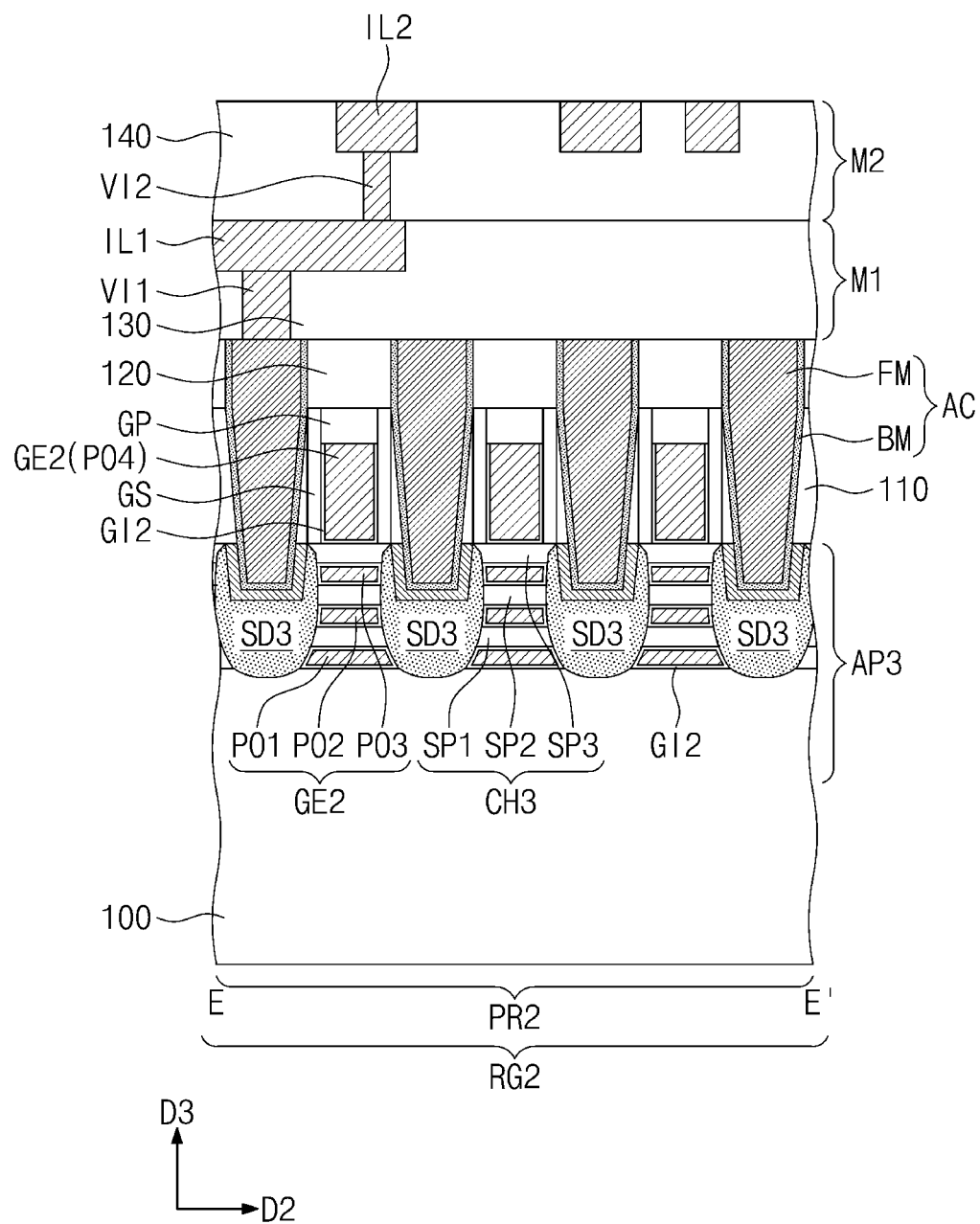
Figure 2F:
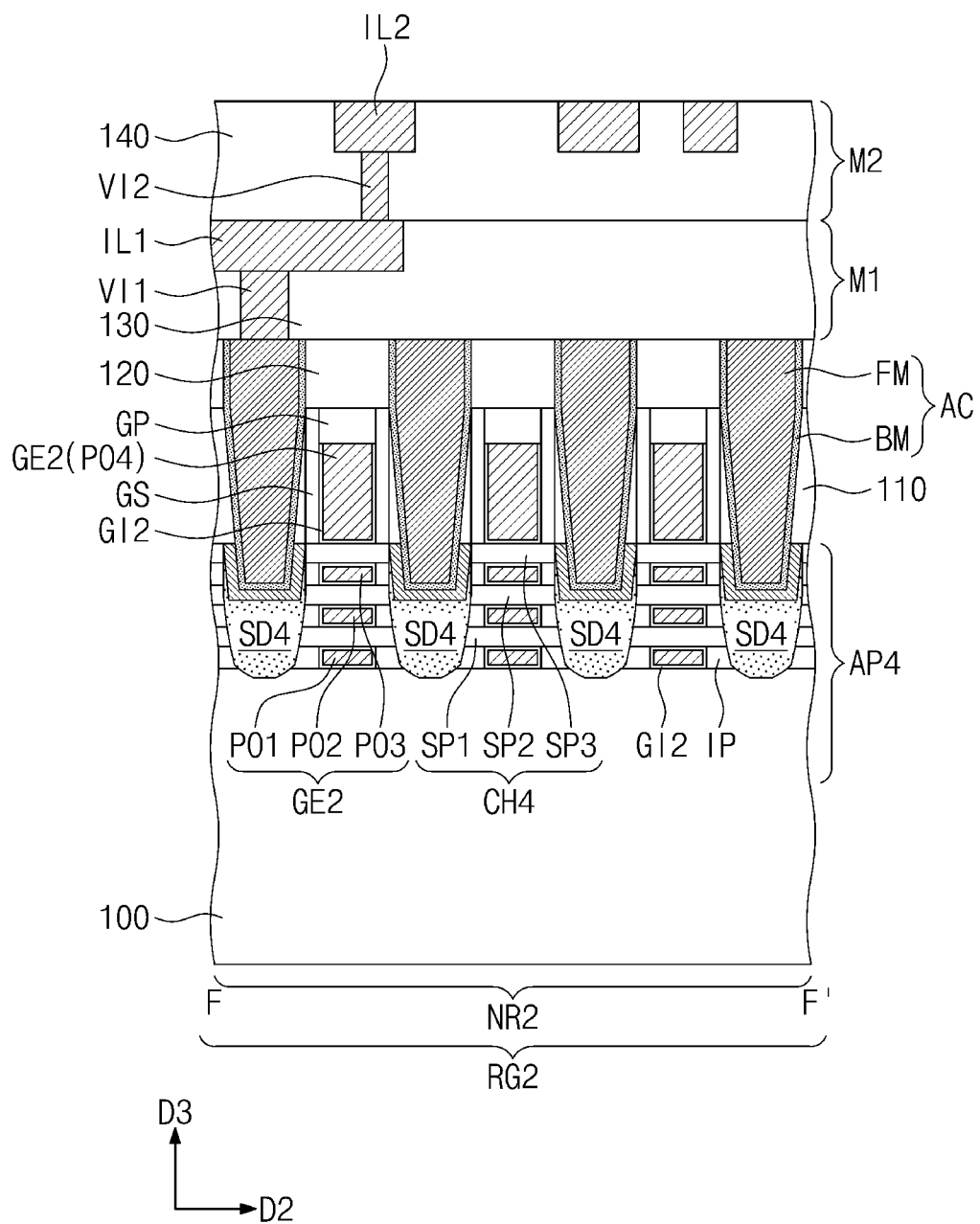
Figure 2G:
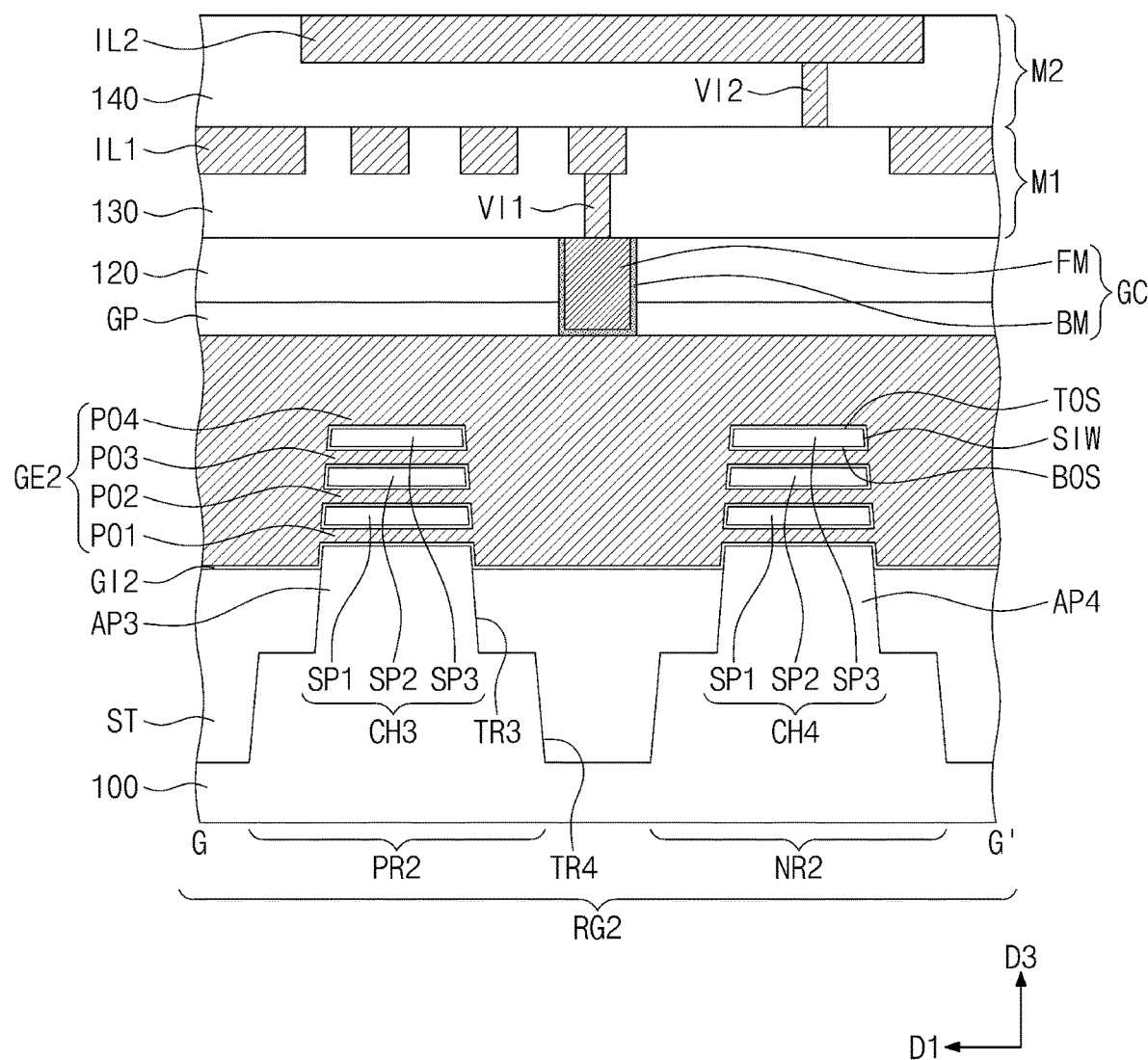
Figure 2H:
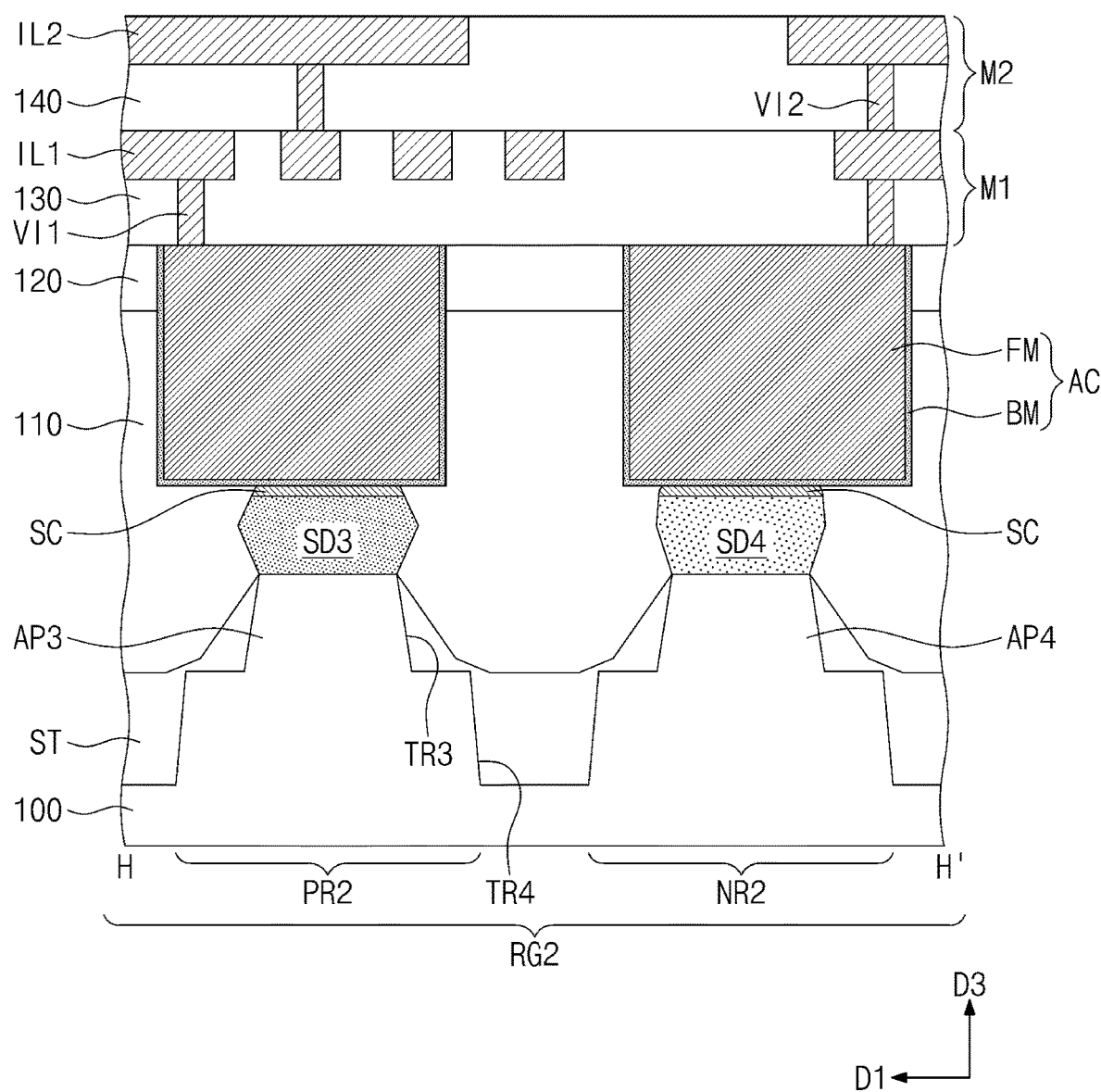

As shown in FIG. 2C, the fourth portion PO4 of the first gate electrode GE1 may be provided to cover an outer side surface of the supporting pattern SUP. The first gate insulating layer GI1 may be interposed between the fourth portion PO4 of the first gate electrode GE1 and the supporting pattern SUP. The supporting pattern SUP may cover the first to third portions PO1 to PO3 of the first gate electrode GE1. The first gate insulating layer GI1 may be interposed between the supporting pattern SUP and the first to third portions PO1 to PO3 of the first gate electrode GE1.

In an embodiment, the first gate insulating layer GI1 may include or may be formed of a silicon oxide layer, a silicon oxynitride layer, and/or a high-k dielectric layer. The high-k dielectric layer may be formed of or may include a high-k dielectric material whose dielectric constant is higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an embodiment, the semiconductor device may include a negative capacitance (NC) FET using a negative capacitor. For example, the first gate insulating layer GI1 may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may have a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or may include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be one of compounds composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the total number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or may include at least one of, for example, silicon oxide and/or high-k metal oxides. The metal oxides, which can be used as the paraelectric layer, may include or may be formed of at least one of, for example, hafnium oxide, zirconium oxide, and/or aluminum oxide, but the inventive concept is not limited to these examples.

The ferroelectric layer and the paraelectric layer may include the same material as each other. The ferroelectric layer may have the ferroelectric property, but the paraelectric layer does not have the ferroelectric property. For example, in the case where the ferroelectric and paraelectric layers contain or are hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the thickness of the ferroelectric layer may be in a range from 0.5 to 10 nm, but the inventive concept is not limited to this range. Since a critical thickness associated with the ferroelectric property varies depending on the kind of the ferroelectric material, the thickness of the ferroelectric layer may be changed depending on the kind of the ferroelectric material.

As an example, the first gate insulating layer GI1 may be a single ferroelectric layer. As another example, the first gate insulating layer GI1 may include a plurality of ferroelectric layers spaced apart from each other. The first gate insulating layer GI1 may have a multi-layered structure, in which a plurality of ferroelectric layers and a plurality of paraelectric layers are alternately stacked on each other.

The first gate electrode GE1 may include or may be formed of a first metal pattern and a second metal pattern on the first metal pattern. The first metal pattern may be provided on the first gate insulating layer GI1 to be adjacent to the first and second channel patterns CH1 and CH2. The first metal pattern may include or may be formed of a work function metal, which may be used to adjust a threshold voltage of the transistor. By adjusting a thickness and composition of the first metal pattern, it may be possible to implement a transistor having a desired threshold voltage.

The first metal pattern may include or may be formed of a metal nitride layer. For example, the first metal pattern may include or may be formed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked on each other.

The second metal pattern may include or may be formed of a metallic material whose resistance is lower than the first metal pattern. For example, the second metal pattern may include or may be formed of at least one metallic material, which is selected from the group consisting of tungsten (W), aluminum (Al), titanium (Ti), and tantalum (Ta).

Although not shown, the second metal pattern is not included in the first to third portions PO1, PO2, and PO3 of the first gate electrode GE1 and may be included in only the fourth portion PO4 of the first gate electrode GE1. For example, the first to third portions PO1, PO2, and PO3 of the first gate electrode GE1 may include or may be formed of only the first metal pattern, and the fourth portion PO4 may include or may be formed of both of the first and second metal patterns.

Referring back to FIG. 2B, inner spacers IP may be provided on the first NMOSFET region NR1. The inner spacers IP may be respectively interposed between the first to third portions PO1, PO2, and PO3 of the first gate electrode GE1 and the second source/drain pattern SD2. The inner spacers IP may be in contact with the second source/drain pattern SD2. Each of the first to third portions PO1, PO2, and PO3 of the gate electrode GE may be spaced apart from the second source/drain pattern SD2 by the inner spacer IP.

The inner spacer IP may be formed of or may include at least one of low-k dielectric materials. The low-k dielectric materials may include silicon oxide or dielectric materials whose dielectric constants are lower than that of silicon oxide. For example, the low-k dielectric materials may include silicon oxide, fluorine- or carbon-doped silicon oxide, porous silicon oxide, or organic polymeric dielectric materials.

A first interlayer insulating layer 110 may be provided on the substrate 100. The first interlayer insulating layer 110 may cover the gate spacers GS and the first and second source/drain patterns SD1 and SD2. The first interlayered insulating layer 110 may have a top surface that is substantially coplanar with the top surface of the gate capping pattern GP and the top surfaces of the gate spacers GS. A second interlayer insulating layer 120 may be provided on the first interlayer insulating layer 110 to cover the gate capping pattern GP. In an embodiment, at least one of the first and second interlayer insulating layers 110 and 120 may include or may be formed of a silicon oxide layer.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at opposite sides of the first gate electrode GE1. When viewed in a plan view, the active contact AC may be a bar-shaped pattern extended in the first direction D1.

The active contact AC may include a conductive pattern FM and a barrier pattern BM surrounding the conductive pattern FM. The conductive pattern FM may be formed of or may include at least one metallic material of, for example, aluminum, copper, tungsten, molybdenum, or cobalt. The barrier pattern BM may cover side and bottom surfaces of the conductive pattern FM. In an embodiment, the barrier pattern BM may include or may be formed of a metal layer and a metal nitride layer. The metal layer may be formed of or may include at least one of titanium, tantalum, tungsten, nickel, cobalt, or platinum. The metal nitride layer may be formed of or may include at least one of titanium nitride (TiN), tantalum nitride (TaN), tungsten nitride (WN), nickel nitride (NiN), cobalt nitride (CoN), or platinum nitride (PtN).

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or may include at least one of metal silicide materials (e.g., titanium silicide, tantalum silicide, tungsten silicide, nickel silicide, or cobalt silicide).

A gate contact GC may be provided to penetrate the second interlayer insulating layer 120 and the gate capping pattern GP and to be electrically connected to the first gate electrode GE1. The gate contact GC may be provided on the device isolation layer ST between the first PMOSFET region PR1 and the first NMOSFET region NR1. When viewed in a plan view, the gate contact GC may be a bar-shaped pattern extending in the second direction D2. The gate contact GC may include the conductive pattern FM and the barrier pattern BM surrounding the conductive pattern FM, similar to the active contact AC.

A third interlayer insulating layer 130 may be provided on the second interlayer insulating layer 120. A first metal layer M1 may be provided in the third interlayer insulating layer 130. The first metal layer M1 may include first interconnection lines IL1 and first vias VI1. The first vias VI1 may be provided below the first interconnection lines IL1. The first interconnection lines IL1 may be disposed in the first direction D1. Each of the first interconnection lines IL1 may be a line- or bar-shaped pattern extending in the second direction D2.

The first vias VI1 may be provided below the first interconnection lines IL1 of the first metal layer M1, respectively. The first vias VI1 may be respectively interposed between the active contacts AC and the first interconnection lines IL1. The first vias VI1 may be respectively interposed between the gate contacts GC and the first interconnection lines IL1.

The first interconnection line IL1 and the first via VI1 thereunder may be formed by separate processes. For example, each of the first interconnection line IL1 and the first via VI1 may be formed by a single damascene process. The semiconductor device according to the present embodiment may be fabricated using a sub-20 nm process.

A fourth interlayer insulating layer 140 may be provided on the third interlayer insulating layer 130. A second metal layer M2 may be provided in the fourth interlayer insulating layer 140. The second metal layer M2 may include second interconnection lines IL2. Each of the second interconnection lines IL2 may be a line- or bar-shaped pattern extending in the first direction D1. For example, the second interconnection lines IL2 may be extended in the first direction D1 to be parallel to each other.

The second metal layer M2 may further include second vias VI2. The second vias VI2 may be provided below the second interconnection lines IL2, respectively. The second vias VI2 may be respectively interposed between the first interconnection lines IL1 and the second interconnection lines IL2.

The second interconnection line IL2 and the second via VI2 thereunder may be formed by the same process, and in this case, they may constitute a single object. For example, the second interconnection line IL2 and the second via VI2 of the second metal layer M2 may be formed together by a dual damascene process.

The first interconnection lines IL1 of the first metal layer M1 and the second interconnection lines IL2 of the second metal layer M2 may be formed of or may include the same conductive material or different conductive materials. For example, the first interconnection lines IL1 and the second interconnection lines IL2 may be formed of or may include at least one of metallic materials (e.g., copper (Cu), ruthenium (Ru), cobalt (Co), tungsten (W), aluminum (Al), and/or molybdenum (Mo)).

In an embodiment, although not shown, additional metal layers (e.g., M3, M4, M5, and so forth) may be further stacked on the fourth interlayer insulating layer 140. Each of the stacked metal layers may include routing lines.

Hereinafter, the transistor in the second region RG2 will be described in more detail with reference to FIGS. 1 and 2E to 2H. The same features as the transistor in the first region RG1 described with reference to FIGS. 1 and 2A to 2D may be omitted in the following description, for the sake of brevity.

The second region RG2 may include a second PMOSFET region PR2 and a second NMOSFET region NR2. The second PMOSFET region PR2 and the second NMOSFET region NR2 may be defined by a fourth trench TR4, which is formed in an upper portion of the substrate 100. The third trench TR3 may be connected to the fourth trench TR4. A width, in the first direction D1, of the third trench TR3 may be greater than a width, in the first direction D1, of the fourth trench TR4. A third active pattern AP3 and a fourth active pattern AP4 may be defined by a third trench TR3, which is formed in an upper portion of the substrate 100. The third active pattern AP3 and the fourth active pattern AP4 may be provided on the second PMOSFET region PR2 and the second NMOSFET region NR2, respectively. For example, each of the third and fourth active patterns AP3 and AP4 may protrude from a top surface of the substrate 100. It should be noted that in some embodiments, the third and fourth active patterns AP3 and AP4 may be part of the substrate 100, and in this manner, protruding from the substrate refers to protruding past the top surface of the substrate 100 (e.g., wherein the substrate itself has protrusions that extend beyond a main surface thereof).

The third active pattern AP3 may include a third channel pattern CH3 provided at its upper portion, and the fourth active pattern AP4 may include a fourth channel pattern CH4 provided at its upper portion. Each of the third and fourth channel patterns CH3 and CH4 may include the first to third semiconductor patterns SP1, SP2, and SP3, which are sequentially stacked on each other.

The first to third semiconductor patterns SP1, SP2, and SP3 of the third and fourth channel patterns CH3 and CH4 may be shorter than the first to third semiconductor patterns SP1, SP2, and SP3 of the first and second channel patterns CH1 and CH2 described above. For example, a length, in the second direction D2, of each of the first to third semiconductor patterns SP1, SP2, and SP3 of the third and fourth channel patterns CH3 and CH4 may be smaller than a length, in the second direction D2, of each of the first to third semiconductor patterns SP1, SP2, and SP3 of the first and second channel patterns CH1 and CH2. For example, a short gate transistor or a short channel transistor having a relatively short gate length or a relatively short channel length may be provided in the second region RG2.

Third source/drain patterns SD3 may be provided in an upper portion of the third active pattern AP3. Fourth source/drain patterns SD4 may be provided in an upper portion of the fourth active pattern AP4. The first to third semiconductor patterns SP1, SP2, and SP3 of the third channel pattern CH3 may be interposed between a pair of the third source/drain patterns SD3. The first to third semiconductor patterns SP1, SP2, and SP3 of the fourth channel pattern CH4 may be interposed between a pair of the fourth source/drain patterns SD4.

Each of the third source/drain patterns SD3 may be an epitaxial pattern, in which impurities of the first conductivity type (e.g., p-type) are included or doped. Each of the fourth source/drain patterns SD4 may be an epitaxial pattern, in which impurities of the second conductivity type (e.g., n-type) are included or doped.

Second gate electrodes GE2 may be provided to cross the third and fourth channel patterns CH3 and CH4 and to extend in the first direction D1. The second gate electrode GE2 may be extended from the second PMOSFET region PR2 to the second NMOSFET region NR2. The second gate electrode GE2 may be vertically overlapped with the third and fourth channel patterns CH3 and CH4. A pair of the gate spacers GS may be disposed on opposite side surfaces of the second gate electrode GE2. The gate capping pattern GP may be provided on the second gate electrode GE2.

The second gate electrode GE2 may include first to fourth portions PO1 to PO4, similar to the first gate electrode GE1. However, unlike the first region RG1 described above, the supporting pattern SUP on the second region RG2 may be omitted.

Referring back to FIG. 2G, the second gate electrode GE2 may be provided on a top surface TOS, a bottom surface BOS, and opposite side surfaces SIW of each of the first to third semiconductor patterns SP1, SP2, and SP3. For example, the transistor according to the present embodiment may be a three-dimensional field effect transistor (e.g., MBCFET or GAAFET) in which a gate electrode is provided to three-dimensionally surround the channel pattern.

Referring to FIGS. 1 and 2E to 2H, a second gate insulating layer GI2 may be interposed between the second gate electrode GE2 and the third channel pattern CH3 and between the second gate electrode GE2 and the fourth channel pattern CH4. The second gate insulating layer GI2 may directly cover the top surface TOS, the bottom surface BOS, and the side surfaces SIW of each of the first to third semiconductor patterns SP1, SP2, and SP3 (e.g., see FIG. 2G). The second gate insulating layer GI2 may include or may be formed of a silicon oxide layer, a silicon oxynitride layer, and/or a high-k dielectric layer.

The inner spacers IP may be provided on the second NMOSFET region NR2. The inner spacers IP may be respectively interposed between the first to third portions PO1, PO2, and PO3 of the second gate electrode GE2 and the fourth source/drain pattern SD4. Meanwhile, on the second PMOSFET region PR2, the inner spacers IP may be omitted.

The first interlayer insulating layer 110 and the second interlayer insulating layer 120 may be provided on the substrate 100. The active contacts AC may be provided to penetrate the first and second interlayer insulating layers 110 and 120 and to be electrically and respectively connected to the third and fourth source/drain patterns SD3 and SD4. The gate contact GC may be provided to penetrate the second interlayer insulating layer 120 and the gate capping pattern GP and to be electrically connected to the gate electrode GE. The first metal layer M1 and the second metal layer M2 may be provided on the second interlayer insulating layer 120. The active contacts AC, the gate contact GC, the first metal layer M1, and the second metal layer M2 may be configured to have substantially the same features as those in the embodiment described with reference to FIGS. 1 and 2A to 2D.

Referring to FIG. 3C, the supporting pattern SUP may be used to fasten the first to third semiconductor patterns SP1 to SP3 (i.e., hold the first to third semiconductor patterns SP1 to SP3 in place to avoid collapse thereof in a fabrication process of transistors). If the supporting pattern SUP is omitted, at least one of the first to third semiconductor patterns SP1 to SP3 may be bent. For example, the first semiconductor pattern SP1 may be bent to be in contact with the substrate 100, and the second semiconductor pattern SP2 may be bent to be in contact with the third semiconductor pattern SP3. The first to third semiconductor patterns SP1, SP2, and SP3 on the first region RG1 may be longer than the first to third semiconductor patterns SP1, SP2, and SP3 on the second region RG2, and thus, if the supporting pattern SUP is omitted, the first to third semiconductor patterns SP1, SP2, and SP3 on the first region RG1 may be structurally unstable. Thus, the afore-described bending problem may occur in at least one of the first to third semiconductor patterns SP1, SP2, and SP3 on the first region RG1. If there is the channel bending problem, driving and electric characteristics of the transistor may be deteriorated. By contrast, according to an embodiment of the inventive concept, the supporting pattern SUP may be used to prevent channel patterns of a long channel transistor (e.g., the first to third semiconductor patterns SP1, SP2, and SP3) from being bent. Accordingly, it may be possible to improve uniformity in driving profile between long channel transistors and to prevent the electric characteristics of the long channel transistors from being deteriorated.

Figure 4A:
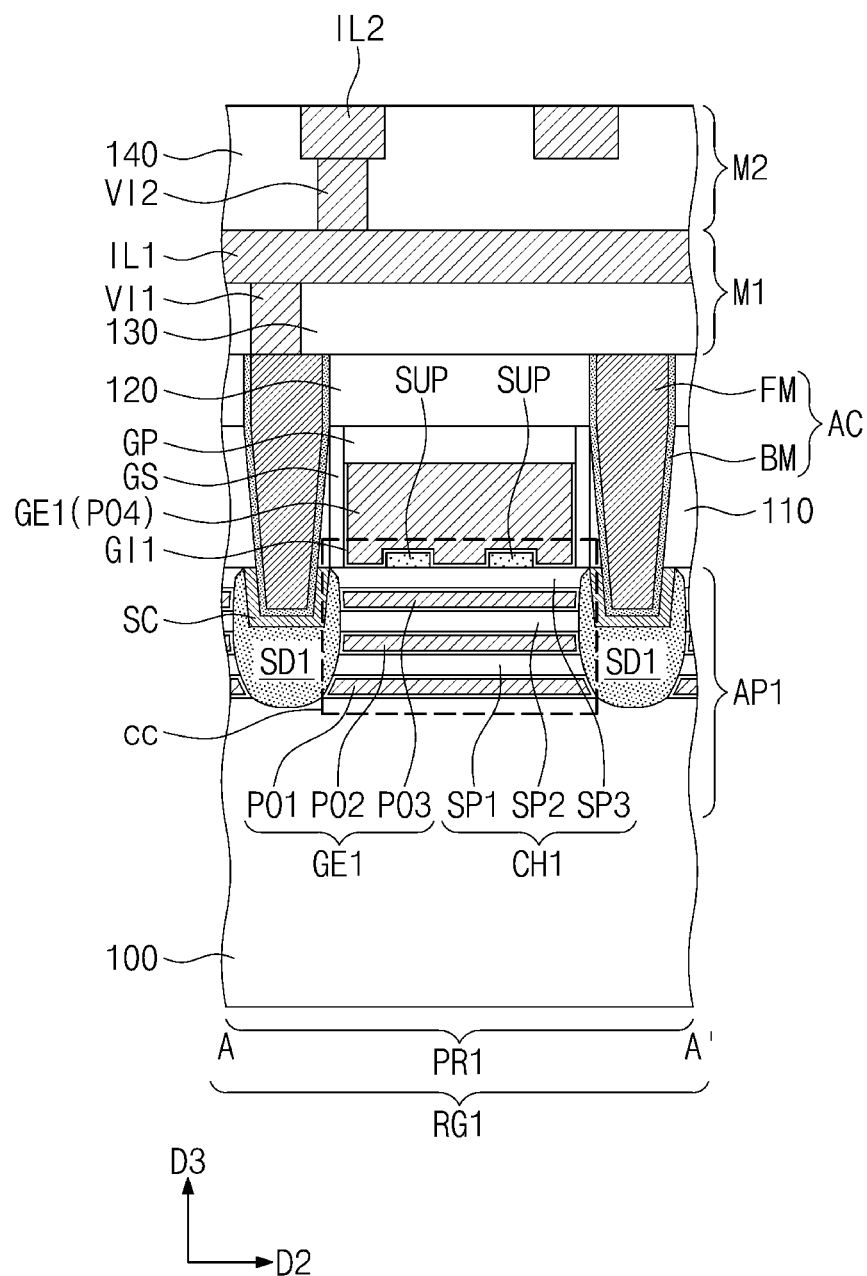
FIGS. 4A and 4B are sectional views respectively taken along lines A-A' and B-B' of FIG. 1.
Figure 4B:
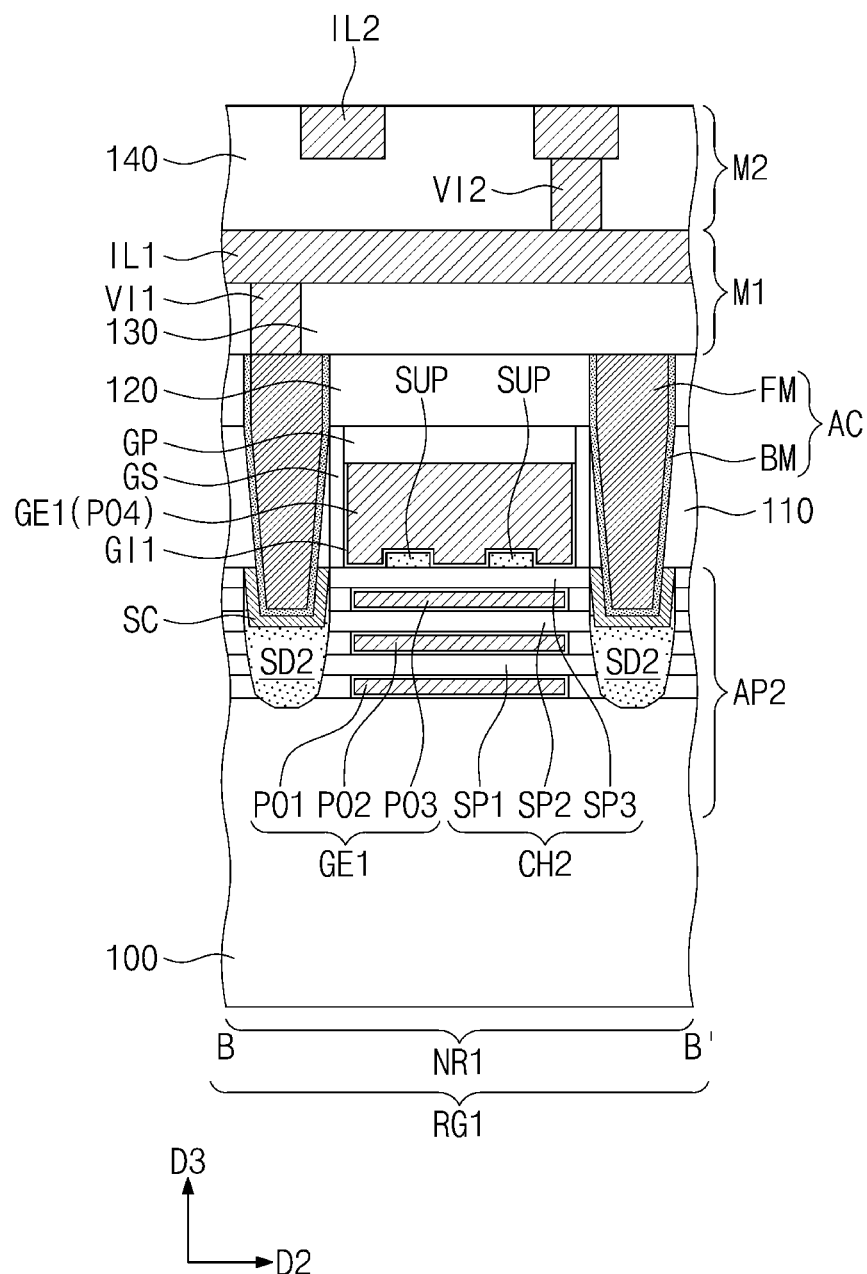
Figure 4C:
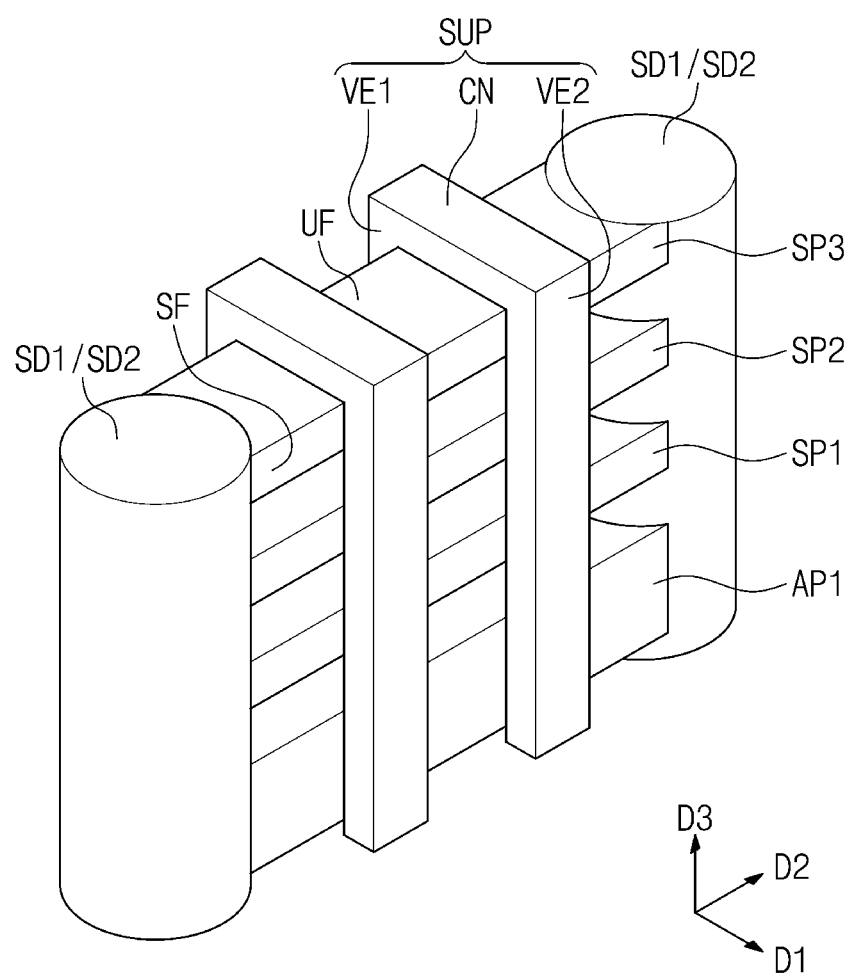
FIG. 4C is a perspective view illustrating a channel pattern and supporting patterns of FIG. 4A.
Figure 5:
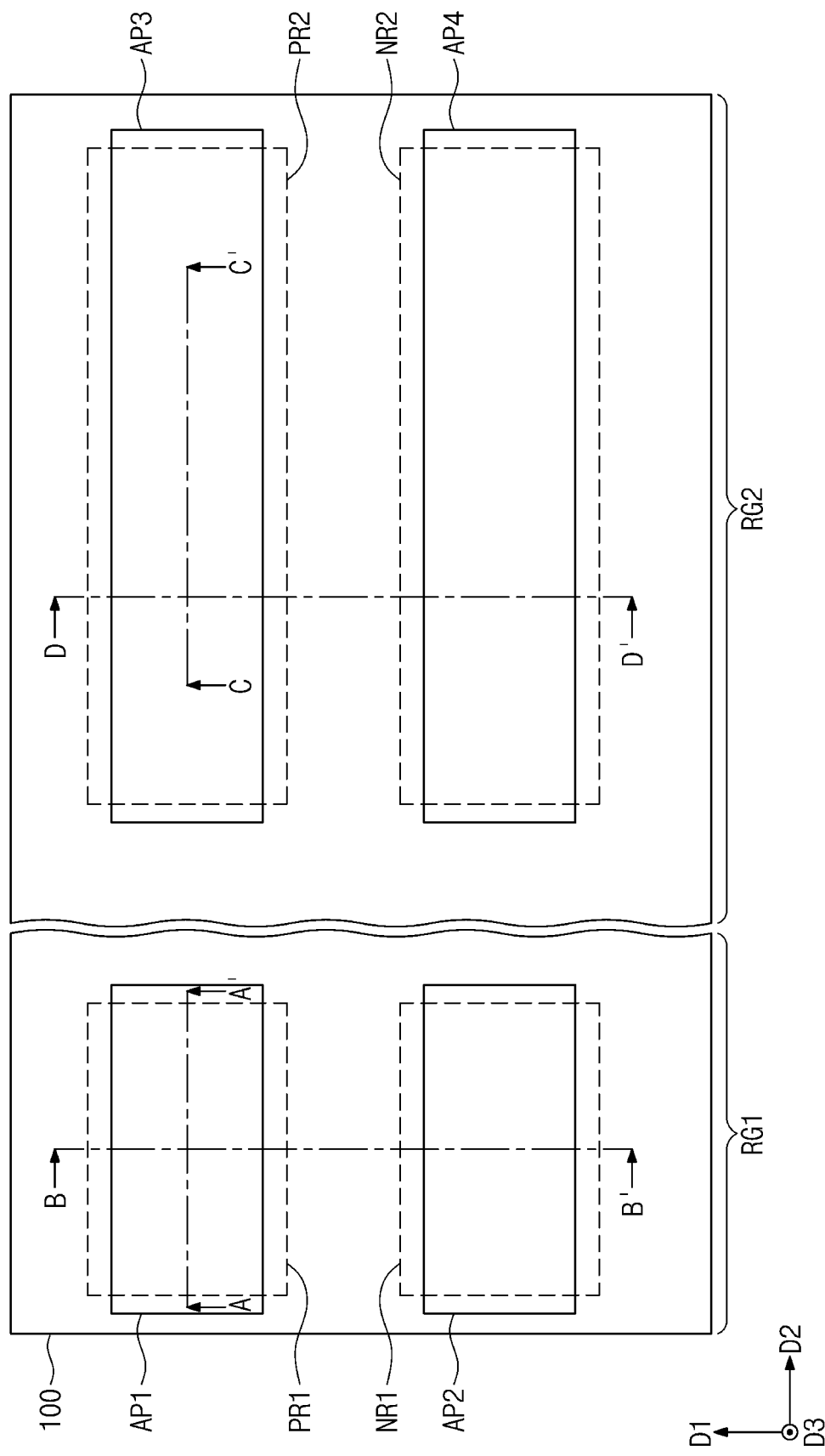
Figure 6A:
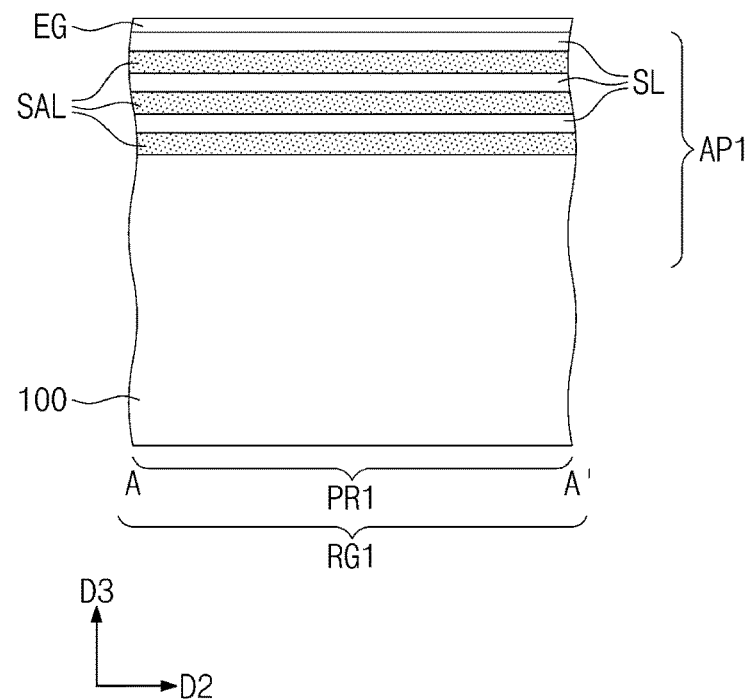
FIGS. 6A, 8A, 10A, 12A, 14A, 16A, and 18A are sectional views taken along lines A-A' of FIGS. 5, 7, 9, 11, 13, 15, and 17, respectively.
Figure 6B:
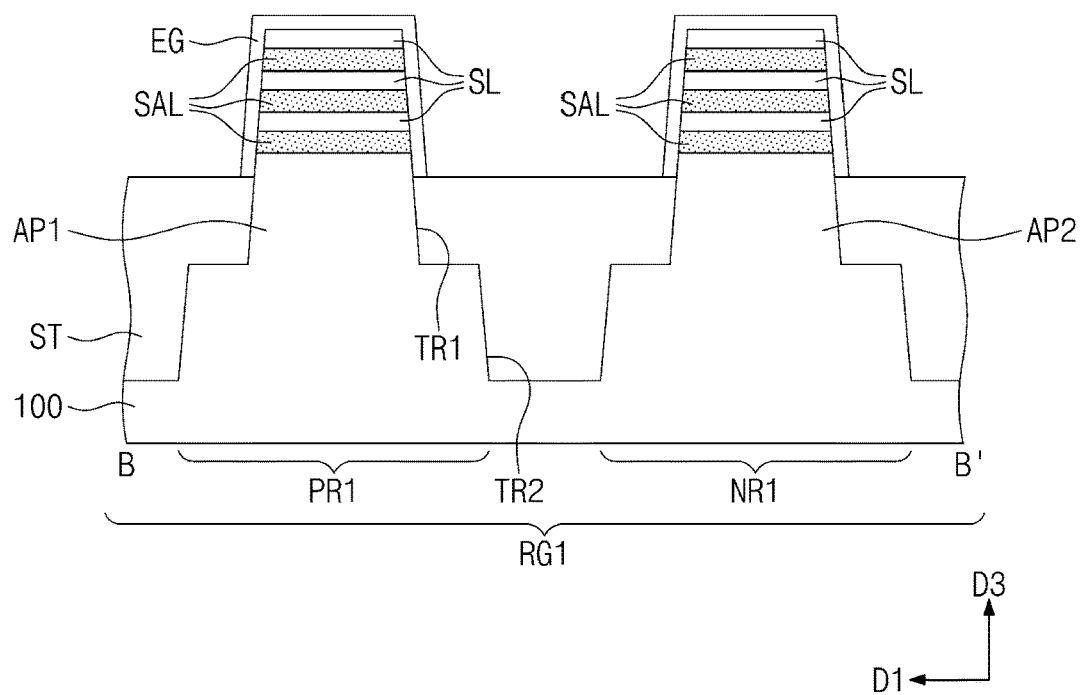
FIGS. 6B, 8B, 10B, 12B, 14B, 16B, and 18B are sectional views taken along lines B-B' of FIGS. 5, 7, 9, 11, 13, 15, and 17, respectively.
Figure 6C:
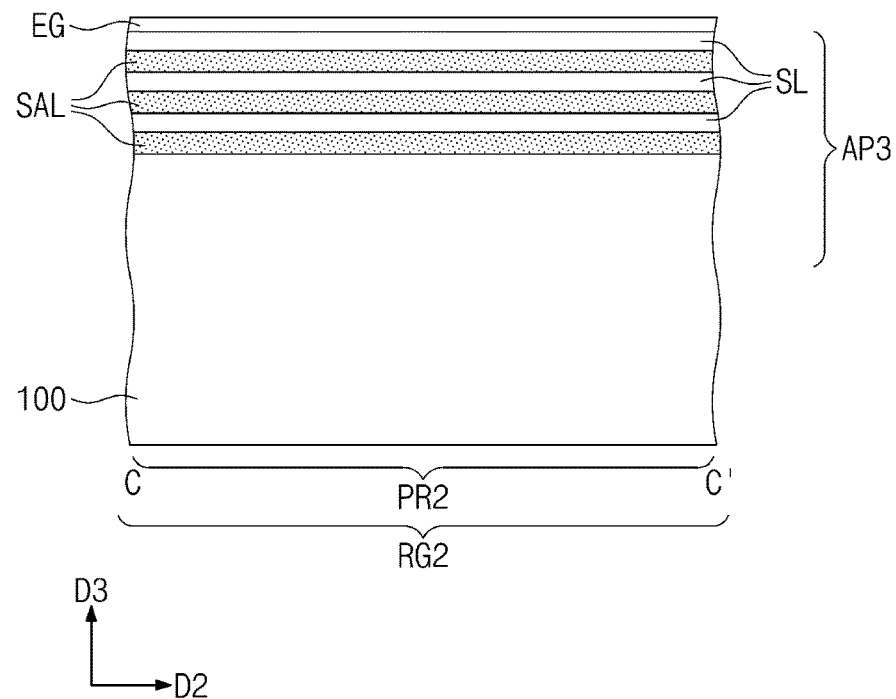
FIGS. 6C, 8C, 10C, 12C, 14C, 16C, and 18C are sectional views taken along lines C-C' of FIGS. 5, 7, 9, 11, 13, 15, and 17, respectively.
Figure 6D:
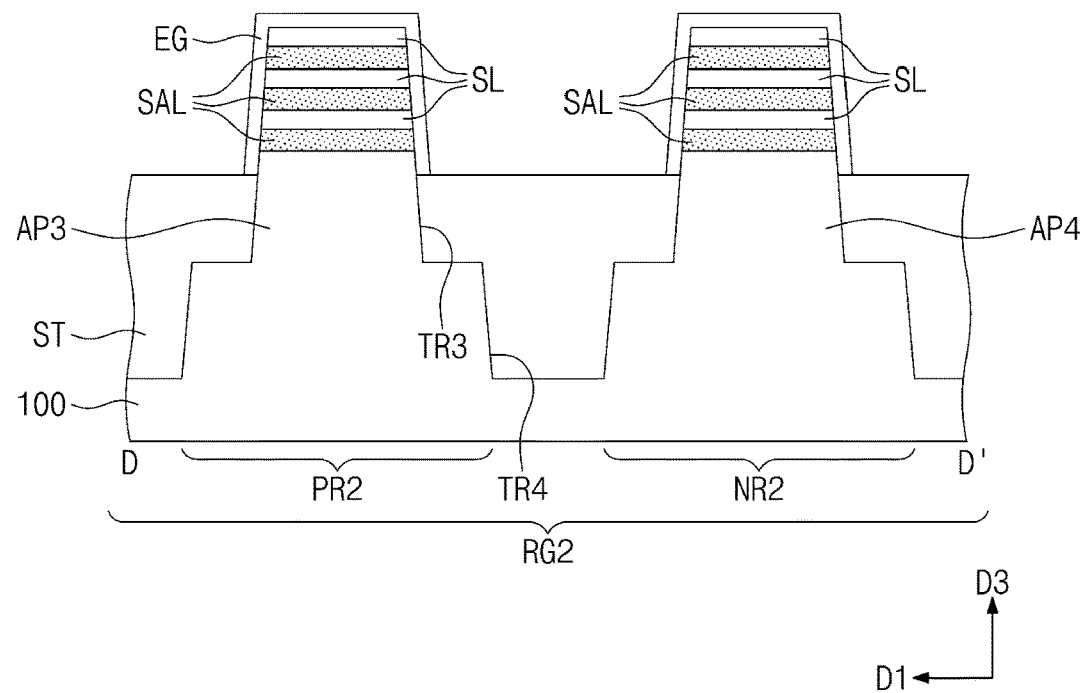
FIGS. 6D, 8D, 10D, 12D, 14D, 16D, and 18D are sectional views taken along lines D-D' of FIGS. 5, 7, 9, 11, 13, 15, and 17, respectively.
Figure 8A:
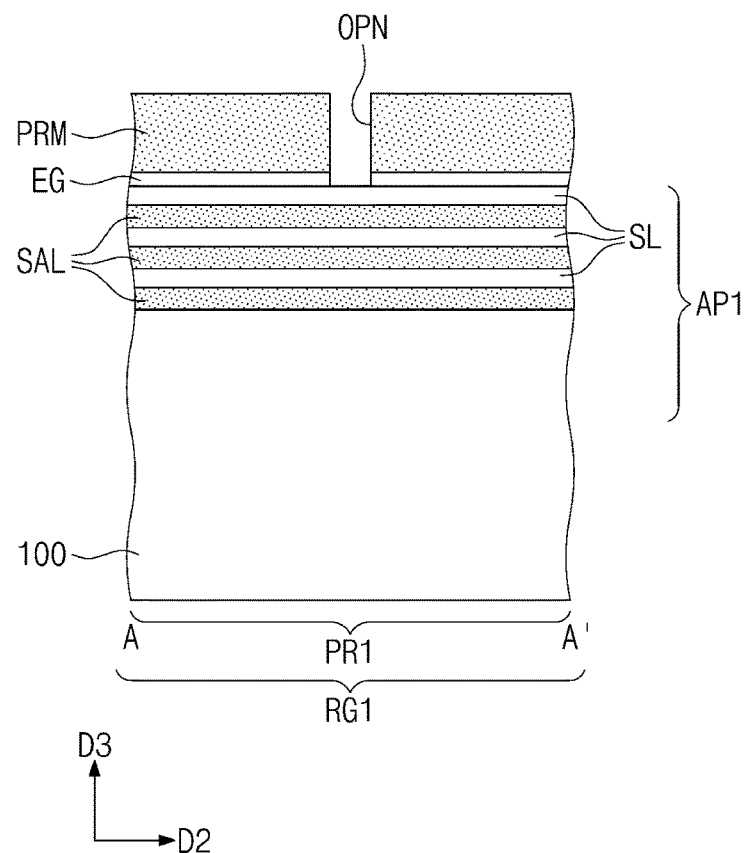
Figure 8B:
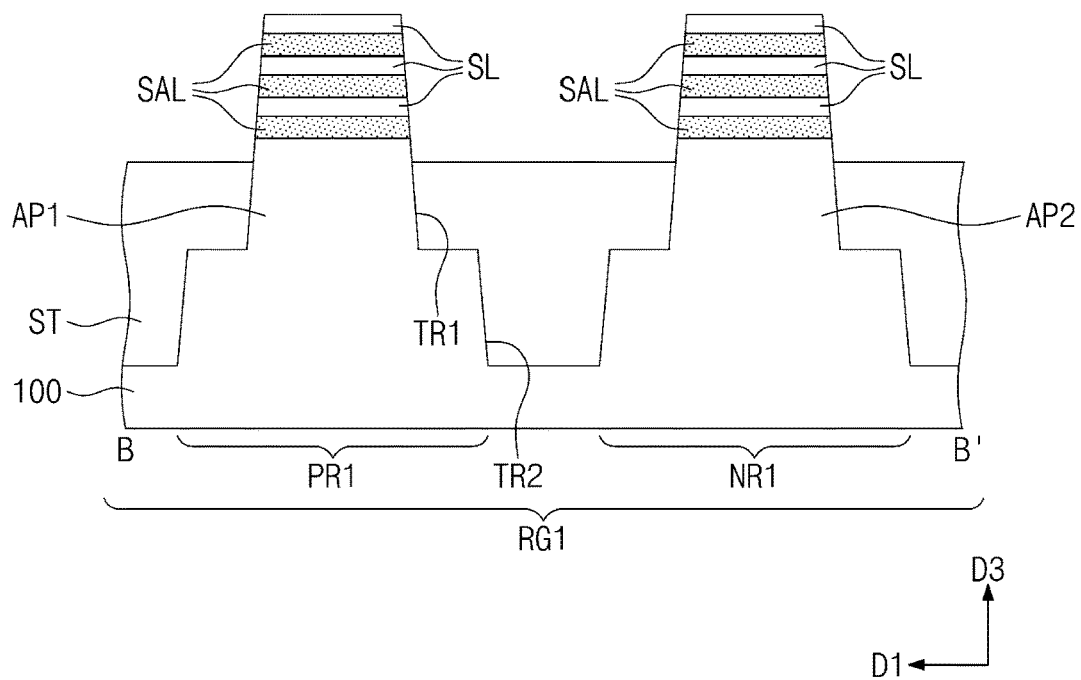
Figure 8C:
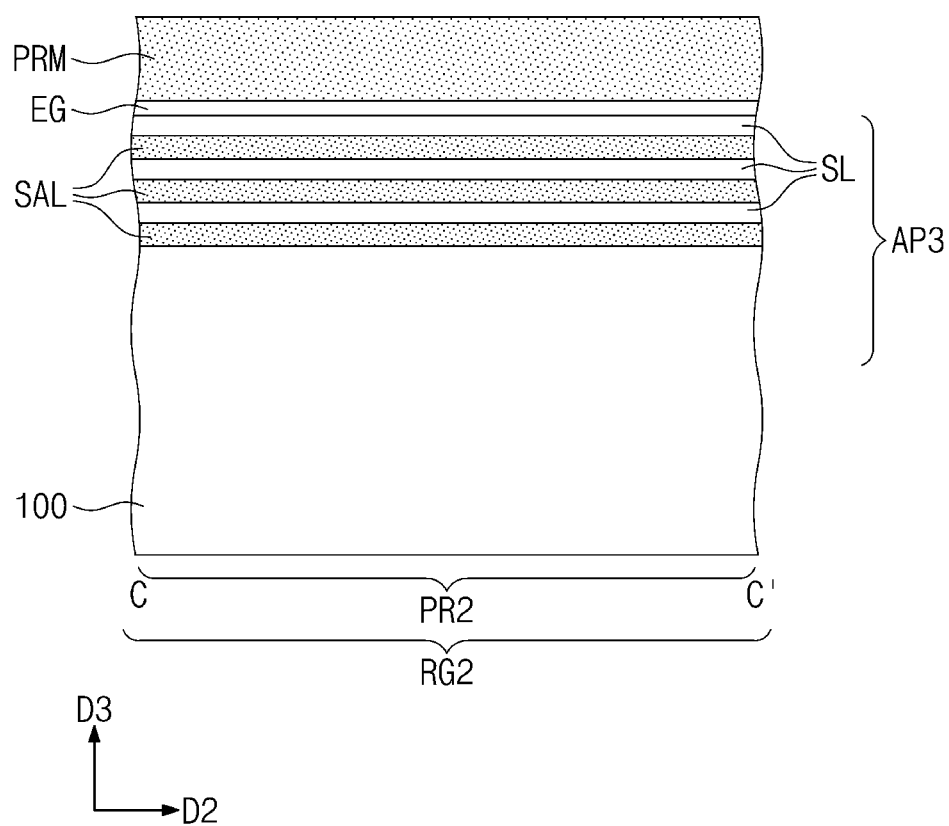
Figure 8D:
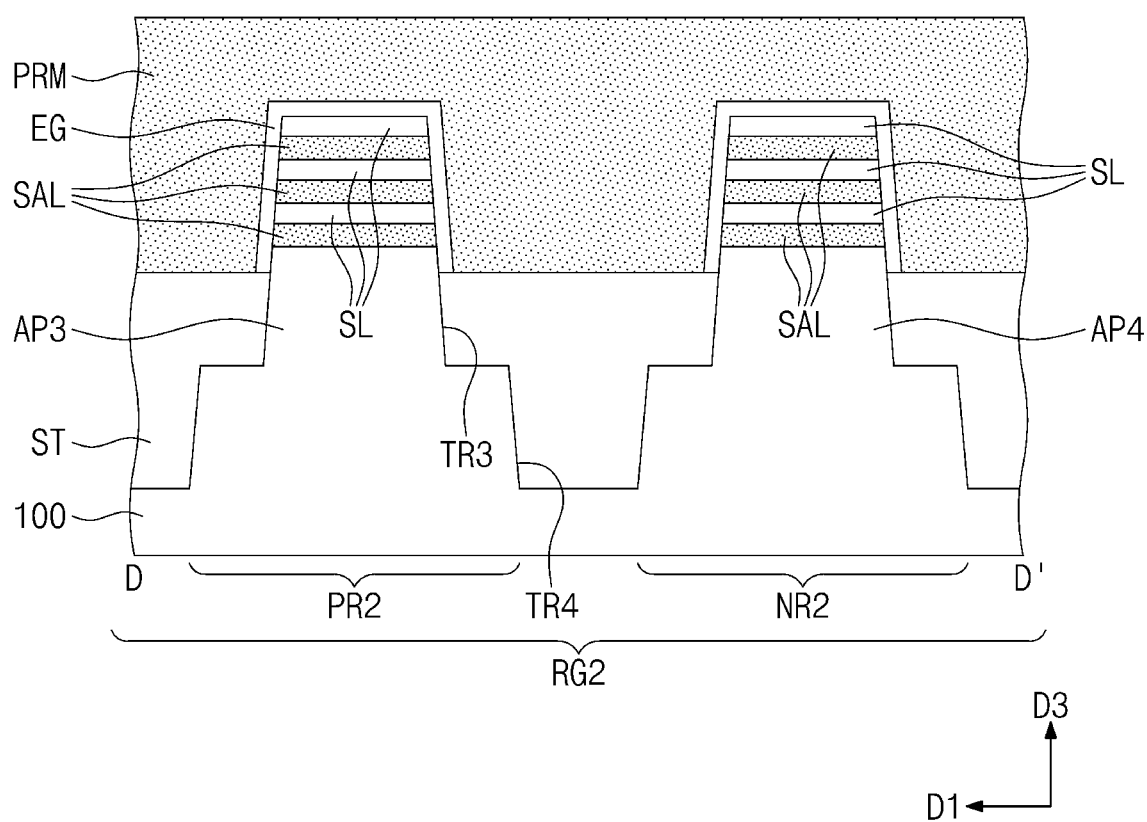
Figure 9:
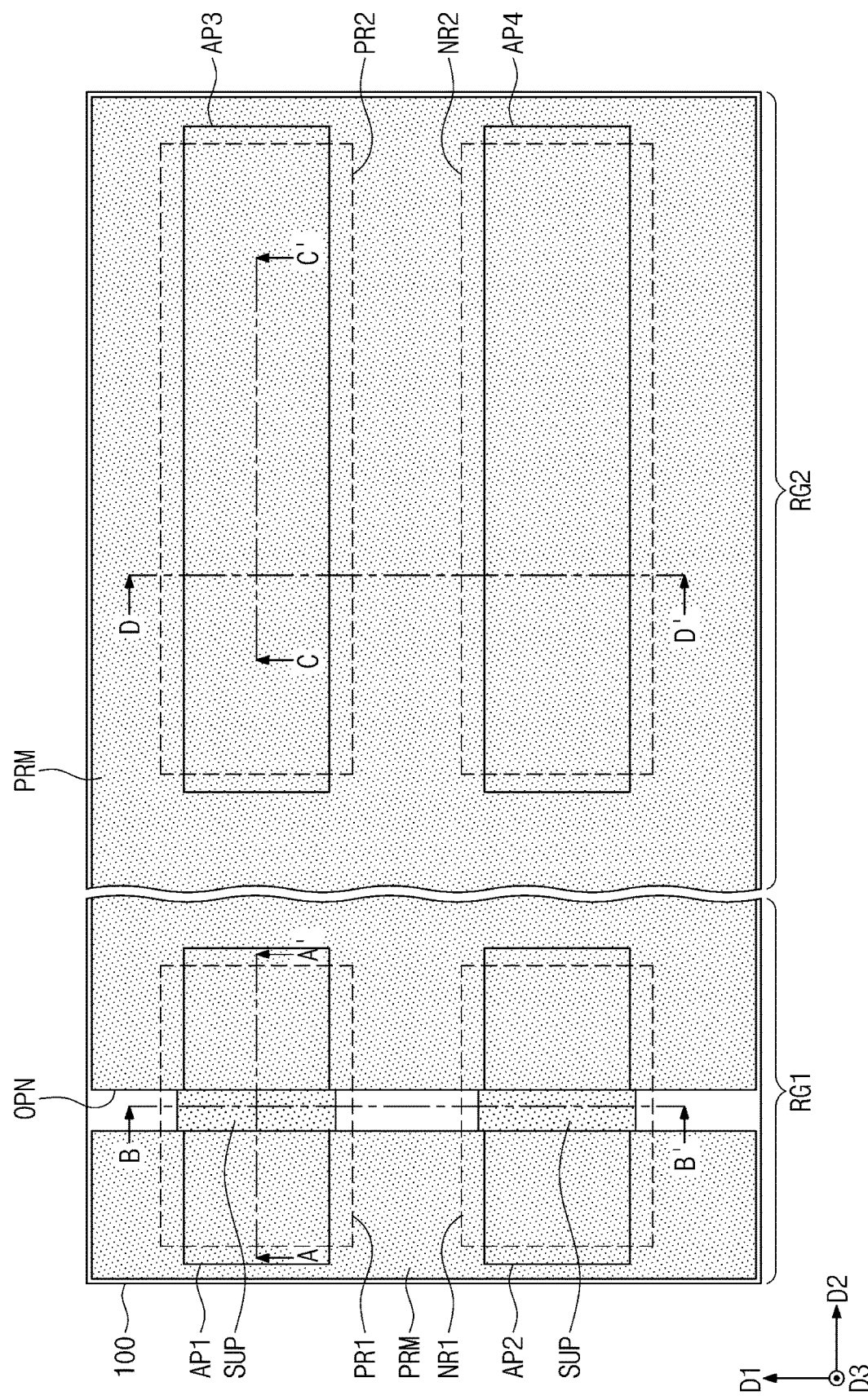
Figure 10A:
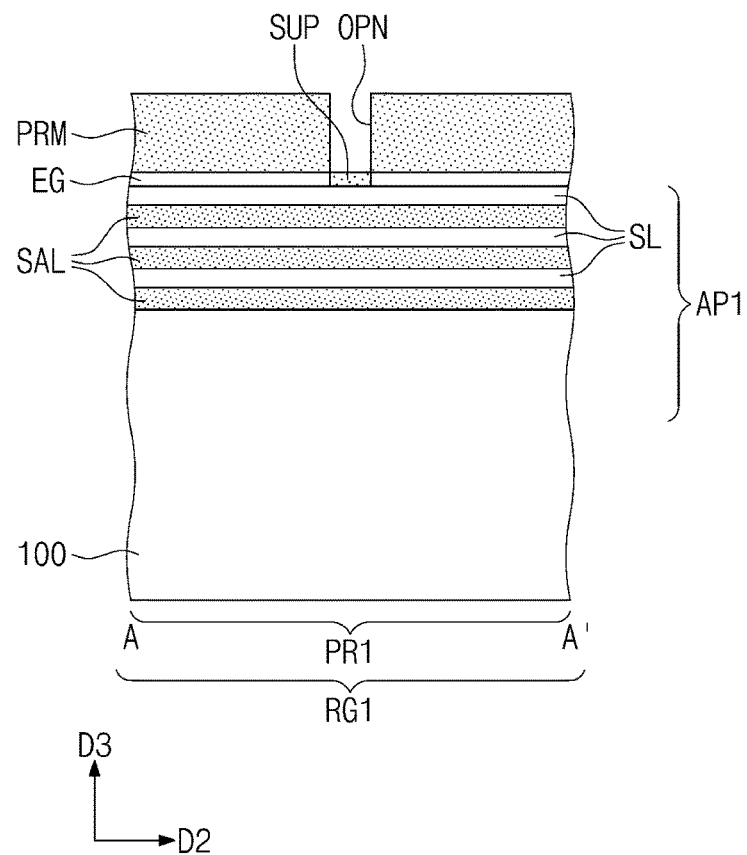
Figure 10B:
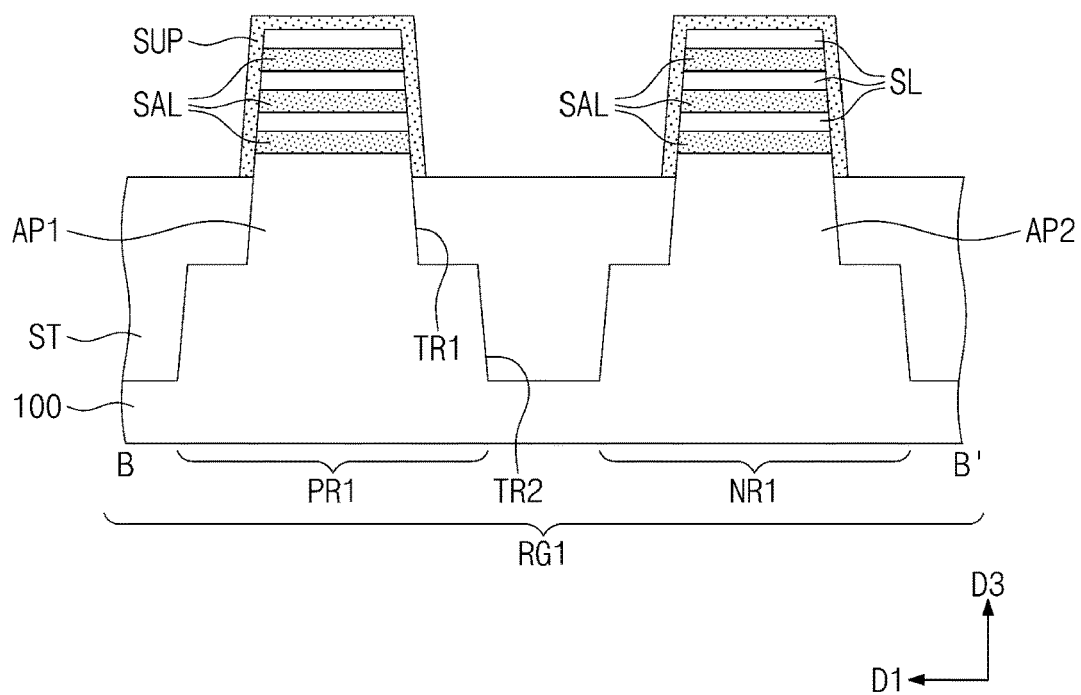
Figure 10C:
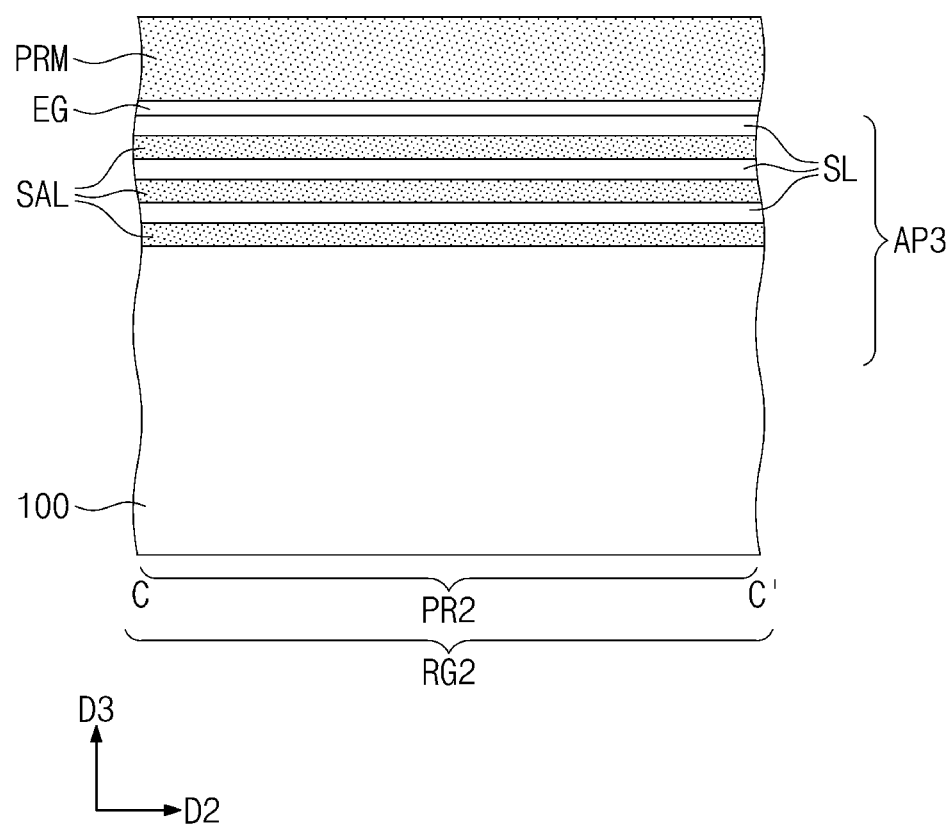
Figure 10D:
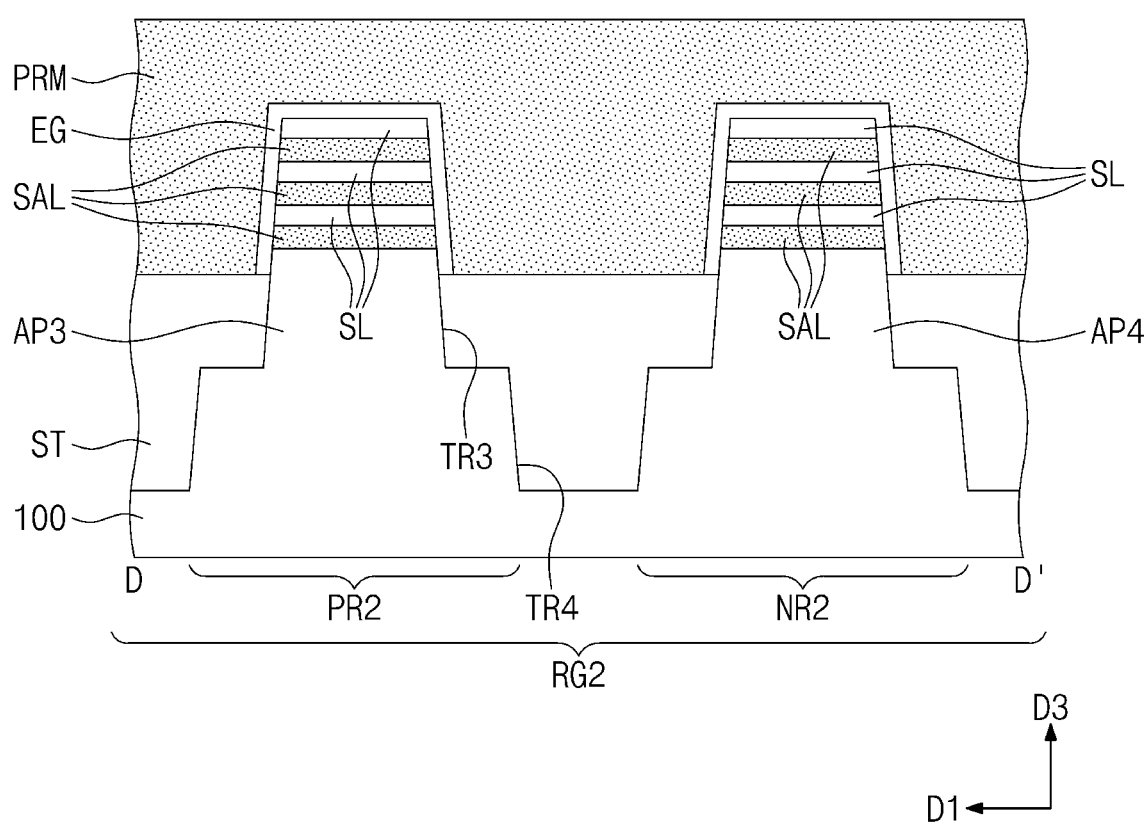
Figure 11:
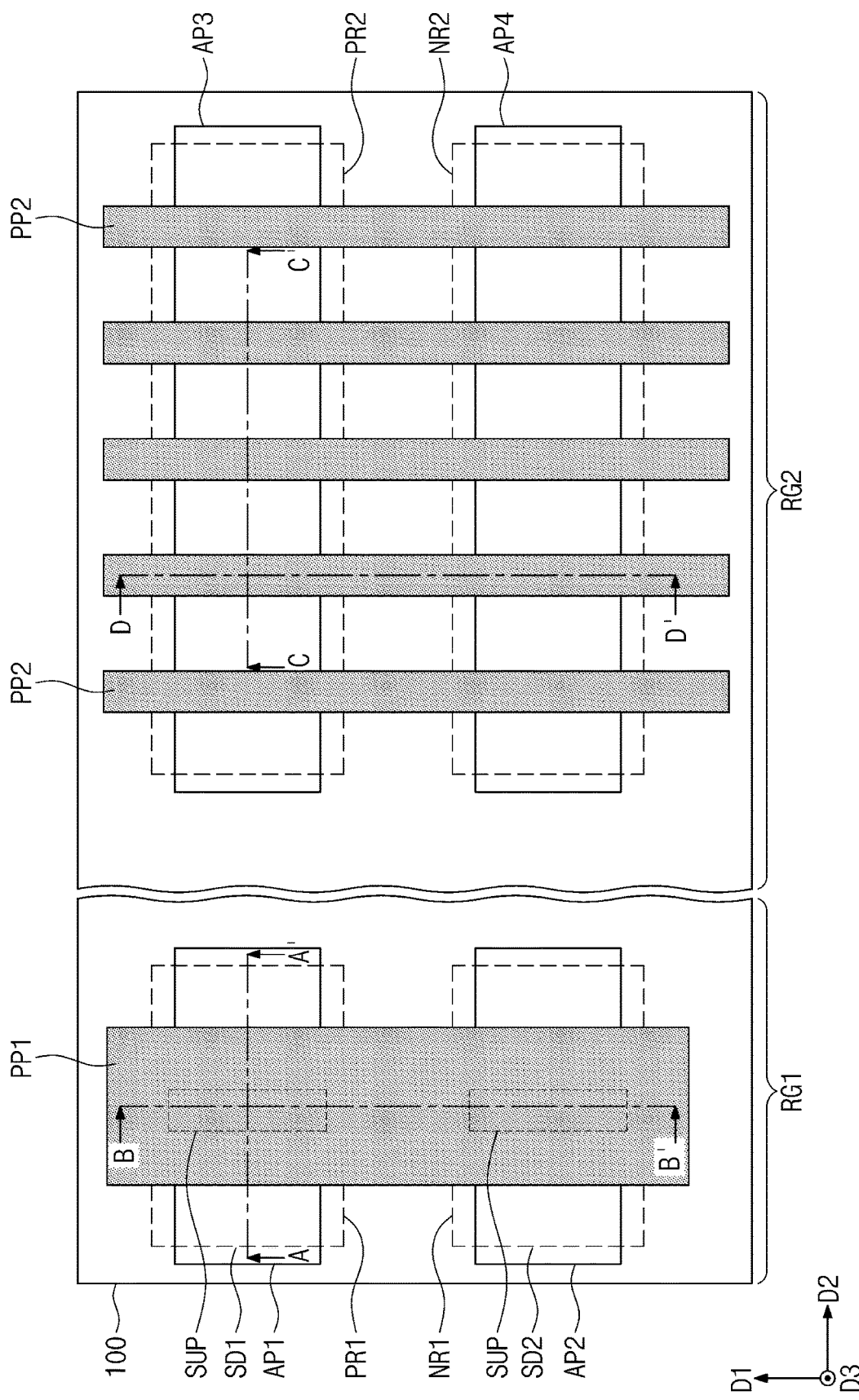
Figure 12A:
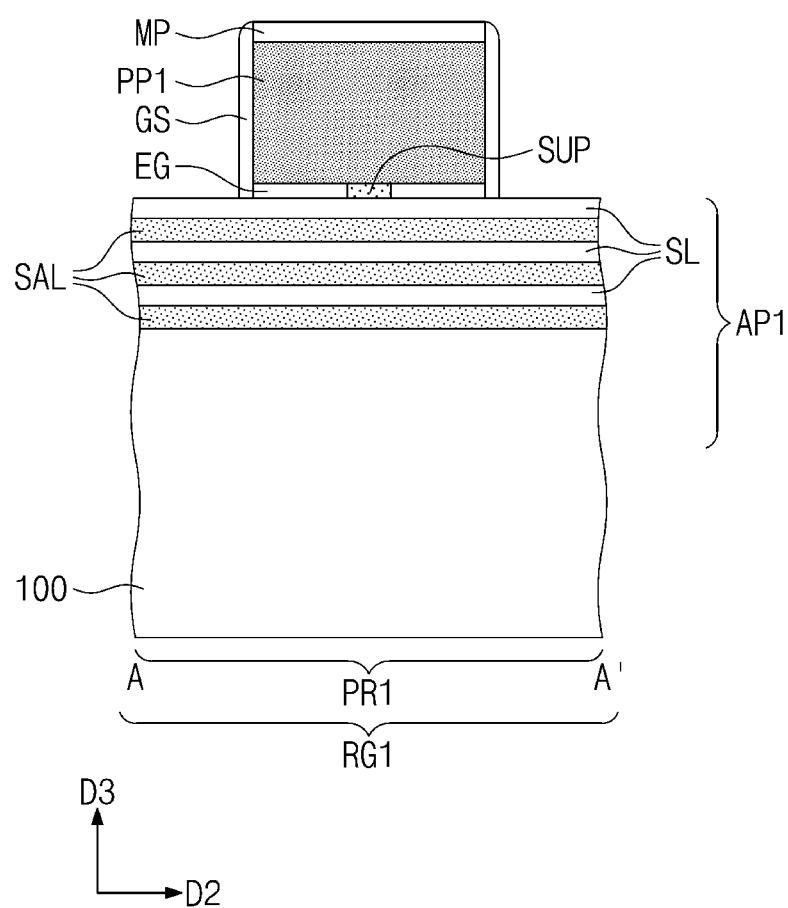
Figure 12B:
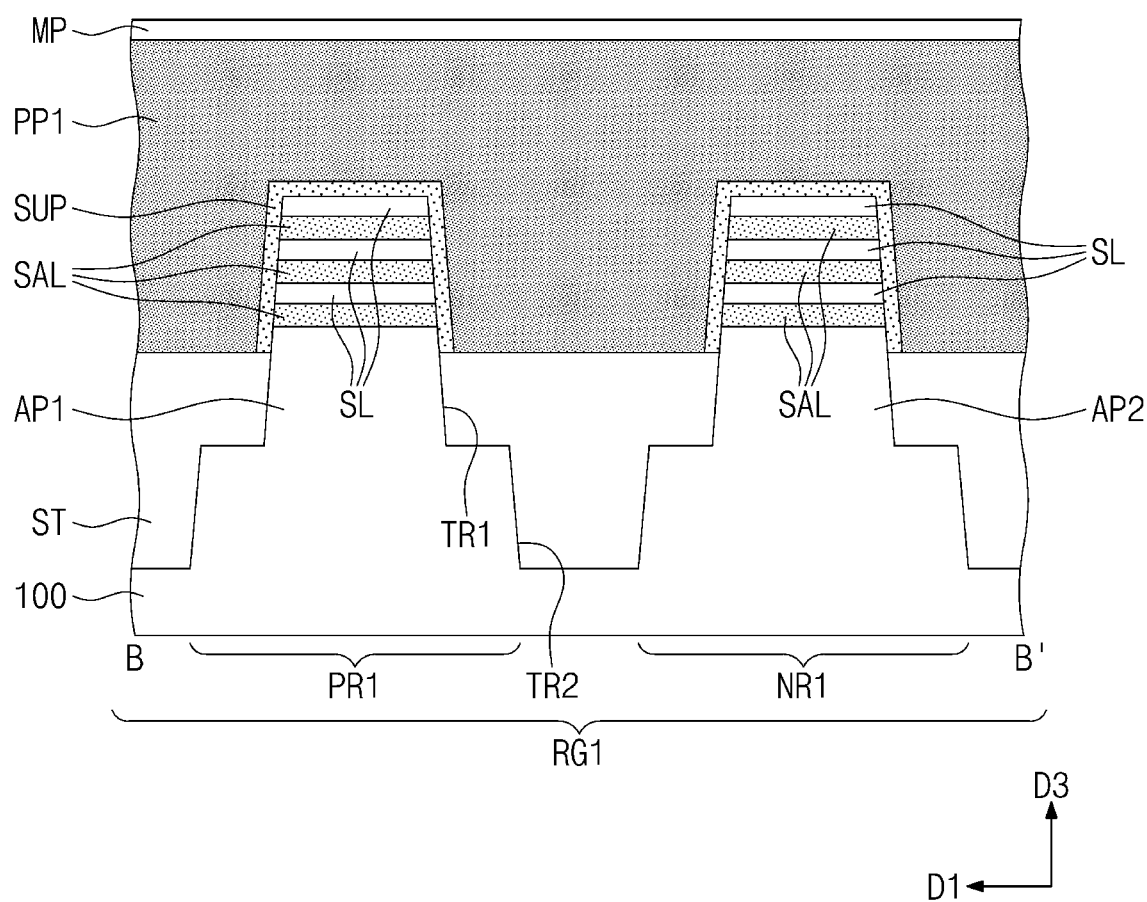
Figure 12C:
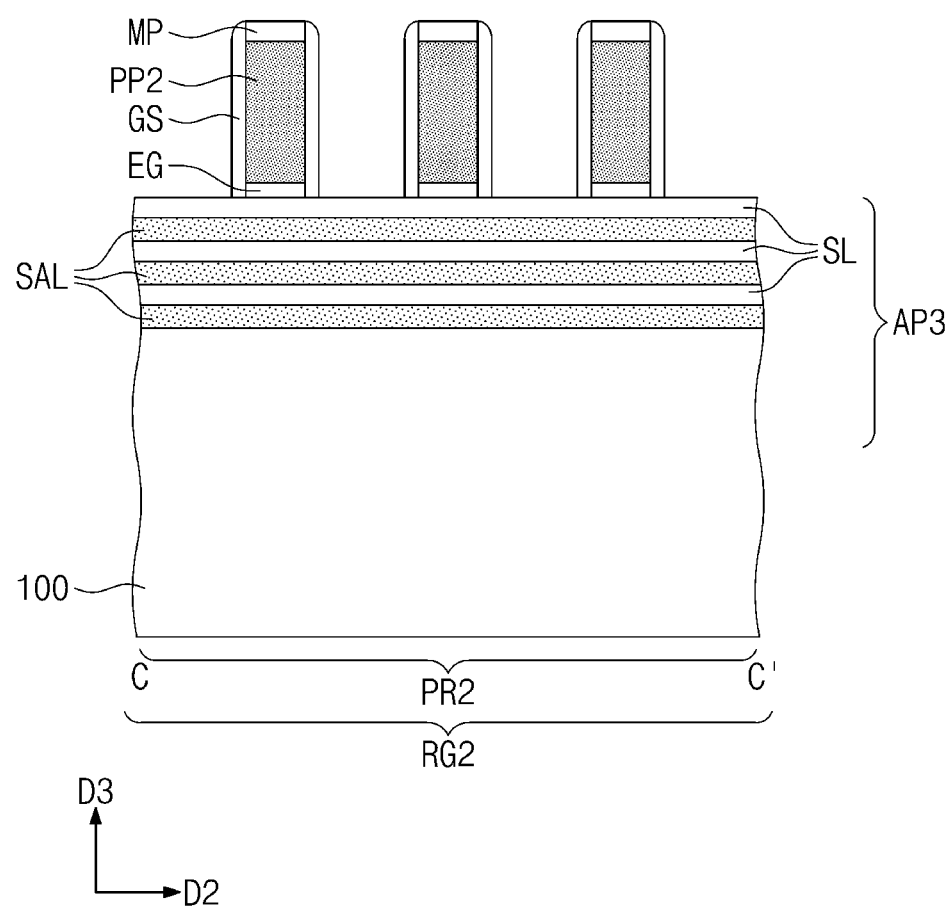
Figure 12D:
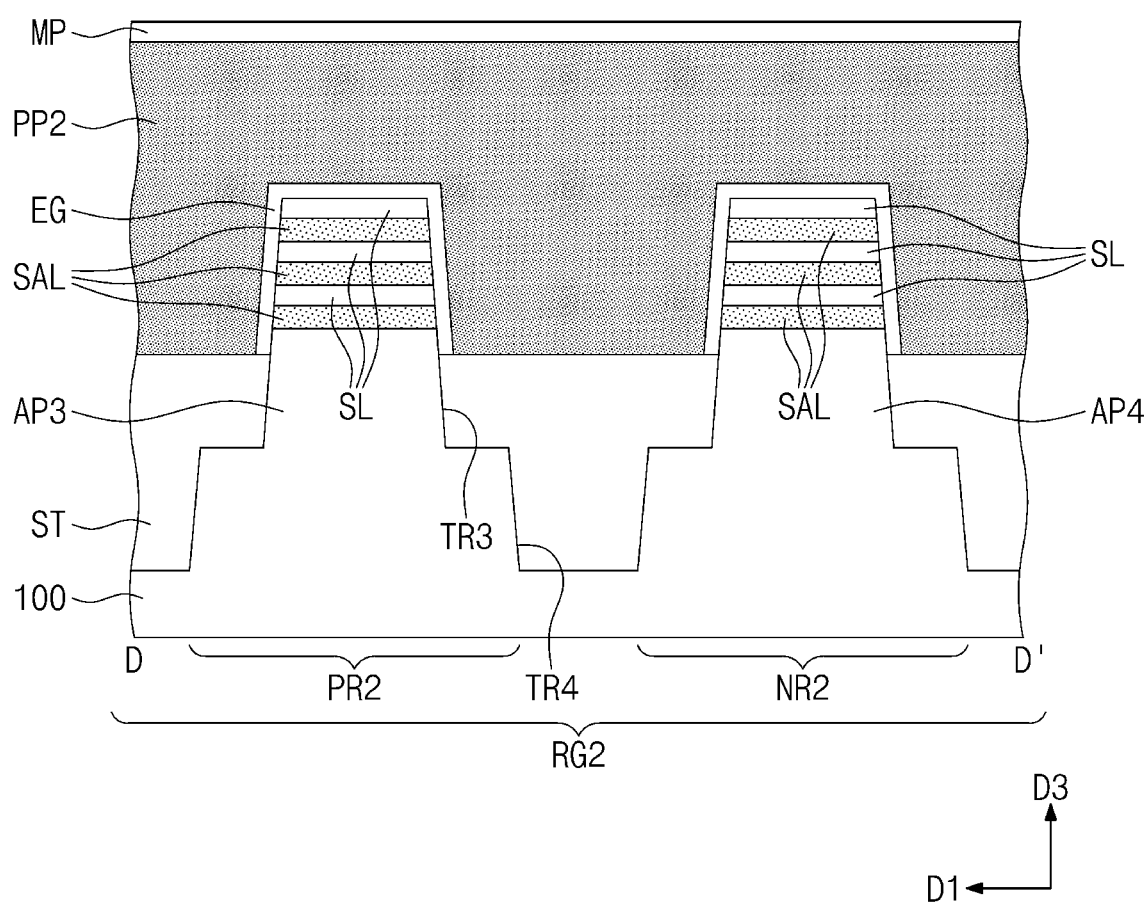
Figure 13:
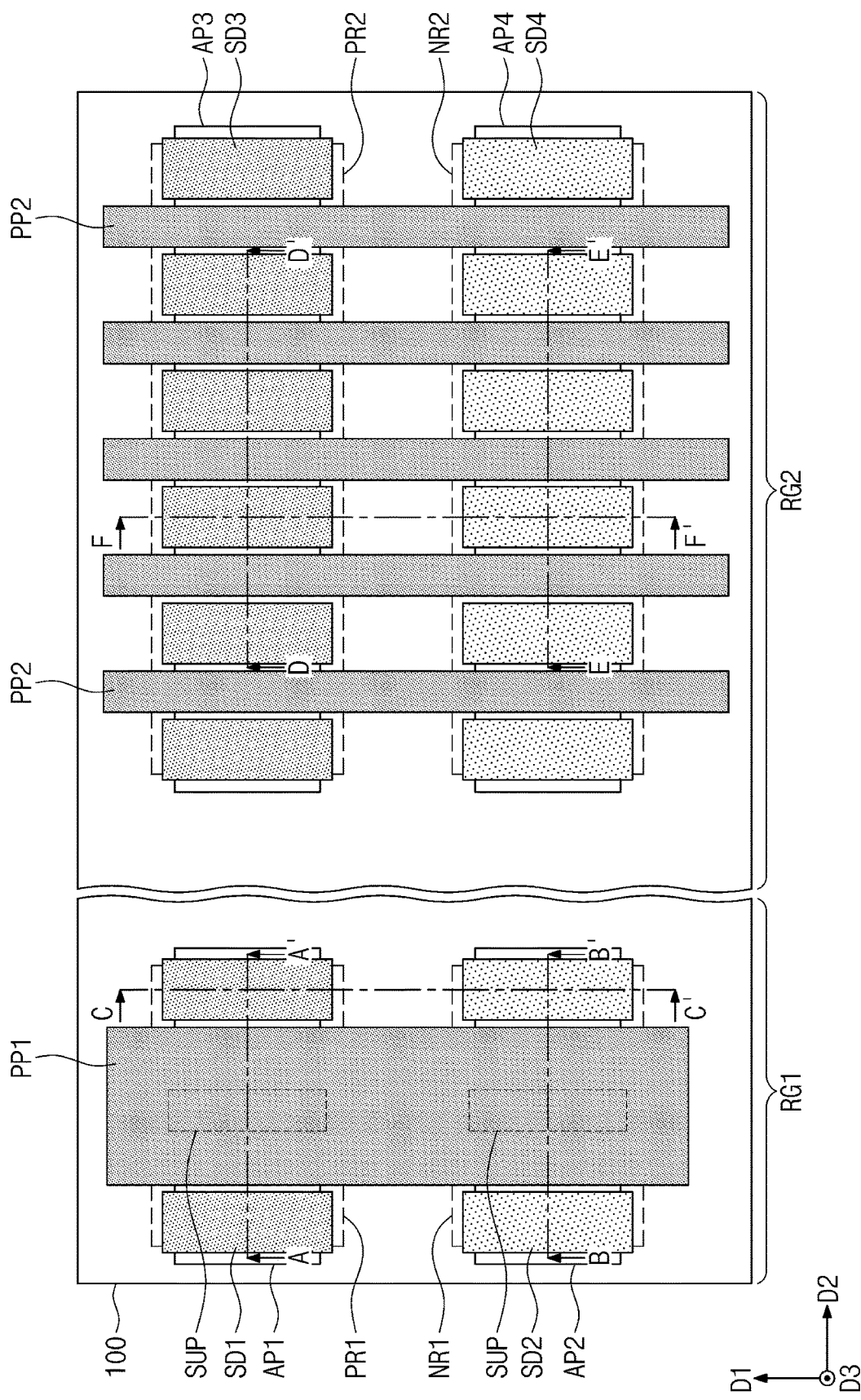

FIGS. 4A and 4B are sectional views, which are respectively taken along lines A-A' and B-B' of FIG. 1 to illustrate a semiconductor device according to an embodiment of the inventive concept. FIG. 4C is a perspective view illustrating the supporting patterns and the first to third semiconductor patterns of FIG. 4A. For concise description, an element previously described with reference to FIGS. 1 and 2A to 2F may be identified by the same reference number without repeating an overlapping description thereof.

Referring to FIGS. 4A, 4B, and 4C, a plurality of supporting patterns SUP may be provided. The supporting patterns SUP may be spaced apart from each other in the second direction D2. In the case where the lengths of the first to third semiconductor patterns SP1 to SP3 are increased, a method of increasing the number of the supporting pattern SUP may be used, rather than increasing the width of the supporting pattern SUP.

Figure 14A:
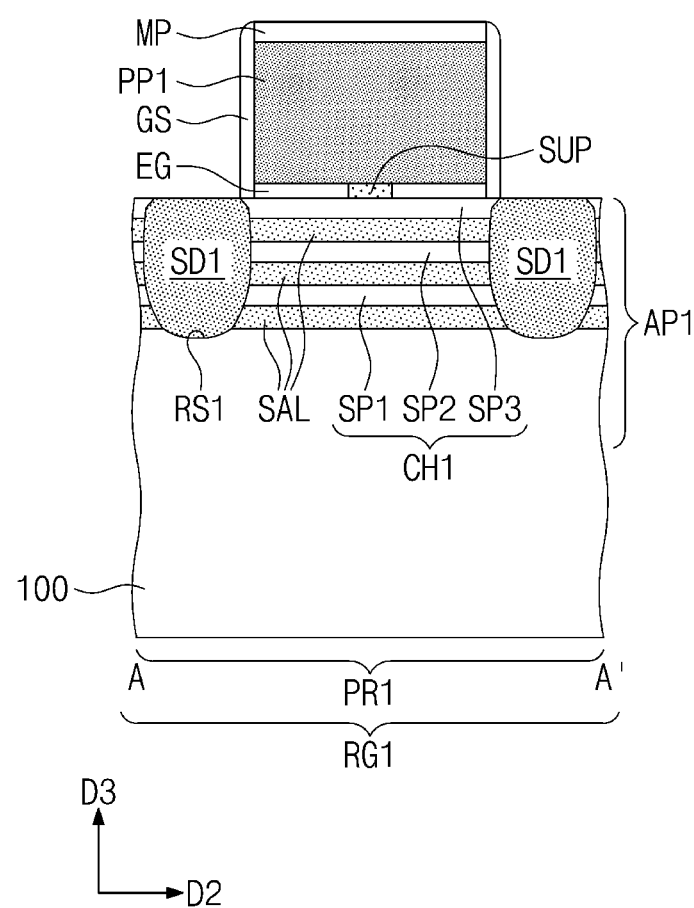
Figure 14B:
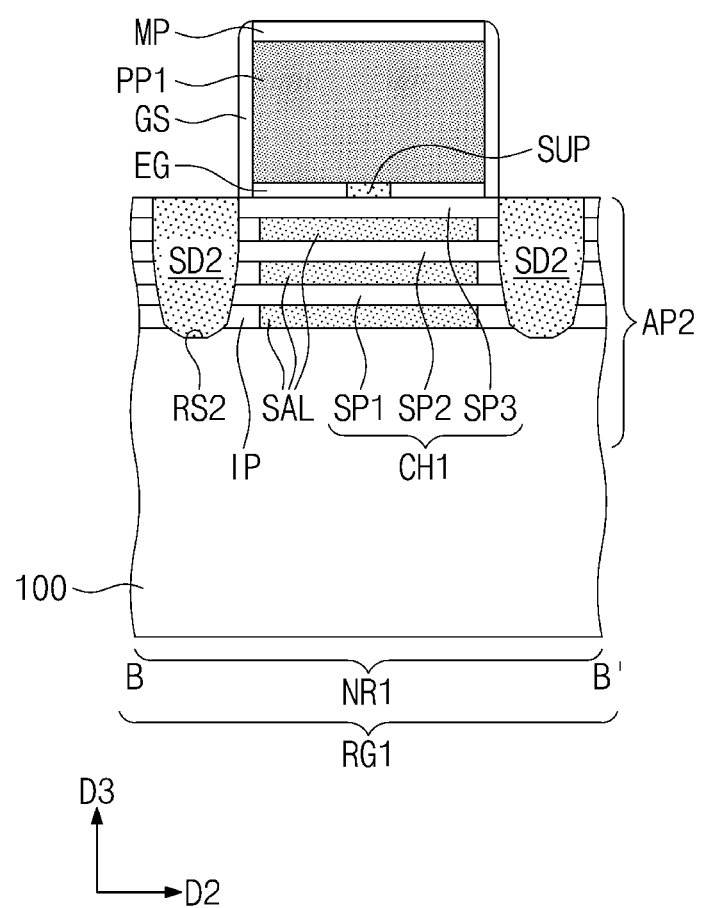
Figure 14C:
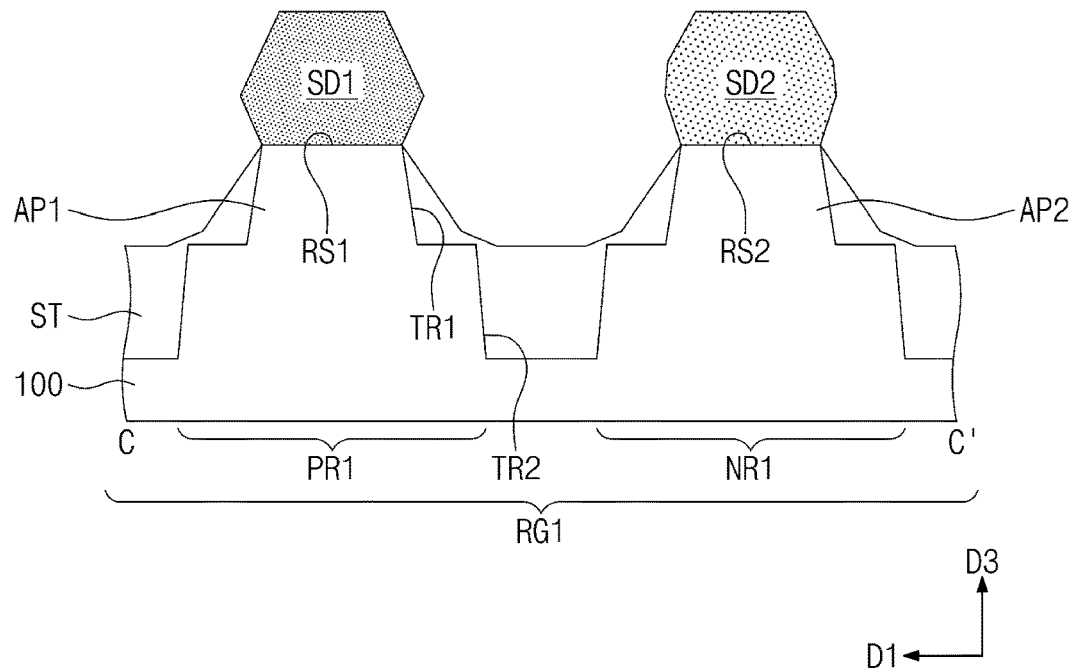
Figure 14D:
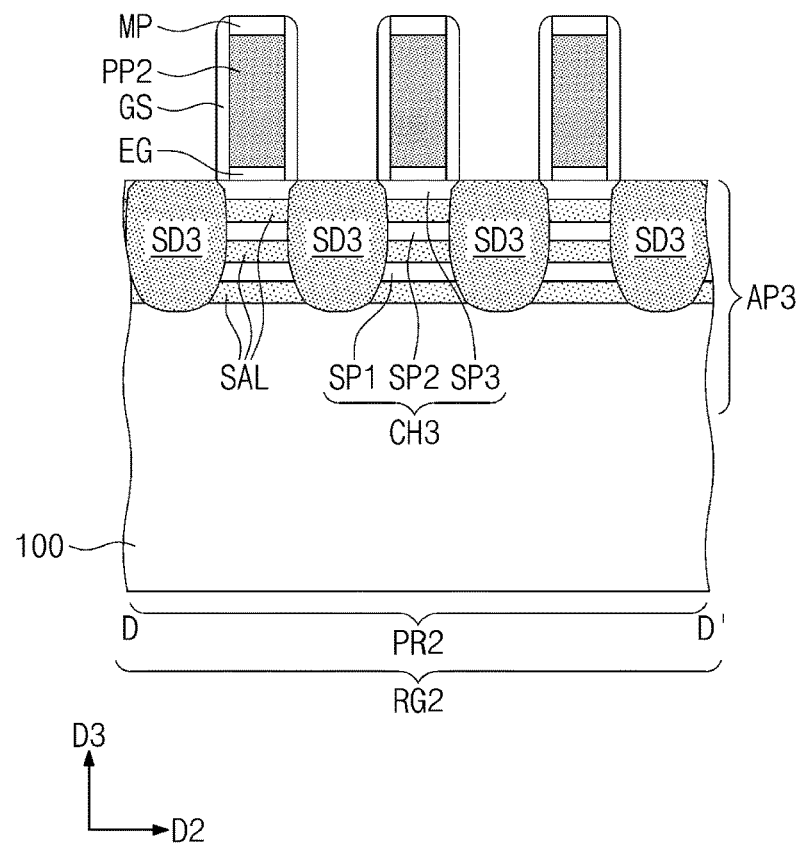
Figure 14E:
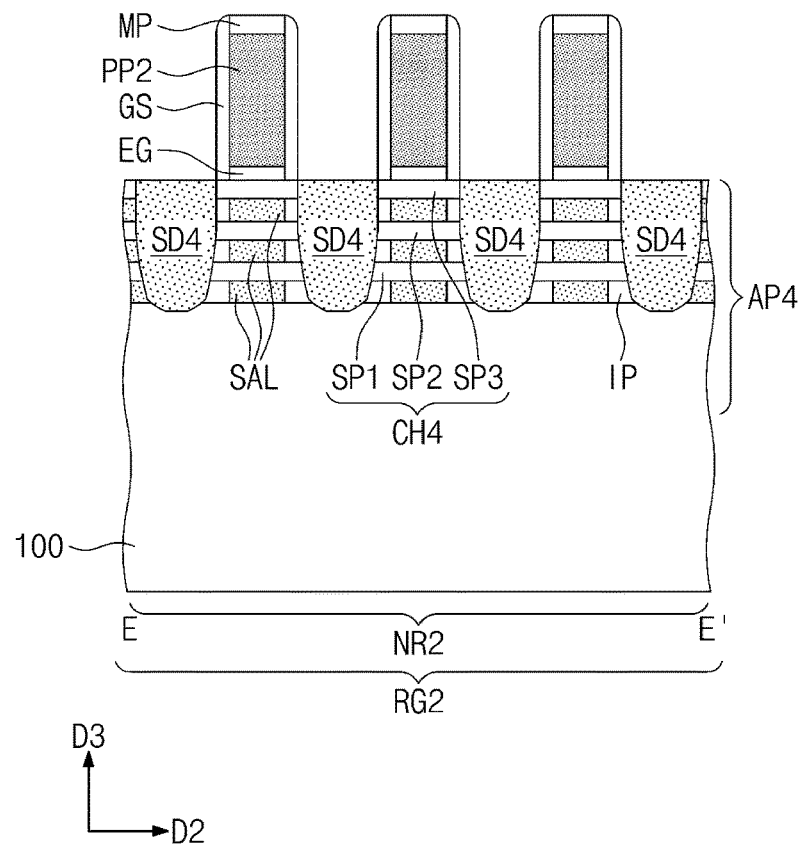
FIGS. 14E, 16E, and 18E are sectional views taken along lines E-E' of FIGS. 13, 15, and 17, respectively.
Figure 14F:
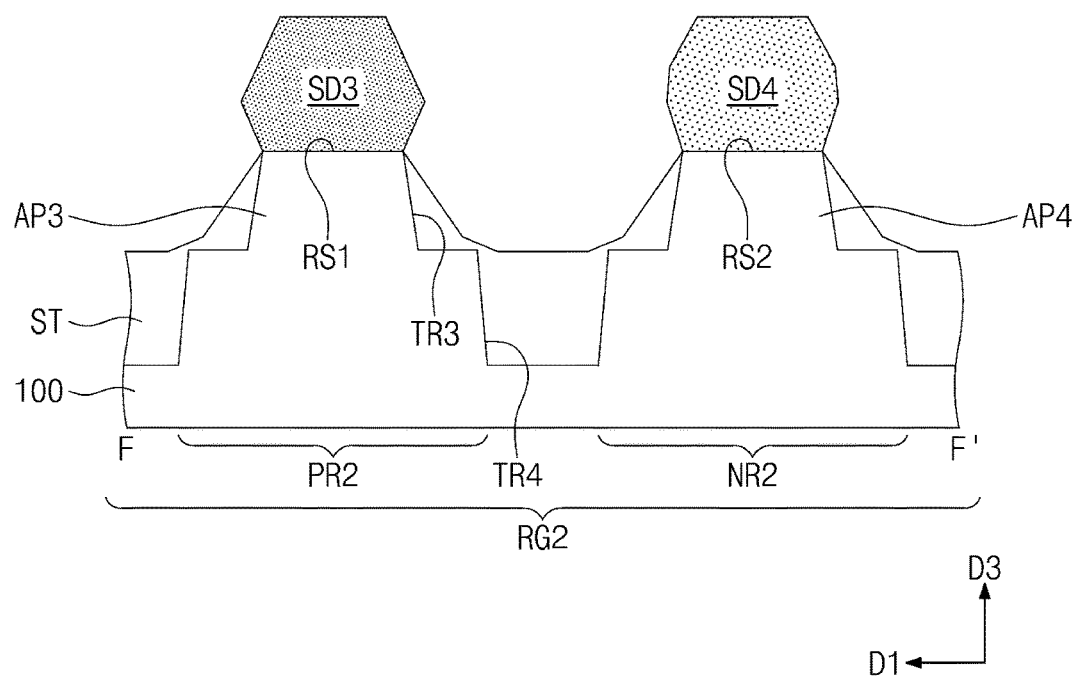
FIGS. 14F, 16F, and 18F are sectional views taken along lines F-F' of FIGS. 13, 15, and 17, respectively.
Figure 15:
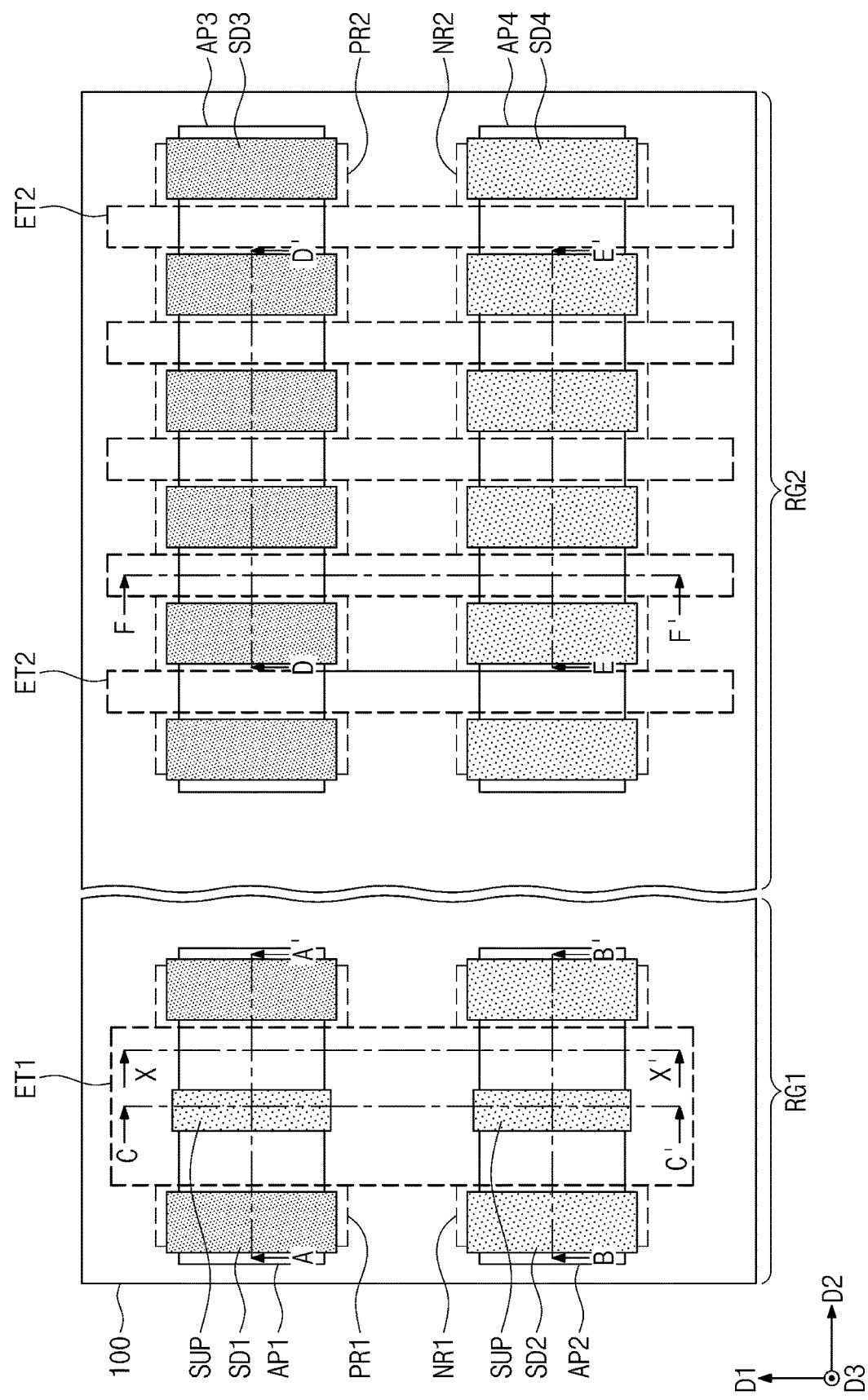
Figure 16A:
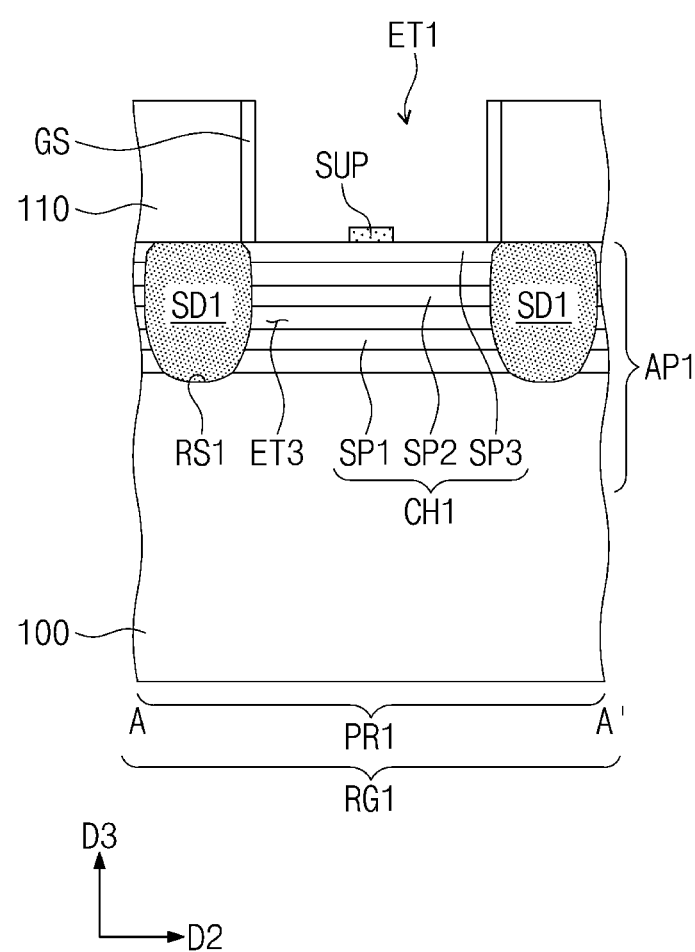
Figure 16B:
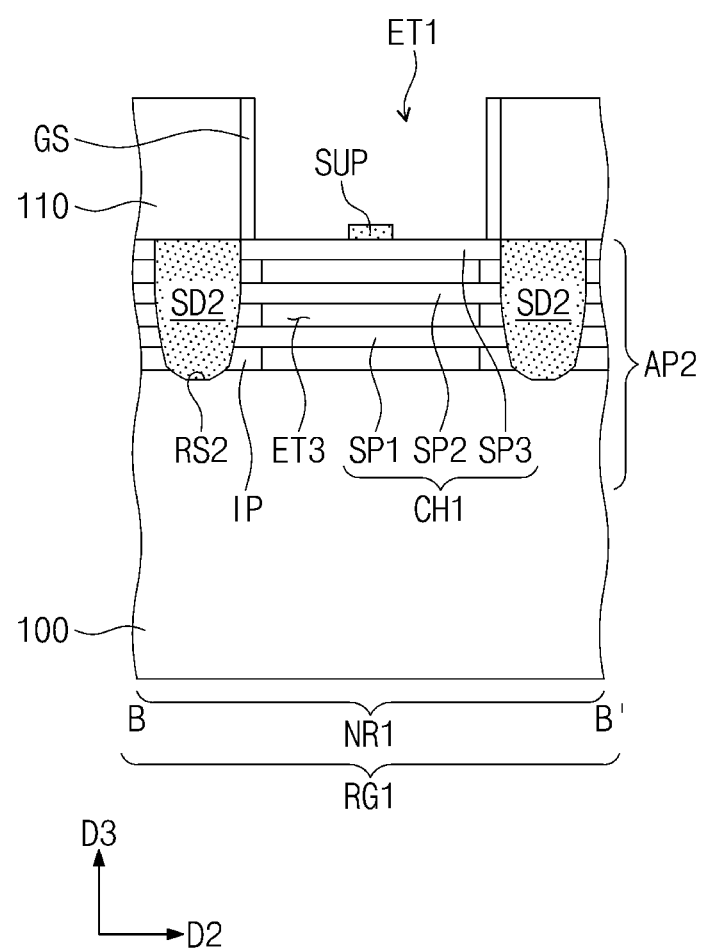
Figure 16C:
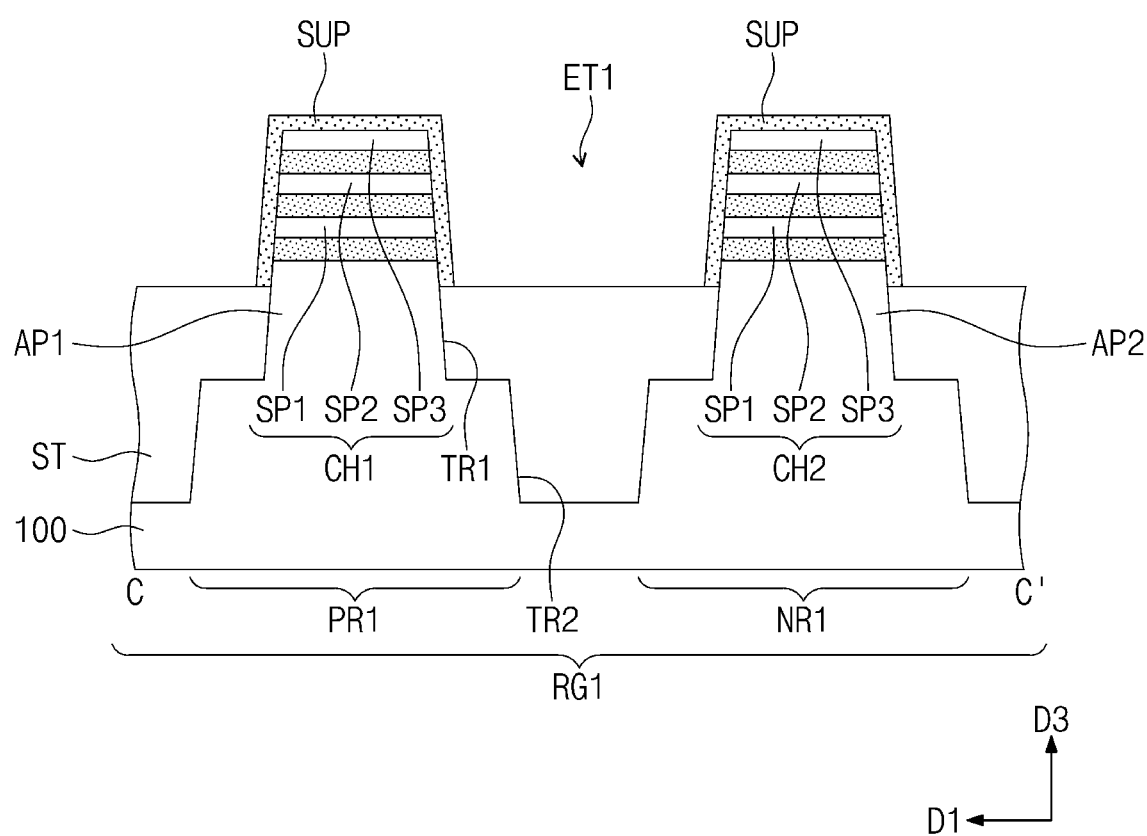
Figure 16D:
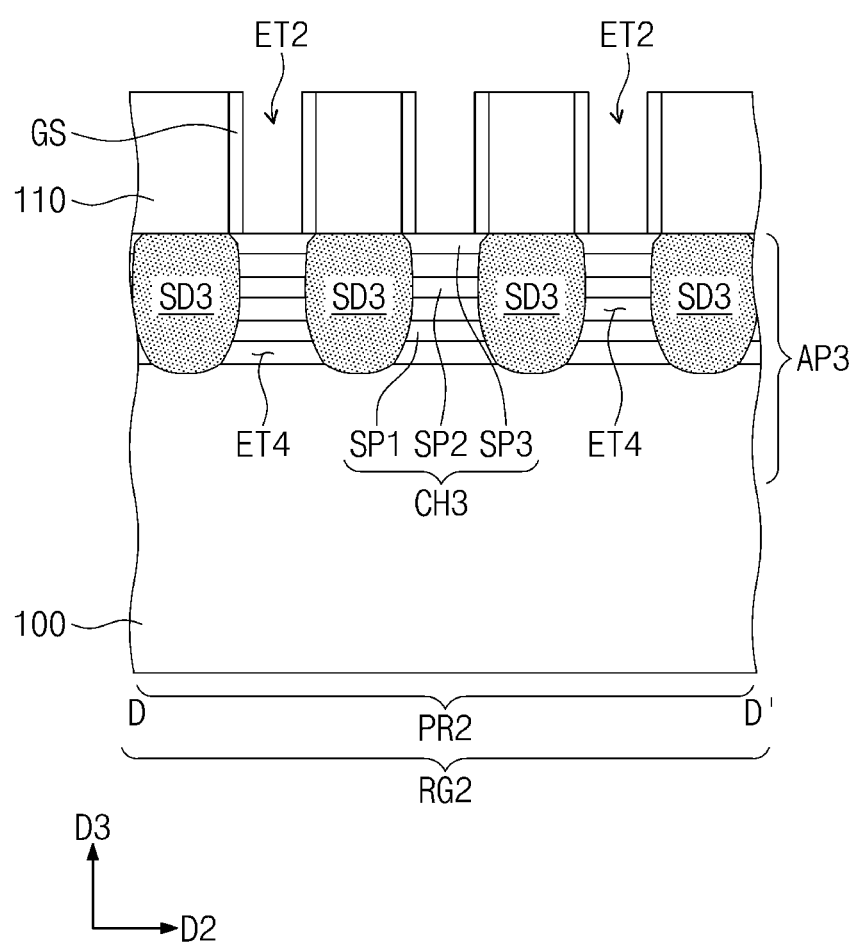
Figure 16E:
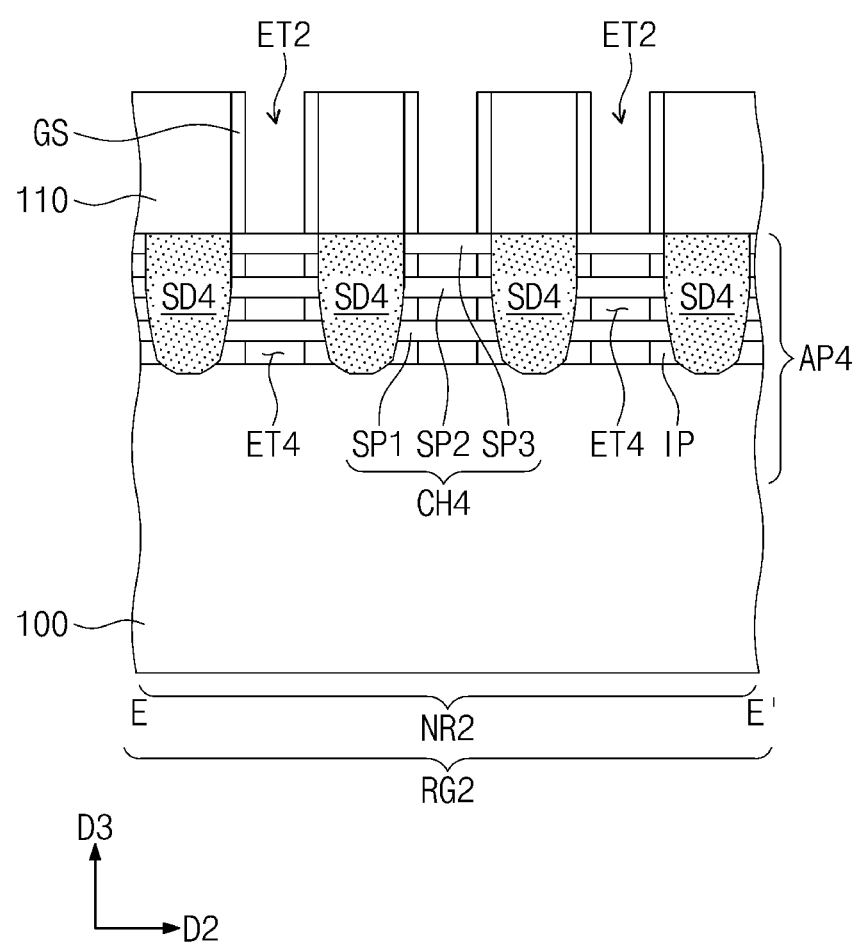
Figure 16F:
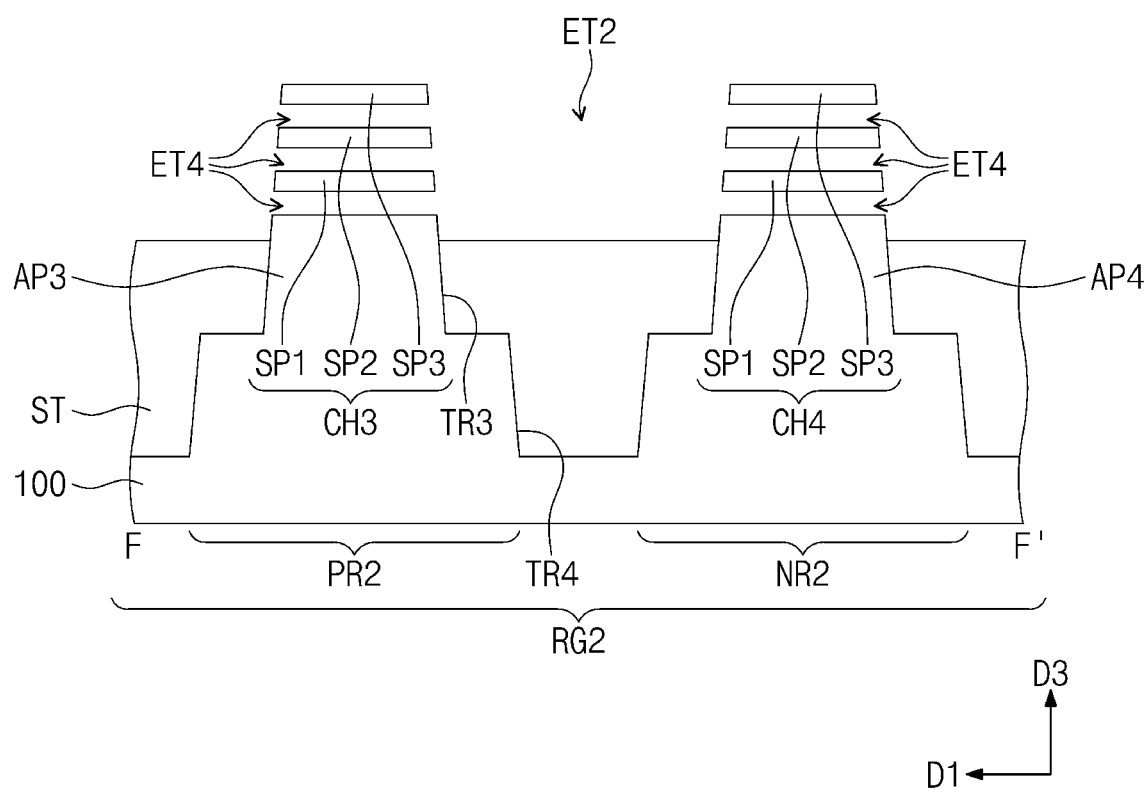

FIGS. 5, 7, 9, 11, 13, 15, and 17 are plan views illustrating a method of fabricating a semiconductor device according to an embodiment of the inventive concept. FIGS. 6A, 8A, 10A, 12A, 14A, 16A, and 18A are sectional views taken along lines A-A' of FIGS. 5, 7, 9, 11, 13, 15, and 17, respectively. FIGS. 6B, 8B, 10B, 12B, 14B, 16B, and 18B are sectional views taken along lines B-B' of FIGS. 5, 7, 9, 11, 13, 15, and 17, respectively. FIGS. 6C, 8C, 10C, 12C, 14C, 16C, and 18C are sectional views taken along lines C-C' of FIGS. 5, 7, 9, 11, 13, 15, and 17, respectively. FIGS. 6D, 8D, 10D, 12D, 14D, 16D, and 18D are sectional views taken along lines D-D' of FIGS. 5, 7, 9, 11, 13, 15, and 17, respectively. FIGS. 14E, 16E, and 18E are sectional views taken along lines E-E' of FIGS. 13, 15, and 17, respectively. FIGS. 14F, 16F, and 18F are sectional views taken along lines F-F' of FIGS. 13, 15, and 17, respectively.

Referring to FIGS. 5 and 6A to 6D, the substrate 100 including the first region RG1 and the second region RG2 may be provided. Semiconductor layers SL and sacrificial layers SAL may be alternately stacked on the substrate 100. The semiconductor layers SL may be formed of or may include one of silicon (Si), germanium (Ge), and silicon-germanium (SiGe), and the sacrificial layers SAL may be formed of or may include another one of silicon (Si), germanium (Ge), and silicon-germanium (SiGe). For example, the semiconductor layers SL may be formed of or may include silicon (Si), and the sacrificial layers SAL may be formed of or may include silicon-germanium (SiGe). A content of germanium (Ge) in the sacrificial layers SAL may range from 10 at % to 30 at %.

A first patterning process may be performed on the substrate 100 to form the first trench TR1 defining first to fourth active patterns AP1 to AP4. The semiconductor layers SL and the sacrificial layers SAL may be patterned during the first patterning process. For example, each of the first to fourth active patterns AP1 to AP4 may include the semiconductor layers SL and the sacrificial layers SAL, which are alternately stacked on the substrate 100.

A second patterning process may be performed on the substrate 100 to form the second trench TR2 defining the first PMOSFET region PR1, the first NMOSFET region NR1, the second PMOSFET region PR2, and the second NMOSFET region NR2. The second trench TR2 may be formed to be deeper than the first trench TR1. However, in an embodiment, the second patterning process to form the second trench TR2 may be omitted.

The first PMOSFET region PR1 and the first NMOSFET region NR1 may be disposed in the first region RG1. The first and second active patterns AP1 and AP2 may be formed on the first PMOSFET region PR1 and the first NMOSFET region NR1, respectively. The second PMOSFET region PR2 and the second NMOSFET region NR2 may be disposed in the second region RG2. The third and fourth active patterns AP3 and AP4 may be formed on the second PMOSFET region PR2 and the second NMOSFET region NR2, respectively.

The device isolation layer ST may be formed on the substrate 100 to fill the first and second trenches TR1 and TR2. The device isolation layer ST may be formed of or may include at least one of insulating materials (e.g., silicon oxide). The device isolation layer ST may be recessed to expose upper portions of the first to fourth active patterns AP1 to AP4. Thus, the upper portion of each of the first to fourth active patterns AP1 to AP4 may protrude vertically above the device isolation layer ST.

An insulating layer EG may be formed on the exposed upper portion of each of the first to fourth active patterns AP1 to AP4. The insulating layer EG may be formed by oxidizing the exposed surface of each of the first to fourth active patterns AP1 to AP4. For example, the insulating layer EG may include or may be formed of a silicon oxide layer.

Referring to FIGS. 7 and 8A to 8D, a mask layer PRM with an opening OPN may be formed on the substrate 100. First, the mask layer PRM may be formed to fully cover the second region RG2. Then, the mask layer PRM may be patterned to form the opening OPN exposing a portion of the first region RG1.

The opening OPN may be extended in the first direction D1. The opening OPN may be formed to expose a center region of each of the first and second active patterns AP1 and AP2. The opening OPN may define a position and size of the supporting pattern SUP, which will be formed on the first and second active patterns AP1 and AP2.

Referring to FIGS. 9 and 10A to 10D, the supporting pattern SUP may be formed on the exposed portions of the first and second active patterns AP1 and AP2. The supporting pattern SUP may be formed by a deposition process. A material constituting the supporting pattern SUP may be deposited on the first and second active patterns AP1 and AP2 through the opening OPN.

In an embodiment, the supporting pattern SUP may be formed by a selective epitaxial process, in which outer side surfaces of the semiconductor layers SL and the sacrificial layers SAL are used as a seed layer. For example, the selective epitaxial growth process may include a chemical vapor deposition (CVD) process or a molecular beam epitaxy (MBE) process. The supporting pattern SUP may be formed of or may include a material that is the same as the semiconductor layers SL but is different from the sacrificial layers SAL. The material of the supporting pattern SUP may be chosen to have etch selectivity with respect to the sacrificial layers SAL. In an embodiment, the supporting pattern SUP may be formed of or may include silicon. The supporting pattern SUP may be formed to have no observable interface on the semiconductor layers SL, but there may be an observable interface between the supporting pattern SUP and the sacrificial layers SAL, because the sacrificial layers SAL are formed of a different material from the supporting pattern SUP. For example, the supporting pattern SUP and the sacrificial layers SAL may form a heterostructure.

In an embodiment, the supporting pattern SUP may be formed on the semiconductor layers SL and the sacrificial layers SAL by an atomic layer deposition (ALD) method, and in this case, the supporting pattern SUP may have an amorphous structure.

Referring to FIGS. 11 and 12A to 12D, first sacrificial pattern PP1 may be formed on the first region RG1 to cross the first and second active patterns AP1 and AP2. Second sacrificial patterns PP2 may be formed on the second region RG2 to cross the third and fourth active patterns AP3 and AP4. Each of the first and second sacrificial patterns PP1 and PP2 may be a line- or bar-shaped pattern extending in the first direction D1. The first sacrificial pattern PP1 may be formed to have a width that is larger than a width of the second sacrificial pattern PP2. The first sacrificial pattern PP1 may be formed to be vertically overlapped with the supporting patterns SUP.

For example, the formation of the first and second sacrificial patterns PP1 and PP2 may include forming a sacrificial film on the substrate 100, forming hard mask patterns MP on the sacrificial film, and patterning the sacrificial film using the hard mask patterns MP as an etch mask. The sacrificial film may be formed of or may include polysilicon.

In an embodiment, the patterning process to form the first and second sacrificial patterns PP1 and PP2 may include a lithography process using an extreme ultraviolet (EUV) light. In the present specification, the EUV light may have a wavelength ranging from 4 nm to 124 nm and, in particular, from 4 nm to 20 nm and may be, for example, an ultraviolet light having a wavelength of 13.5 nm. The EUV light may have an energy of 6.21 eV to 124 eV, and, in particular, from 90 eV to 95 eV.

The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound which may be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the inventive concept is not limited to these examples.

The hard mask patterns MP may be formed by patterning at least one mask layer, which is disposed below the photoresist patterns, using the photoresist patterns as an etch mask. Thereafter, desired patterns (i.e., the first and second sacrificial patterns PP1 and PP2) may be formed on a wafer by patterning a target layer (i.e., the sacrificial film) using the hard mask patterns MP as an etch mask.

In a comparative example of the inventive concept, a multi-patterning technology (MPT) using two or more photomasks is required to form fine-pitch patterns on the wafer. By contrast, in the case where the EUV lithography process according to an embodiment of the inventive concept is performed, the first and second sacrificial patterns PP1 and PP2 may be formed to have a fine pitch, using just one photomask.

For example, the minimum pitch between the first and second sacrificial patterns PP1 and PP2, which are realized by the EUV lithography process according to the present embodiment, may be less than or equal to 45 nm. For example, since the EUV lithography process is performed to form the first and second sacrificial patterns PP1 and PP2, the first and second sacrificial patterns PP1 and PP2 may be precisely and finely formed, without a multi-patterning technology.

In an embodiment, the EUV lithography process may be used in the patterning process for forming not only the first and second sacrificial patterns PP1 and PP2 but also the first to fourth active patterns AP1 to AP4 described above, but the inventive concept is not limited to this example.

According to an embodiment of the inventive concept, the EUV lithography process may also be used to form the opening OPN of the mask layer PRM.

A pair of the gate spacers GS may be respectively formed on opposite side surfaces of each of the first and second sacrificial patterns PP1 and PP2. The formation of the gate spacers GS may include conformally forming a gate spacer layer on the substrate 100 and anisotropically etching the gate spacer layer. The gate spacer layer may be formed of or may include at least one of SiCN, SiCON, or SiN. Alternatively, the gate spacer layer may be a multi-layered structure including at least two of SiCN, SiCON, or SiN.

Referring to FIGS. 13 and 14A to 14F, first to fourth source/drain patterns SD1 to SD4 may be formed on the first to fourth active patterns AP1 to AP4, respectively. For example, the first source/drain patterns SD1 may be formed in an upper portion of the first active pattern AP1. A pair of the first source/drain patterns SD1 may be respectively formed at opposite sides of the first sacrificial pattern PP1. For example, first recess regions RS1 may be formed by etching the upper portion of the first active pattern AP1 using the hard mask patterns MP and the gate spacers GS as an etch mask. The device isolation layer ST between the first active patterns AP1 may be partially recessed during the etching of the upper portion of the first active pattern AP1 (e.g., see FIG. 14C).

The first source/drain pattern SD1 may be formed by performing a selective epitaxial growth process using an inner surface of the first recess region RS1 of the first active pattern AP1 as a seed layer. As a result of the formation of the first source/drain patterns SD1, the first channel pattern CH1 including the first to third semiconductor patterns SP1, SP2, and SP3 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include or may be formed of a semiconductor material (e.g., SiGe) having a lattice constant greater than that of the substrate 100. Each of the first source/drain patterns SD1 may be a multi-layered structure including a plurality of semiconductor layers.

As an example, the first source/drain patterns SD1 may be doped in situ during the selective epitaxial growth process. In an embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be respectively formed at opposite sides of the first sacrificial pattern PP1. As a result of the formation of the second source/drain patterns SD2, the second channel pattern CH2 including the first to third semiconductor patterns SP1, SP2, and SP3 may be defined between the pair of second source/drain patterns SD2.

Second recess regions RS2 may be formed by etching the upper portion of the second active pattern AP2 using the hard mask patterns MP and the gate spacers GS as an etch mask. Thereafter, the second source/drain pattern SD2 may be formed in the second recess region RS2 by performing a selective epitaxial growth process, in which an inner surface of the second recess region RS2 is used as a seed layer. In an embodiment, the second source/drain patterns SD2 may be formed of or may include the same semiconductor material (e.g., Si) as the substrate 100. The second source/drain patterns SD2 may be doped to have a second conductivity type (e.g., n-type). Before the forming of the second source/drain patterns SD2, the sacrificial layers SAL exposed through the second recess region RS2 may be partially removed. The inner spacer IP may be formed by filling a region, which is formed by partially removing the sacrificial layers SAL, with an insulating material.

The third source/drain patterns SD3 may be formed in an upper portion of the third active pattern AP3, and the process of forming the third source/drain patterns SD3 may be substantially the same as the afore-described process of forming the first source/drain patterns SD1. In an embodiment, the first source/drain patterns SD1 and the third source/drain patterns SD3 may be formed at the same time. As a result of the formation of the third source/drain patterns SD3, the third channel pattern CH3 including the first to third semiconductor patterns SP1, SP2, and SP3 may be defined between a pair of the third source/drain patterns SD3.

The fourth source/drain patterns SD4 may be formed in an upper portion of the fourth active pattern AP4, and the process of forming the fourth source/drain patterns SD4 may be substantially the same as the afore-described process of forming the second source/drain patterns SD2. In an embodiment, the second source/drain patterns SD2 and the fourth source/drain patterns SD4 may be formed at the same time. As a result of the formation of the fourth source/drain patterns SD4, the fourth channel pattern CH4 including the first to third semiconductor patterns SP1, SP2, and SP3 may be defined between a pair of the fourth source/drain patterns SD4. The inner spacer IP may be formed, before the forming of the fourth source/drain patterns SD4.

Referring to FIGS. 15 and 16A to 16F, the first interlayer insulating layer 110 may be formed to cover the first to fourth source/drain patterns SD1 to SD4, the hard mask patterns MP, and the gate spacers GS. In an embodiment, the first interlayer insulating layer 110 may be formed of or may include silicon oxide. A section taken along line X-X' of FIG. 15 may have the same or similar shape as the section taken along the line F-F' of FIG. 15 (e.g., that in FIG. 16F).

The first interlayered insulating layer 110 may be planarized, and top surfaces of the first and second sacrificial patterns PP1 and PP2 may be exposed. The planarization of the first interlayered insulating layer 110 may be performed using an etch-back or chemical mechanical polishing (CMP) process. During the planarization process, all of the hard mask patterns MP may be removed. As a result, the first interlayered insulating layer 110 may have a top surface that is substantially coplanar with the top surfaces of the first and second sacrificial patterns PP1 and PP2 and the top surfaces of the gate spacers GS.

The first and second sacrificial patterns PP1 and PP2 may be selectively removed. As a result of the removal of the first sacrificial pattern PP1, a first empty space ET1 may be formed to expose the first and second active patterns AP1 and AP2 (e.g., see FIG. 16C). As a result of the removal of the second sacrificial patterns PP2, second empty spaces ET2 may be formed to expose the third and fourth active patterns AP3 and AP4 (e.g., see FIG. 16F).

The sacrificial layers SAL, which are disposed on the first region RG1 and are exposed through the first empty space ET1, may be selectively removed. For example, referring to FIG. 16A, the sacrificial layers SAL, which are exposed through the first empty space ET1, may be selectively removed by an etching process. The first to third semiconductor patterns SP1, SP2, and SP3 are not removed by this etching process. Meanwhile, since, as described above, the supporting pattern SUP has etch selectivity with respect to the sacrificial layer SAL, the supporting patterns SUP are not removed and may remain after the etching process of the sacrificial layers SAL.

As a result of the removal of the sacrificial layers SAL, third empty spaces ET3 may be formed. For example, the third empty spaces ET3 may be respectively formed between adjacent ones of the semiconductor patterns SP1, SP2, and SP3.

The formation of the third empty spaces ET3 may lead to an increase in structural instability of the first to third semiconductor patterns SP1, SP2, and SP3 on the first region RG1. If the supporting patterns SUP are omitted, at least one of the first to third semiconductor patterns SP1, SP2, and SP3 may be bent. By contrast, according to an embodiment of the inventive concept, due to the presence of the supporting patterns SUP, the first to third semiconductor patterns SP1, SP2, and SP3 may be stably fixed without a contact issue therebetween. For example, it may be possible to prevent the first to third semiconductor patterns SP1, SP2, and SP3 on the first region RG1 from being bent.

The sacrificial layers SAL, which are disposed on the second region RG2 and are exposed through the second empty space ET2, may be selectively removed. For example, referring to FIG. 16F, the sacrificial layers SAL, which are exposed through the second empty space ET2, may be selectively removed by an etching process. The first to third semiconductor patterns SP1, SP2, and SP3 are not removed by this etching process. As a result of the removal of the sacrificial layers SAL, fourth empty spaces ET4 may be formed. For example, the fourth empty spaces ET4 may be respectively formed between adjacent ones of the semiconductor patterns SP1, SP2, and SP3.

Referring to FIGS. 17 and 18A to 18F, the first and second gate insulating layers GI1 and GI2 may be formed in the first and second empty spaces ET1 and ET2, respectively. The first gate insulating layer GI1 may be formed in the third empty space ET3 to enclose each of the first to third semiconductor patterns SP1, SP2, and SP3. The second gate insulating layer GI2 may be formed in the fourth empty space ET4 to enclose each of the first to third semiconductor patterns SP1, SP2, and SP3.

The first and second gate electrodes GE1 and GE2 may be formed in the first and second empty spaces ET1 and ET2, respectively. The first gate electrode GE1 may include the first to third portions PO1, PO2, and PO3 filling the third empty space ET3 and the fourth portion PO4 filling the first empty space ET1. The second gate electrode GE2 may include the first to third portions PO1, PO2, and PO3 filling the fourth empty space ET4 and the fourth portion PO4 filling the second empty space ET2. The gate capping pattern GP may be formed on each of the first and second gate electrodes GE1 and GE2.

Figure 17:
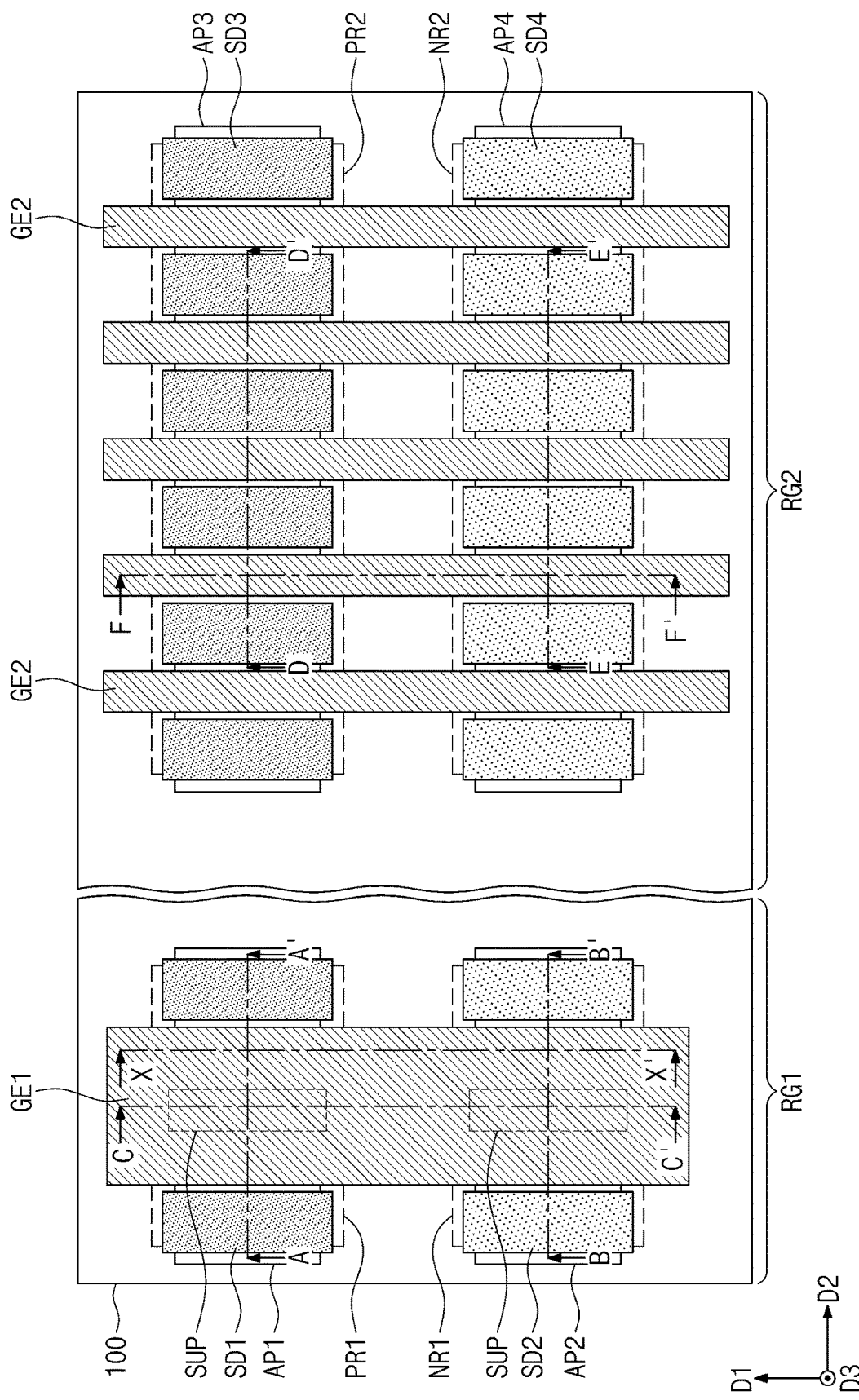
Figure 18A:
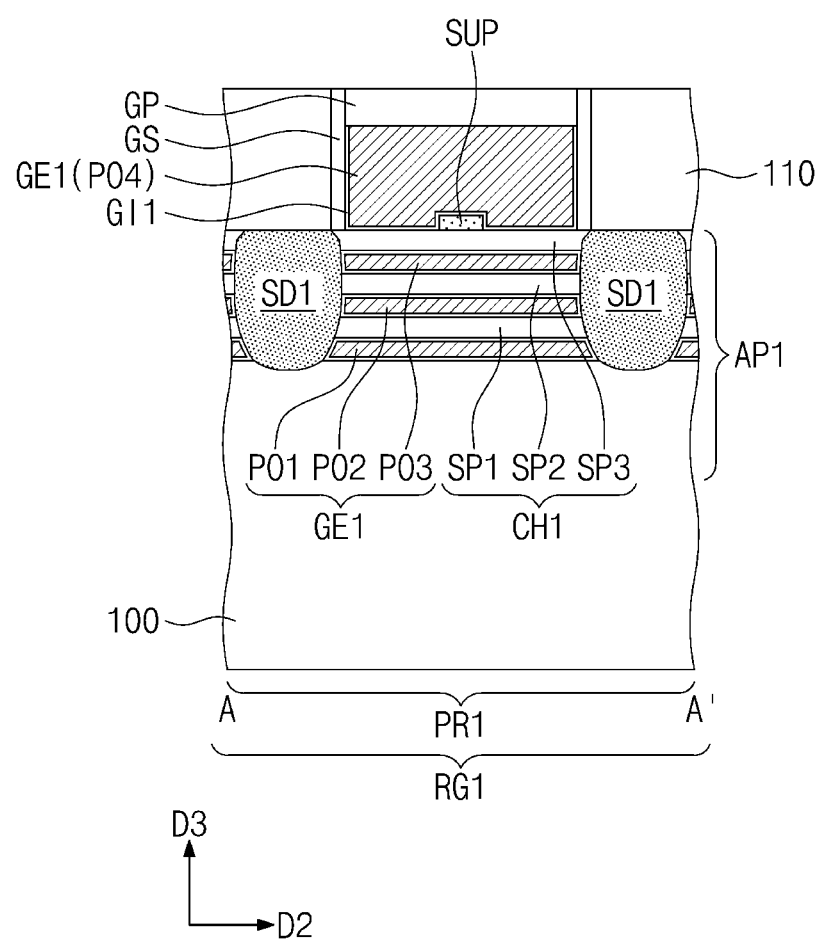
Figure 18B:
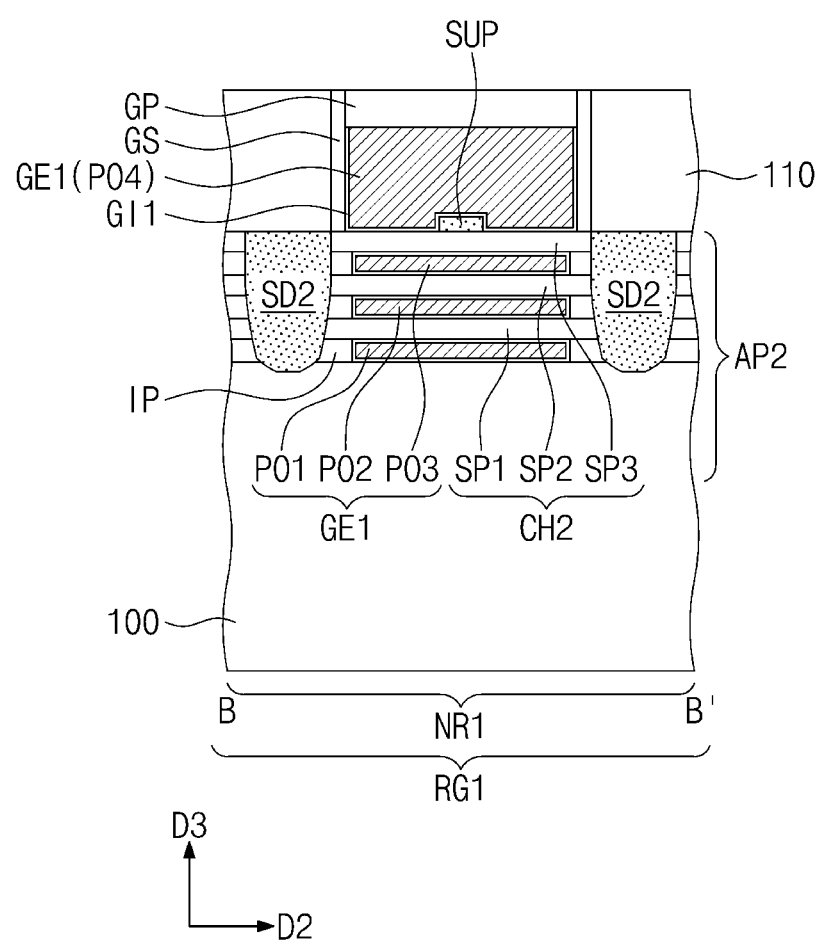
Figure 18C:
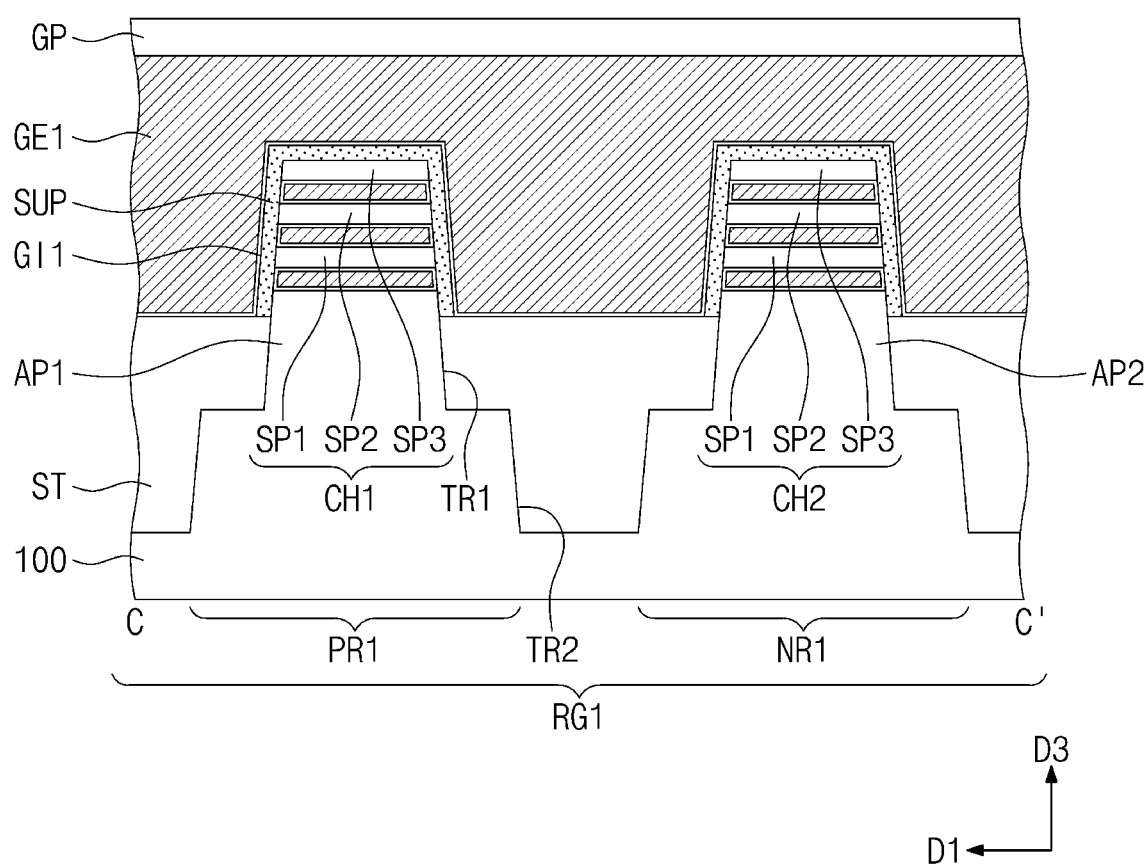
Figure 18D:
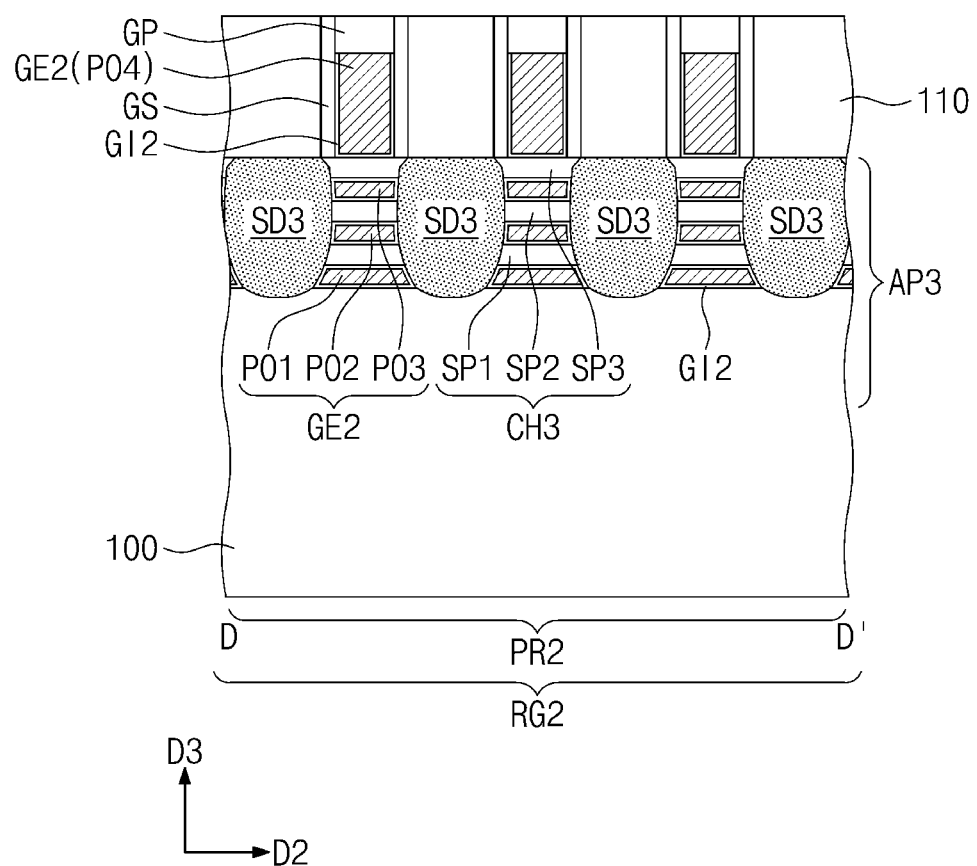
Figure 18E:
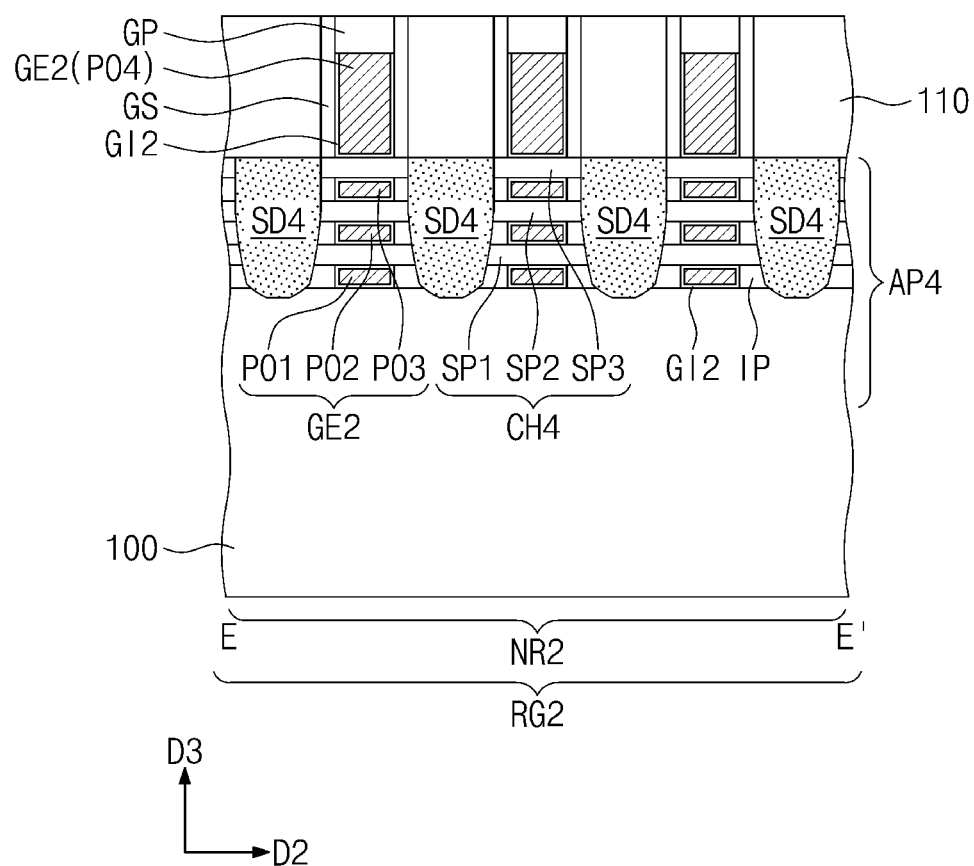
Figure 18F:
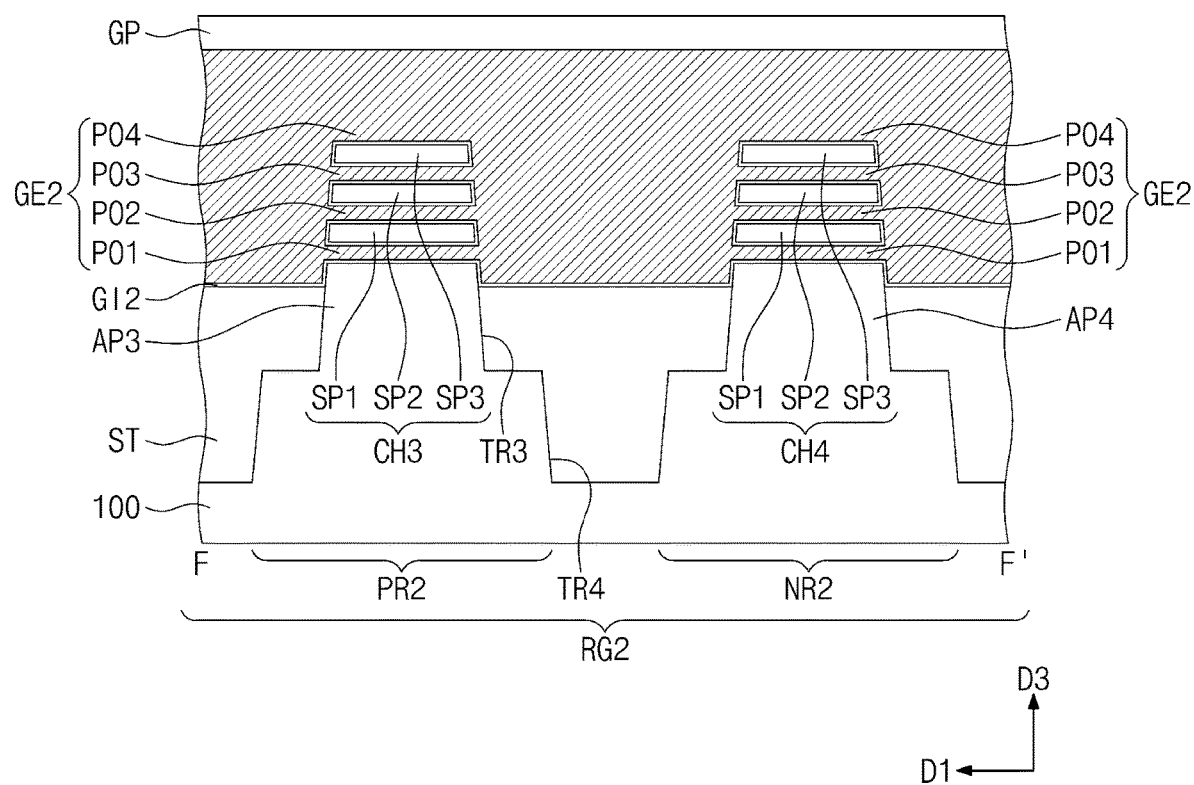

A section taken along line X-X' of FIG. 17 may have the same or similar shape as the section taken along the line F-F' of FIG. 17 (e.g., that in FIG. 18F).

Referring to FIGS. 1 and 2A to 2H, the second interlayer insulating layer 120 may be formed on the first interlayer insulating layer 110. The second interlayer insulating layer 120 may include or may be formed of a silicon oxide layer. The active contacts AC may be formed to penetrate the second interlayer insulating layer 120 and the first interlayer insulating layer 110 and to be electrically connected to the first to fourth source/drain patterns SD1, SD2, SD3, and SD4. The gate contacts GC may be formed to penetrate the second interlayer insulating layer 120 and the gate capping pattern GP and to be electrically connected to the first and second gate electrodes GE1 and GE2.

The third interlayer insulating layer 130 may be formed on the second interlayer insulating layer 120. The first metal layer M1 may be formed in the third interlayer insulating layer 130. The formation of the first metal layer M1 may include forming the first interconnection lines IL1. The fourth interlayer insulating layer 140 may be formed on the first metal layer M1. The second metal layer M2 may be formed in the fourth interlayer insulating layer 140. The formation of the second metal layer M2 may include forming the second interconnection lines IL2.

According to an embodiment of the inventive concept, the formation of the interconnection lines IL1 and/or IL2 in the first metal layer M1 and/or the second metal layer M2 may include performing an EUV lithography process. The EUV lithography process, for the process of forming the interconnection line (i.e., the back end of line (BEOL) process), may be performed in substantially the same manner as the afore-described method of forming the first and second sacrificial patterns PP1 and PP2. For example, in the case where the first interconnection lines IL1 are formed by the EUV lithography process according to the present embodiment, the minimum pitch between the first interconnection lines may be less than 45 nm.

According to an embodiment of the inventive concept, a semiconductor device may include a long channel transistor, in which a supporting pattern is provided. The supporting pattern may prevent channel patterns from being bent. Accordingly, it may be possible to improve uniformity in driving profile between the long channel transistors and to improve electrical characteristics of the long channel transistors.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a first region and a second region;
a first active pattern on the first region, the first active pattern comprising a pair of first source/drain patterns and a first channel pattern therebetween, the first channel pattern comprising a plurality of first semiconductor patterns stacked on the substrate;
a first gate electrode provided on the first channel pattern; and
a supporting pattern being configured to connect the plurality of first semiconductor patterns therebetween, wherein the supporting pattern is separated from each of the pair of first source/drain patterns.

2. The semiconductor device of claim 1,
wherein the supporting pattern comprises the same material as the plurality of first semiconductor patterns.

3. The semiconductor device of claim 1, further comprising:
a second active pattern and a second gate electrode provided on the second region,
wherein the second active pattern comprises a pair of second source/drain patterns and a second channel pattern therebetween,
wherein the second channel pattern comprises a plurality of second semiconductor patterns stacked on the substrate,
wherein the second gate electrode is provided on the second channel pattern, and
wherein a length of the first channel pattern is larger than a length of the second channel pattern.

4. A semiconductor device, comprising:
a substrate including a first region and a second region;
a first active pattern on the first region, the first active pattern comprising a pair of first source/drain patterns and a first channel pattern therebetween, the first channel pattern comprising a plurality of first semiconductor patterns stacked on the substrate;
a second active pattern on the second region, the second active pattern comprising a pair of second source/drain patterns and a second channel pattern therebetween, the second channel pattern comprising a plurality of second semiconductor patterns stacked on the substrate;
supporting patterns configured to connect the plurality of first semiconductor patterns; and
a first gate electrode and a second gate electrode provided on the first and second channel patterns, respectively,
wherein a length of the first channel pattern is larger than a length of the second channel pattern,
wherein the plurality of first semiconductor patterns include a first material and the supporting patterns include the first material.

5. The semiconductor device of claim 4,
wherein the supporting patterns and the plurality of first semiconductor patterns are connected to form a single object.

6. The semiconductor device of claim 4,
wherein the first gate electrode covers the supporting patterns, and
wherein the semiconductor device further comprises a gate insulating layer between the first gate electrode and the supporting patterns.

7. The semiconductor device of claim 4,
wherein the plurality of first semiconductor patterns and the supporting patterns have the same crystal direction.

8. The semiconductor device of claim 4,
wherein the supporting patterns comprise amorphous silicon.

9. A semiconductor device, comprising:
a substrate including a first region and a second region;
a device isolation layer defining a first active region on the first region and a second active region on the second region;
a pair of first source/drain patterns and a pair of second source/drain patterns on the first active region and the second active region, respectively;
a first channel pattern between the pair of first source/drain patterns;
a second channel pattern between the pair of second source/drain patterns, each of the first and second channel patterns comprising first to third semiconductor patterns sequentially stacked on the substrate;
a first gate electrode and a second gate electrode on the first channel pattern and the second channel pattern, respectively;
a first gate insulating layer between the first channel pattern and the first gate electrode;
a second gate insulating layer between the second channel pattern and the second gate electrode;
a pair of gate spacers provided at opposite sides of each of the first and second gate electrodes;
a gate capping pattern on a top surface of each of the first and second gate electrodes;
a pair of first active contacts electrically connected to the pair of first source/drain patterns;
a pair of second active contacts electrically connected to the pair of second source/drain patterns;
first and second gate contacts electrically connected to the first and second gate electrodes;
a first metal layer on the pair of first active contacts, the pair of second active contacts, and the first and second gate contacts, the first metal layer comprising first interconnection lines electrically connected to the pair of first active contacts, the pair of second active contacts, and the first and second gate contacts;
a second metal layer on the first metal layer; and
a first supporting pattern connecting the first to third semiconductor patterns of the first channel pattern and contacting the first to third semiconductor patterns thereof.

10. The semiconductor device of claim 9, further comprising:
a second supporting pattern that connects the first to third semiconductor patterns of the first channel pattern and is in contact with the first to third semiconductor patterns thereof,
wherein the first supporting pattern and the second supporting pattern are spaced apart from each other.

11. The semiconductor device of claim 9,
wherein the first supporting pattern comprises silicon, which has the same crystal direction as the first to third semiconductor patterns of the first channel pattern or has an amorphous structure.

* * * * *